United States Patent
Choi et al.

(10) Patent No.: US 11,462,718 B2
(45) Date of Patent: Oct. 4, 2022

(54) DISPLAY DEVICE

(71) Applicant: Samsung Display Co., LTD., Yongin-si (KR)

(72) Inventors: Chung Sock Choi, Seoul (KR); Sunmi Kang, Cheonan-si (KR); Cheol Jang, Uiwang-si (KR); Sunyoung Jung, Suwon-si (KR); Hyunho Kim, Hwaseong-si (KR); Sanghwan Cho, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 17/065,472

(22) Filed: Oct. 7, 2020

(65) Prior Publication Data

US 2021/0126227 A1    Apr. 29, 2021

(30) Foreign Application Priority Data

Oct. 23, 2019  (KR) .................. 10-2019-0131827
Mar. 20, 2020  (KR) .................. 10-2020-0034290

(51) Int. Cl.
*H01L 27/32*     (2006.01)
*H01L 51/52*     (2006.01)
*G06F 3/044*     (2006.01)

(52) U.S. Cl.
CPC ........ *H01L 51/5268* (2013.01); *G06F 3/0443* (2019.05); *G06F 3/0446* (2019.05);
(Continued)

(58) Field of Classification Search
CPC ......... G06F 2203/04112; G06F 3/0443; G06F 3/0446; G06F 3/0412; G06F 3/0445;
(Continued)

(56) References Cited

U.S. PATENT DOCUMENTS 9,123,909 B2   9/2015  Wang et al.
10,019,121 B2  7/2018  Choi et al.
(Continued)

FOREIGN PATENT DOCUMENTS

JP   2007294336   11/2007
KR   1020160083609  7/2016
(Continued)

OTHER PUBLICATIONS

European Search Report dated Mar. 31, 2021, issued to European Patent No. 20203409.6.

*Primary Examiner* — Xuemei Zheng
(74) *Attorney, Agent, or Firm* — H.C. Park & Associates, PLC

(57) ABSTRACT

A display device includes a display panel including a light-emitting device to emit light; and an input sensor disposed on the display panel. The input sensor includes a first insulating layer disposed on the display panel; a first conductive layer disposed on the first insulating layer; a second insulating layer covering the first conductive layer; and a second conductive layer disposed on the second insulating layer. At least one of the first and second insulating layers includes a plurality of diffraction patterns arranged to diffract at least a portion of the light provided from the display panel.

42 Claims, 43 Drawing Sheets

(52) U.S. Cl.
    CPC ........ *H01L 27/323* (2013.01); *H01L 51/5253* (2013.01); *G06F 2203/04112* (2013.01); *H01L 27/3216* (2013.01); *H01L 27/3244* (2013.01)

(58) Field of Classification Search
    CPC ........ G06F 3/044; G06F 3/041; G06F 3/0416; G06F 2203/04103; H01L 27/3216; H01L 27/323; H01L 27/3244; H01L 51/5253; H01L 51/5268; H01L 51/5275; H01L 51/5262; G02F 1/13338; G02F 1/133504; G02F 1/13439; G02F 1/133512; G02F 1/133562; G02F 2203/22; G02F 2201/305; G09G 3/003; G09G 2300/023; G02B 27/0172; G02B 27/44; G02B 5/02; G02B 5/32; G02B 5/18
    USPC .................................................. 345/170–179
    See application file for complete search history.

(56) References Cited

U.S. PATENT DOCUMENTS

| | | | |
|---|---|---|---|
| 10,281,630 B2 | 5/2019 | Chen et al. | |
| 10,468,626 B2 | 11/2019 | Lee et al. | |
| 10,564,507 B2 | 2/2020 | Kang et al. | |
| 2015/0185903 A1 | 7/2015 | Park | |
| 2017/0179441 A1* | 6/2017 | Lee | H01L 27/3246 |
| 2017/0250376 A1 | 8/2017 | Sasaki | |
| 2017/0261929 A1* | 9/2017 | Mokhnatyuk | H01L 27/14627 |
| 2017/0317145 A1 | 11/2017 | Hong et al. | |
| 2018/0182816 A1 | 6/2018 | Kang et al. | |
| 2018/0314067 A1* | 11/2018 | Cho | H01L 51/0096 |
| 2018/0323242 A1* | 11/2018 | Drzaic | H01L 51/5265 |
| 2018/0329531 A1* | 11/2018 | Zhou | G02B 5/005 |
| 2018/0350883 A1 | 12/2018 | Lee et al. | |
| 2019/0088904 A1* | 3/2019 | Cho | H01L 51/5206 |
| 2019/0094541 A1 | 3/2019 | Choi et al. | |
| 2019/0123112 A1 | 4/2019 | Lee et al. | |
| 2019/0227600 A1* | 7/2019 | Hirakata | G06F 3/041 |
| 2019/0363297 A1* | 11/2019 | Park | G06F 3/0443 |
| 2021/0126227 A1* | 4/2021 | Choi | G06F 3/0443 |

FOREIGN PATENT DOCUMENTS

| | | | |
|---|---|---|---|
| KR | 10-2016-0114780 | 10/2016 | |
| KR | 10-2017-0050139 | 5/2017 | |
| KR | 10-2018-0005327 | 1/2018 | |
| KR | 10-2018-0074944 | 7/2018 | |
| KR | 1020180077752 | 7/2018 | |
| KR | 10-2018-0121750 | 11/2018 | |
| KR | 10-1919554 | 11/2018 | |
| KR | 10-2018-0133024 | 12/2018 | |
| KR | 10-2019-0034380 | 4/2019 | |
| KR | 10-2019-0045964 | 5/2019 | |
| KR | 1020190062678 | 6/2019 | |
| KR | 1020190079784 | 7/2019 | |
| KR | 10-2038693 | 10/2019 | |
| KR | 10-2020-0119455 | 10/2020 | |
| WO | WO-2018059038 A1 * | 4/2018 | ........ G06F 3/0445 |

* cited by examiner

DISPLAY DEVICE

CROSS REFERENCE TO RELATED APPLICATION

This application claims priority from and the benefit of Korean Patent Application No. 10-2019-0131827, filed on Oct. 23, 2019 and Korean Patent Application No. 10-2020-0034290, filed on Mar. 20, 2020, in the Korean Intellectual Property Office, each of which is hereby incorporated by reference for all purposes as if fully set forth herein.

BACKGROUND

Field

Exemplary implementations of the invention relate generally to display devices and, more specifically, to display devices having an improved viewing angle.

Discussion of the Background

Electronic devices, such as smart phones, tablets, laptop computers, and smart television sets, are being developed. The electronic device includes a display device to provide information to a user. As a multimedia technology advances, there is an increasing demand for display devices suitable for the multimedia environment. In order to meet the demand, various kinds of display devices, such as liquid crystal display (LCD) and organic light emitting display (OLED) devices, have been developed.

The organic light emitting diode device includes an organic light emitting diode, which is configured to emit light. However, the light-emitting characteristic of the organic light emitting diode is poor in the lateral direction compared with the front side, which this leads to a reduction in the lateral viewing angle of the organic light emitting display device, compared to the front viewing angle.

The above information disclosed in this Background section is only for understanding of the background of the inventive concepts, and, therefore, it may contain information that does not constitute prior art.

SUMMARY

Applicant discovered that the reduction in the lateral viewing angle of organic light emitting display devices compared to a front viewing angle can be improved by diffracting light in the display panel.

Display devices constructed according to the principles and exemplary implementations of the invention have an improved lateral viewing angle, which may be achieved by providing diffraction patterns in an input sensor of the display devices.

In display devices constructed according to the principles and some exemplary embodiments of the invention, light emitted from an organic light emitting diode may be diffracted by diffraction patterns to improve a color-difference issue that may occur when a viewing angle is increased. Accordingly, the overall viewing angle characteristics of the display device may be improved.

Additional features of the inventive concepts will be set forth in the description which follows, and in part will be apparent from the description, or may be learned by practice of the inventive concepts.

According to one aspect of the invention, a display device includes a display panel including a light-emitting device to emit light; and an input sensor disposed on the display panel, wherein the input sensor includes: a first insulating layer disposed on the display panel; a first conductive layer disposed on the first insulating layer; a second insulating layer covering the first conductive layer; and a second conductive layer disposed on the second insulating layer, wherein at least one of the first and second insulating layers includes a plurality of diffraction patterns arranged to diffract at least a portion of the light provided from the display panel.

The plurality of diffraction patterns may be disposed in the second insulating layer.

The plurality of diffraction patterns may be disposed in the first insulating layer.

The plurality of diffraction patterns may include: a plurality of first diffraction patterns disposed in the first insulating layer; and a plurality of second diffraction patterns disposed in the second insulating layer.

The first insulating layer may have a multi-layered structure including at least two stacked sub-insulating layers.

The plurality of first diffraction patterns may include: a plurality of first sub-diffraction patterns disposed in a first sub-insulating layer of the first insulating layer; and a plurality of second sub-diffraction patterns disposed in a second sub-insulating layer of the first insulating layer and overlapping the plurality of first sub-diffraction patterns, wherein the plurality of second diffraction patterns may be disposed in the second insulating layer overlap the plurality of second sub-diffraction patterns.

The display panel further may include an encapsulation layer covering the light-emitting device, and the first insulating layer is directly disposed on the encapsulation layer.

The encapsulation layer may include: a first encapsulation layer covering a plurality of pixels; a second encapsulation layer disposed on the first encapsulation layer; and a third encapsulation layer disposed on the second encapsulation layer, wherein the first insulating layer may be disposed on the third encapsulation layer.

The first insulating layer may have a multi-layered structure including at least two stacked sub-insulating layers, and the plurality of diffraction patterns may include: a plurality of first diffraction patterns disposed in the at least two sub-insulating layers; and a plurality of second diffraction patterns disposed in the second insulating layer.

The plurality of diffraction patterns may further include a plurality of third diffraction patterns disposed in the third encapsulation layer overlapping the plurality of first diffraction patterns.

The plurality of diffraction patterns may include a plurality of holes penetrating at least one of the first and second insulating layers.

The plurality of holes may have one of generally circular, polygonal, elliptical, and elongated shapes.

The plurality of diffraction patterns may be columnar-shaped structures disposed in at least one of the first and second insulating layers.

The columnar-shaped structures may have one of generally circular, polygonal, elliptical, and elongated shapes.

The input sensor may include an input-sensing unit including a protection layer disposed on the second insulating layer, and each of the first and second insulating layers has a refractive index different from a refractive index of the protection layer.

The display panel may include a plurality of pixels, and each of the plurality of pixels may include: an emission region to emit light, the light-emitting device being disposed in the emission region; and a non-emission region adjacent to the emission region.

The plurality of diffraction patterns may overlap at least the emission region.

The plurality of diffraction patterns may overlap the non-emission region.

The display panel may include a plurality of pixels including a first pixel to emit red light, a second pixel to emit green light, and a third pixel to emit blue light, and the plurality of diffraction patterns overlap at least one of the first to third pixels.

The plurality of diffraction patterns may overlap the first pixel.

The plurality of diffraction patterns may overlap the first and third pixels.

According to another aspect of the invention, a display device includes: a display panel including a plurality of pixels to display an image, each of the plurality of pixels including a light-emitting device to emit light; and an input sensor disposed on the display panel, wherein the input sensor includes: a sensing electrode; and an insulating layer disposed on or below the sensing electrode, the insulating layer including a plurality of diffraction patterns arranged to diffract at least a portion of the light provided from the display panel, the plurality of diffraction patterns overlapping at least one of the plurality of pixels.

The sensing electrode may include a first sensing electrode and a second sensing electrode intersecting each other, and each of the first and second sensing electrodes includes sensing portions and a connecting portion connecting adjacent ones of the sensing portions.

The insulating layer may include: a first insulating layer, on which the connecting portion of the first sensing electrode is disposed; and a second insulating layer, on which the sensing portions of the first sensing electrode, the sensing portions of the second sensing electrode, and the connecting portion of the second sensing electrode are disposed, wherein the second insulating layer may cover the connecting portion of the first sensing electrode, and the connecting portion of the first sensing electrode may be electrically connected to the sensing portions of the first sensing electrode through a contact hole formed in the second insulating layer.

The plurality of diffraction patterns may be disposed in at least one of the first and second insulating layers.

The plurality of diffraction patterns may include a plurality of holes penetrating at least one of the first and second insulating layers.

The display device may further include a protection layer disposed on the second insulating layer to cover the sensing portions of the first sensing electrode, the sensing portions of the second sensing electrode, and the connecting portion of the second sensing electrode.

The insulating layer may further include a third insulating layer disposed between the protection layer and the second insulating layer, and the plurality of diffraction patterns are disposed in the third insulating layer.

The plurality of diffraction patterns may be disposed in the second insulating layer, and the insulating layer may further include a fourth insulating layer disposed below the first insulating layer.

The plurality of diffraction patterns may be disposed in the second insulating layer, and the insulating layer may further include a fifth insulating layer disposed between the first and second insulating layers.

The plurality of diffraction patterns may be disposed on the first insulating layer, and the second insulating layer may include a diffraction open portion overlapping the plurality of diffraction patterns formed on the first insulating layer.

Each of the sensing portions of the first and second sensing electrodes may include a mesh electrode having a mesh shape.

The plurality of diffraction patterns may not be overlapped with the mesh electrode, when viewed in plan.

The plurality of pixels may include a first pixel to emit red light, a second pixel to emit green light, and a third pixel to emit blue light, and the plurality of diffraction patterns overlap at least one of the first to third pixels.

The plurality of diffraction patterns may overlap the first pixel.

The plurality of diffraction patterns may overlap the first and third pixels.

The display panel further may include an encapsulation layer covering the plurality of pixels, and the input sensor includes an input-sensing unit directly disposed on the encapsulation layer.

According to another aspect of the invention, a display device includes: a display panel including a plurality of pixels to display an image, each of the plurality of pixels including a light-emitting device to emit light; and a diffraction pattern layer including a plurality of diffraction patterns arranged on the display panel to diffract at least a portion of the light provided from the display panel, wherein the plurality of diffraction patterns overlap at least one of the plurality of pixels.

The plurality of pixels may include a first pixel to emit red light, a second pixel to emit green light, and a third pixel to emit blue light, and the plurality of diffraction patterns overlap at least one of the first to third pixels.

The plurality of diffraction patterns may overlap the first pixel.

The plurality of diffraction patterns may overlap the first and third pixels.

The display device may further include an input sensor disposed on the display panel, wherein the diffraction pattern layer may be disposed between the display panel and the input sensor or is disposed on the input sensor.

The display panel may further include an encapsulation layer covering the plurality of pixels, and the input sensor is directly disposed on the encapsulation layer.

The input sensor may include an input-sensing unit including: a first insulating layer directly disposed on the encapsulation layer; a first conductive layer disposed on the first insulating layer; a second insulating layer covering the first conductive layer; a second conductive layer disposed on the second insulating layer; and a protection layer covering the second conductive layer and the second insulating layer.

The diffraction pattern layer may be disposed on the protection layer.

The diffraction pattern layer may be disposed between the encapsulation layer and the first insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
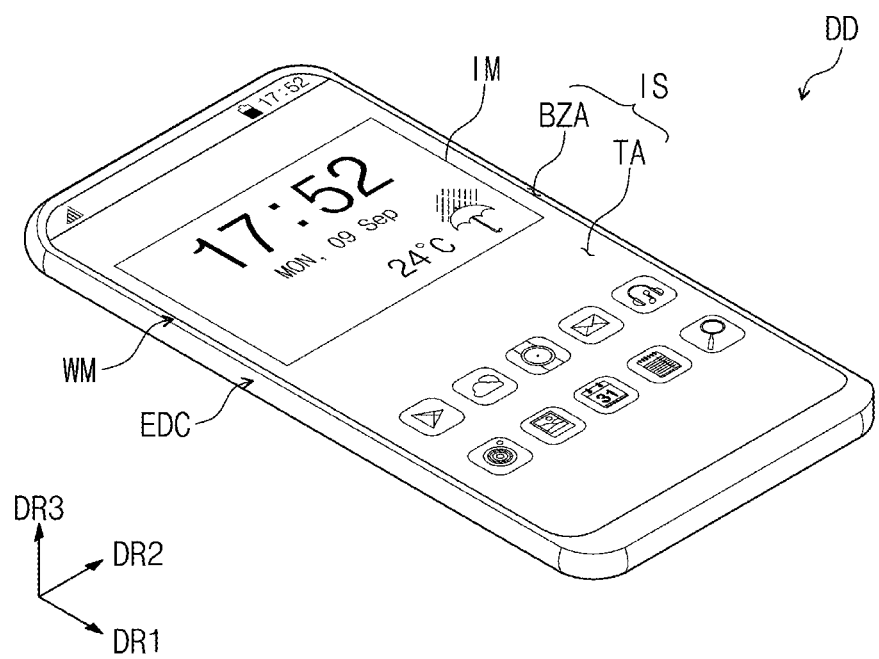
FIG. 1A is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
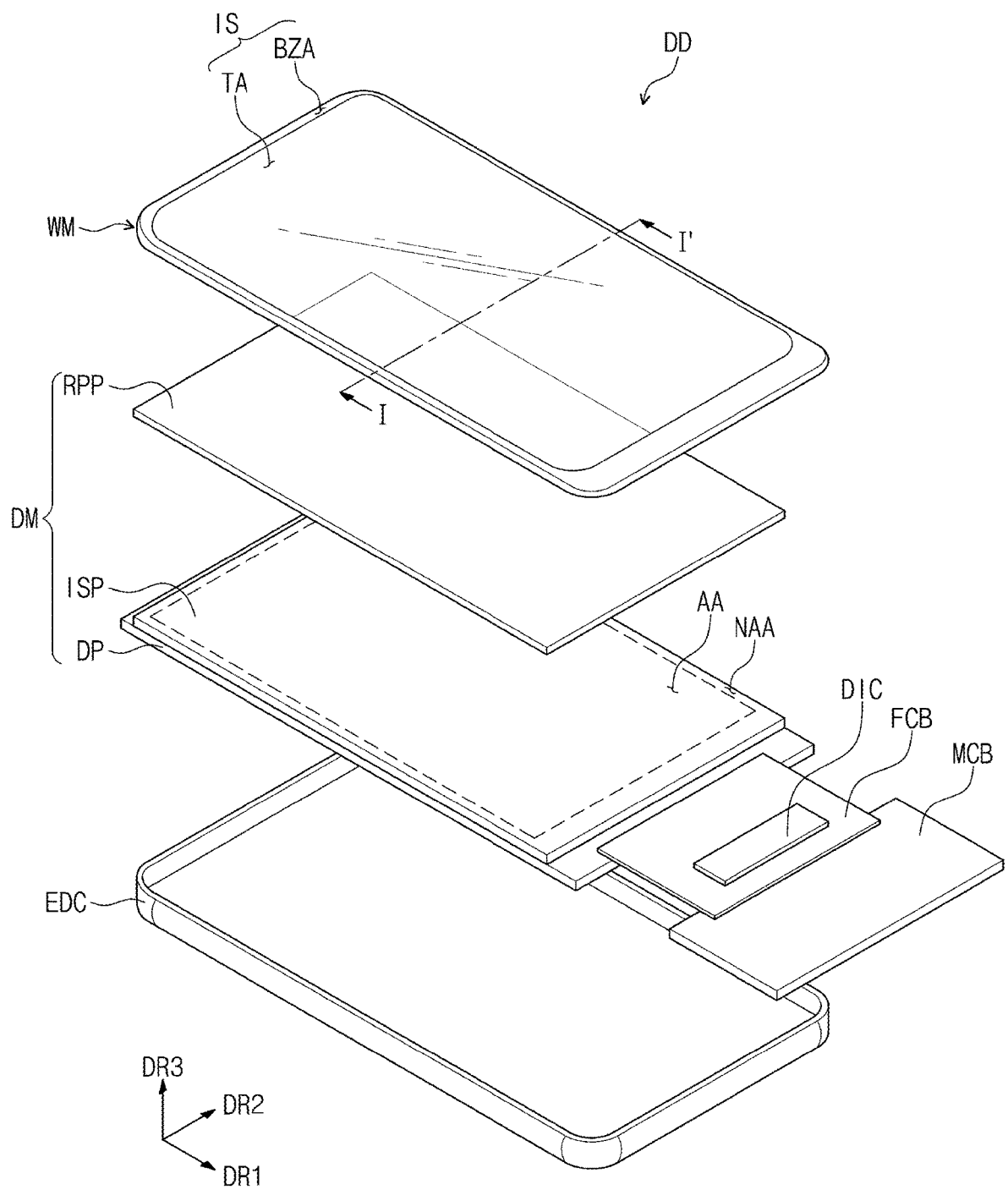
FIG. 1B is an exploded perspective view of the display device of FIG. 1A.
Figure 1C:
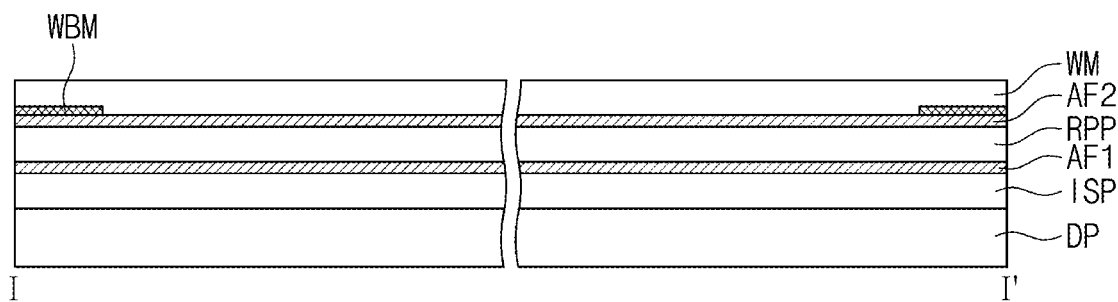
FIG. 1C is a sectional view taken along a line of FIG. 1B.

FIG. 1A is a perspective view of an exemplary embodiment of a display device constructed according to the principles of the invention, FIG. 1B is an exploded perspective view of the display device of FIG. 1A, and FIG. 1C is a sectional view taken along a line of FIG. 1B.

Referring to FIGS. 1A to 1C, a display device DD may be an electronic device, which is selectively activated by an electrical signal applied thereto. The display device DD may be implemented in various forms. For example, the display device DD may be used for various electronic devices, such as smart watches, tablets, laptop computers, computers, and smart television sets.

The display device DD may include a display surface IS, which is parallel to each of a first direction DR1 and a second direction DR2 and is used to display an image IM in a third direction DR3. The display surface IS, on which the image IM is displayed, may correspond to a front surface of the display device DD. The image IM may be a video image or a still image.

In the illustrated exemplary embodiment, a front or top surface and a rear or bottom surface of each element or member may be defined, based on a display direction (e.g., the third direction DR3) of the image IM. The front surface and the rear surface may be opposite to each other in the third direction DR3, and a direction normal to each of the front and rear surfaces may be parallel to the third direction DR3.

The distance between the front and rear surfaces of the display device DD in the third direction DR3 may correspond to the thickness of the display device DD in the third direction DR3. Directions indicated by the first to third directions DR1, DR2, and DR3 may be relative concept, and in exemplary embodiments, they may be changed to indicate other directions.

The display device DD may sense an external input provided from the outside. The external input may include various types of input signals, which are provided from the outside of the display device DD.

For example, the external input may be a touching-type input by a user's body or hand and a non-touching-type input, such as a reduction in distance to the display device DD or a hovering event near the display device DD. In addition, the external input may be provided in various forms, such as force, pressure, temperature, and light.

The front surface of the display device DD may include a transmission region TA and a bezel region BZA. The transmission region TA may be a region, on which the image IM is displayed. The image IM displayed on the transmission region TA may be provided to a user. In the illustrated exemplary embodiment, the transmission region TA has a generally rectangular shape with rounded corners. However, exemplary embodiments are not limited thereto, and for example, the transmission region TA may have various shapes.

The bezel region BZA may be adjacent to the transmission region TA. The bezel region BZA may have a predetermined color. The bezel region BZA may enclose the transmission region TA. Thus, the shape of the transmission region TA may be substantially defined by the bezel region BZA. However, exemplary embodiments are not limited thereto. For example, the bezel region BZA may be disposed near only one of side regions of the transmission region TA or may be omitted. Furthermore, the display device DD may be implemented in various forms, and exemplary embodiments are not limited to a specific example of the display device DD.

As shown in FIGS. 1B and 1C, the display device DD may include a window WM, an external case EDC, and a display module DM. The display module DM may include a display panel DP, an input sensor in the form of an input-sensing unit ISP, and an anti-reflector in the form of an anti-reflection unit RPP.

The window WM may be formed of a transparent material, allowing an image light to be emitted to the outside. For example, the window WM may be formed of or include glass, sapphire, plastic, and the like. The window WM may have a single-layered structure, as shown in FIG. 1A, but exemplary embodiments are not limited thereto; for example, the window WM may include a plurality of layers. For example, the bezel region BZA of the display device DD may substantially be a region of the window WM, on which a material of a specific color is printed. In an exemplary embodiment, the window WM may include a light-blocking pattern WBM, which is used to define the bezel region BZA. The light-blocking pattern WBM may be a colored organic layer, which is formed by, for example, a coating method.

According to an exemplary embodiment, the display panel DP may be a light-emitting type display panel, but exemplary embodiments are not limited to a specific type of the display panel DP. For example, the display panel DP may be an organic light emitting display panel, a quantum dot light-emitting display panel, or other known type of display panel. An emission layer of the organic light emitting display panel may be formed of or include an organic luminescent material. An emission layer of the quantum dot light emitting display panel may include a quantum dot, a quantum rod, or the like. For the descriptive convenience, the description that follows will refer to an example in which the display panel DP is the organic light emitting display panel.

The input-sensing unit ISP may be directly disposed on the display panel DP. In an exemplary embodiment, the input-sensing unit ISP may be formed on the display panel DP in a successive manner. For example, the input-sensing unit ISP may be formed directly on the display panel DP, and in this case, any adhesive film may not be disposed between the input-sensing unit ISP and the display panel DP.

The display panel DP may generate an image to be displayed to the outside, and the input-sensing unit ISP may obtain information of coordinates of an external input (e.g., a touch event).

The anti-reflection unit RPP may reduce reflectance of an external light that is incident from an outer space to the window WM. In an exemplary embodiment, the anti-reflection unit RPP may include a phase retarder and a polarizer. The phase retarder may be of a film type or a liquid crystal coating type and may include a λ/2 and/or λ/4 phase retarder. The polarizer may also be of a film type or a liquid crystal coating type. The polarizer of the film type may include an elongated synthetic resin film, whereas the polarizer of the liquid crystal coating type may include liquid crystals arranged in a specific orientation. The phase retarder and the polarizer may be realized using a single polarizer film. The anti-reflection unit RPP may further include a protection film, which is disposed on or below the polarizer film.

Referring to FIG. 1C, the anti-reflection unit RPP may be disposed on the input-sensing unit ISP. In other words, the anti-reflection unit RPP may be disposed between the input-sensing unit ISP and the window WM. The input-sensing unit ISP, the anti-reflection unit RPP, and the window WM may be connected to each other by adhesive films. For example, a first adhesive film AF1 may be disposed between the input-sensing unit ISP and the anti-reflection unit RPP, and a second adhesive film AF2 may be disposed between the anti-reflection unit RPP and the window WM. Accordingly, the anti-reflection unit RPP may be connected to the input-sensing unit ISP by the first adhesive film AF1, and the window WM may be connected to the anti-reflection unit RPP by the second adhesive film AF2. In an exemplary embodiment, each of the first and second adhesive films AF1 and AF2 may include an optically clear adhesive (OCA) film. However, exemplary embodiments are not limited to the above material of the first and second adhesive films AF1 and AF2, and a typical adhesive material or a typical gluing agent may be used for the first and second adhesive films AF1 and AF2. For example, the first and second adhesive films AF1 and AF2 may include an optically clear resin (OCR) film or a pressure sensitive adhesive (PSA) film.

Referring to FIG. 1B, the display module DM may display an image in response to electrical signals applied thereto and may receive and output information in an external input. An active region AA and a peripheral region NAA may be defined in the display module DM. The active region AA may be defined as a region, which is used to emit light to generate the image provided from the display module DM.

The peripheral region NAA may be disposed adjacent to the active region AA. For example, the peripheral region NAA may enclose the active region AA. However, exemplary embodiments are not limited thereto, and the shape of the peripheral region NAA may be variously changed. In an exemplary embodiment, the active region AA of the display module DM may correspond to at least a portion of the transmission region TA.

The display module DM may further include a main circuit board MCB, a flexible circuit film FCB, and a driving chip DIC.

The main circuit board MCB may be coupled to the flexible circuit film FCB and may be electrically connected to the display panel DP. The main circuit board MCB may include a plurality of driving elements. The driving elements may include a circuit portion, which is used to drive the display panel DP.

The flexible circuit film FCB may be coupled to the display panel DP to electrically connect the display panel DP to the main circuit board MCB. The driving chip DIC may be mounted on the flexible circuit film FCB.

The driving chip DIC may include driving elements (e.g., a data driving circuit), which are used to drive pixels of the display panel DP. Although the display device DD is illustrated to have one flexible circuit film FCB, exemplary embodiments are not limited thereto. For example, a plurality of flexible films may be coupled to the display panel DP.

Furthermore, FIG. 1B illustrates an example, in which the driving chip DIC is mounted on the flexible circuit film FCB, but exemplary embodiments are not limited thereto. For example, the driving chip DIC may be mounted directly on the display panel DP. In this case, a portion of the display panel DP mounted with the driving chip DIC may be bent to face a rear surface of the display module DM.

The input-sensing unit ISP may be electrically connected to the main circuit board MCB via the flexible circuit film FCB. However, exemplary embodiments are not limited thereto. For example, the display module DM may further include an additional flexible circuit board, which is used to electrically connect the input-sensing unit ISP to the main circuit board MCB.

The display module DM may be contained in the external case EDC. The external case EDC may be combined with the window WM to define an outer appearance of the display device DD. The external case EDC may absorb impact exerted from the outside and may prevent a contaminant or moisture from entering the display module DM, and thus, internal elements contained in the external case EDC may be protected from the contaminant or the moisture. In an exemplary embodiment, the external case EDC may include a plurality of container members coupled to each other.

In an exemplary embodiment, the display device DD may further include an electronic module, which includes various functional modules configured to operate the display module DM, a power supply module, which supplies an electric power for various operations of the display device DD, a bracket, which is connected to the display module DM and/or the external case EDC to divide an internal space of the display device DD, and the like.

Figure 2:
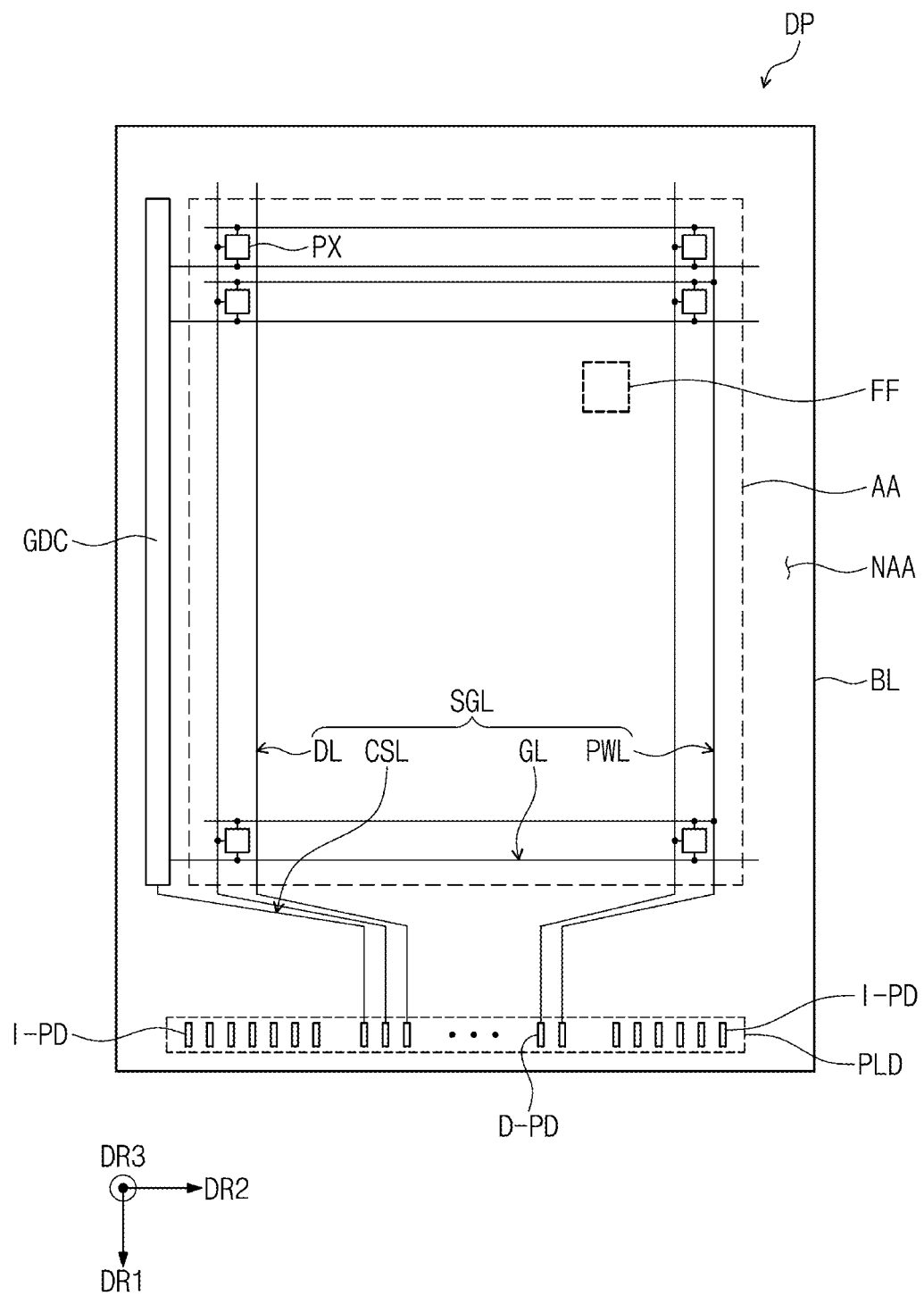
FIG. 2 is a plan view of a display panel of the display device of FIG. 1B.
Figure 3:
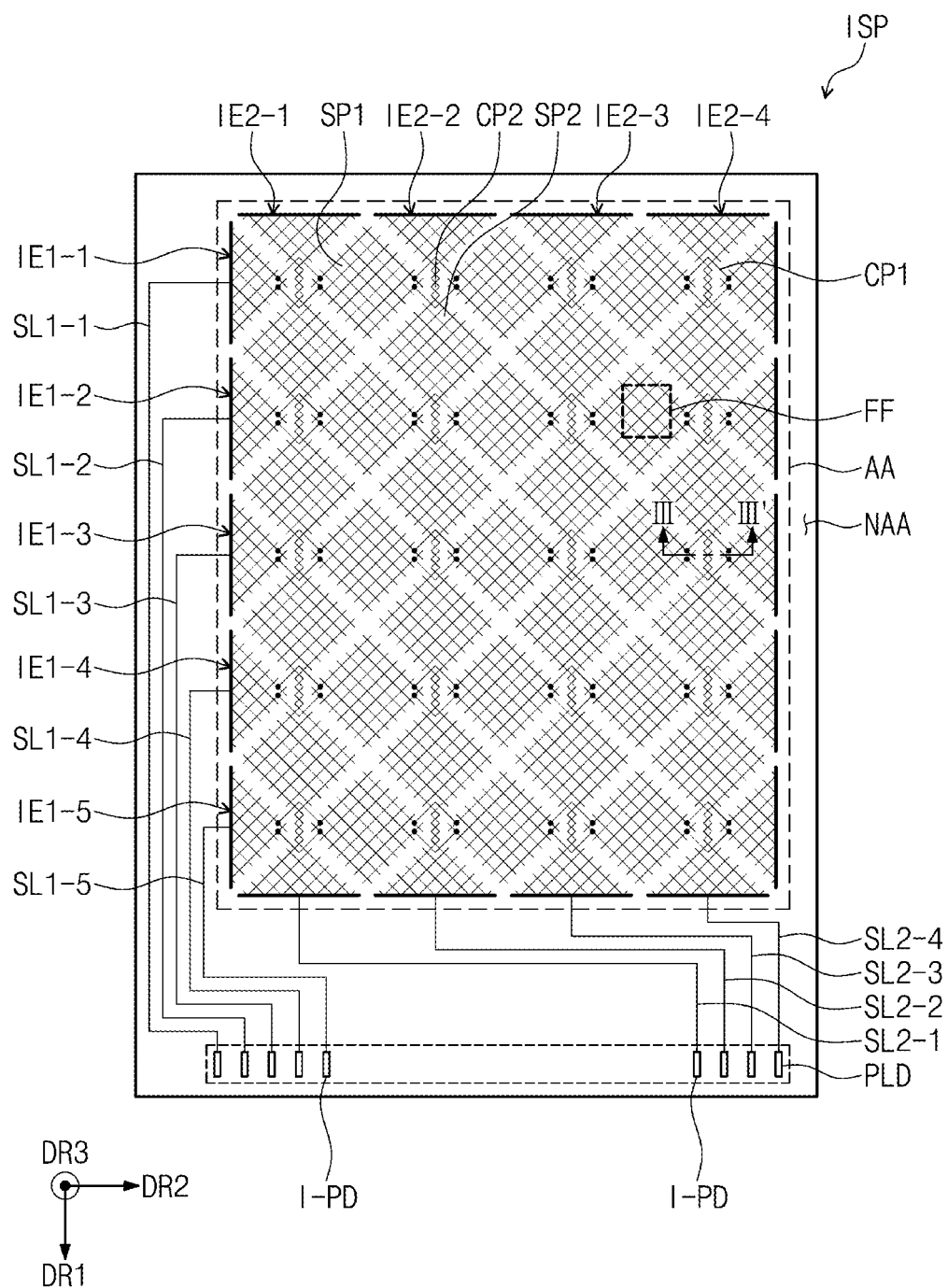
FIG. 3 is a plan view of an exemplary embodiment of an input-sensing unit of the display device of FIG. 1B.

FIG. 2 is a plan view of a display panel of the display device of FIG. 1B, and FIG. 3 is a plan view of an exemplary embodiment of an input-sensing unit of the display device of FIG. 1B.

Referring to FIGS. 2 and 3, the display panel DP may include a driving circuit GDC, a plurality of signal lines SGL, and a plurality of pixels PX. The display panel DP may further include a pad portion PLD disposed in the peripheral region NAA. The pad portion PLD may include pixel pads D-PD connected to a corresponding one of the signal lines SGL.

The pixels PX may be disposed in the active region AA. Each of the pixels PX may include an organic light emitting diode OLED (e.g., see FIG. 5A) and a pixel driving circuit connected to the organic light emitting diode OLED. The driving circuit GDC, the signal lines SGL, the pad portion PLD, and the pixel driving circuit may be included in a display circuit layer DP-CL shown in FIG. 5A.

The driving circuit GDC may include a gate driving circuit. The gate driving circuit may generate a plurality of gate signals and may sequentially output the gate signals to a plurality of gate lines GL, which will be described below. The gate driving circuit may further output another control signal to the pixel driving circuit.

The signal lines SGL may include gate lines GL, data lines DL, a power line PWL, and a control signal line CSL. One of the gate lines GL may be connected to corresponding ones of the pixels PX, and one of the data lines DL may be connected to corresponding ones of the pixels PX. The power line PWL may be connected to the pixels PX. The control signal line CSL may provide control signals to the gate driving circuit. The signal lines SGL may be overlapped with the active region AA and the peripheral region NAA.

The pad portion PLD may be a portion, to which the flexible circuit film FCB (e.g., see FIG. 1B) is connected, and may include the pixel pads D-PD, which are used to connect the flexible circuit film FCB to the display panel DP, and input pads I-PD, which are used to connect the flexible circuit film FCB to the input-sensing unit ISP. The pixel pads D-PD and the input pads I-PD may be provided by exposing some of interconnection lines, which are disposed in the display circuit layer DP-CL, from an insulating layer in the display circuit layer DP-CL shown in FIG. 5A.

The pixel pads D-PD may be connected to corresponding ones of the pixels PX through the signal lines SGL. In addition, the driving circuit GDC may be connected to one of the pixel pads D-PD.

Referring to FIG. 3, the input-sensing unit ISP may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. In an exemplary embodiment, the input-sensing unit ISP may include third signal lines connected to the second sensing electrodes IE2-1 to IE2-4. In this case, the second signal lines SL2-1 to SL2-4 may be connected to ends of the second sensing electrodes IE2-1 to IE2-4, and the third signal lines may be connected to opposite ends of the second sensing electrodes IE2-1 to IE2-4.

The first sensing electrodes IE1-1 to IE1-5 may intersect the second sensing electrodes IE2-1 to IE2-4. The first sensing electrodes IE1-1 to IE1-5 may be arranged in the first direction DR1 and may extend in the second direction DR2.

Each of the first sensing electrodes IE1-1 to IE1-5 may include first sensing portions SP1 and first connecting portions CP1, which are disposed in the active region AA. Each of the second sensing electrodes IE2-1 to IE2-4 may include second sensing portions SP2 and second connecting portions CP2, which are disposed in the active region AA. Two of the first sensing portions SP1, which are located at opposite ends of the first sensing electrode, may have a small area or size (e.g., half area), compared with a central one of the first sensing portions SP1. Two of the second sensing portions SP2, which are located at opposite ends of the second sensing electrode, may have a small area or size (e.g., half area), compared with a central one of the second sensing portions SP2.

FIG. 3 illustrates the first sensing electrodes IE1-1 to IE1-5 and the second sensing electrodes IE2-1 to IE2-4, but exemplary embodiments are not limited to the details of the first sensing electrodes IE1-1 to IE1-5 and the second sensing electrodes IE2-1 to IE2-4. For example, in an exemplary embodiment, the first sensing electrodes IE1-1 to IE1-5 and the second sensing electrodes IE2-1 to IE2-4 may have a shape (e.g., a bar shape), in which the sensing portion is not differentiated from the connecting portion. The first sensing portions SP1 and the second sensing portions SP2 are illustrated to have a diamond-like shape, but exemplary embodiments are not limited thereto. For example, each of the first and second sensing portions SP1 and SP2 may be provided to have one of other generally polygonal or other shapes.

In each of the first sensing electrodes IE1-1 to IE1-5, the first sensing portions SP1 may be arranged in the second direction DR2, and in each of the second sensing electrodes IE2-1 to IE2-4, the second sensing portions SP2 may be arranged in the first direction DR1. Each of the first connecting portions CP1 may connect adjacent ones of the first sensing portions SP1, and each of the second connecting portions CP2 may connect adjacent ones of the second sensing portions SP2.

The first sensing electrodes IE1-1 to IE1-5 and the second sensing electrodes IE2-1 to IE2-4 may have a mesh shape. In this case, it may be possible to reduce the parasitic capacitance between the sensing electrodes and the electrodes of the display panel DP (e.g., see FIG. 2). Furthermore, as will be described below, the first sensing electrodes IE1-1 to IE1-5 and the second sensing electrodes IE2-1 to IE2-4 may not be overlapped with emission regions PXA-R, PXA-G, and PXA-B (e.g., see FIG. 4A), and in this case, it may be possible to prevent the first sensing electrodes IE1-1 to IE1-5 and the second sensing electrodes IE2-1 to IE2-4 from being recognized or observed by a user.

The first sensing electrodes IE1-1 to IE1-5 and the second sensing electrodes IE2-1 to IE2-4 may be formed in a mesh shape of or include silver, aluminum, copper, chromium, nickel, titanium, and the like, which can be formed by a low temperature process, but exemplary embodiments are not limited thereto. It may be possible to prevent the organic light emitting diodes OLED (e.g., see FIG. 5A) from being damaged, even when the input-sensing unit ISP is formed through a successive process.

The first signal lines SL1-1 to SL1-5 may be connected to one-side ends of the first sensing electrodes IE1-1 to IE1-5, respectively. In an exemplary embodiment, the input-sensing unit ISP may further include signal lines, which are connected to opposite ends of the first sensing electrodes IE1-1 to IE1-5.

The first signal lines SL1-1 to SL1-5 and the second signal lines SL2-1 to SL2-4 may be disposed in the peripheral region NAA. The input-sensing unit ISP may include the input pads I-PD, which are extended from ends of the first signal lines SL1-1 to SL1-5 and the second signal lines SL2-1 to SL2-4 and are disposed in the peripheral region NAA.

Figure 4A:
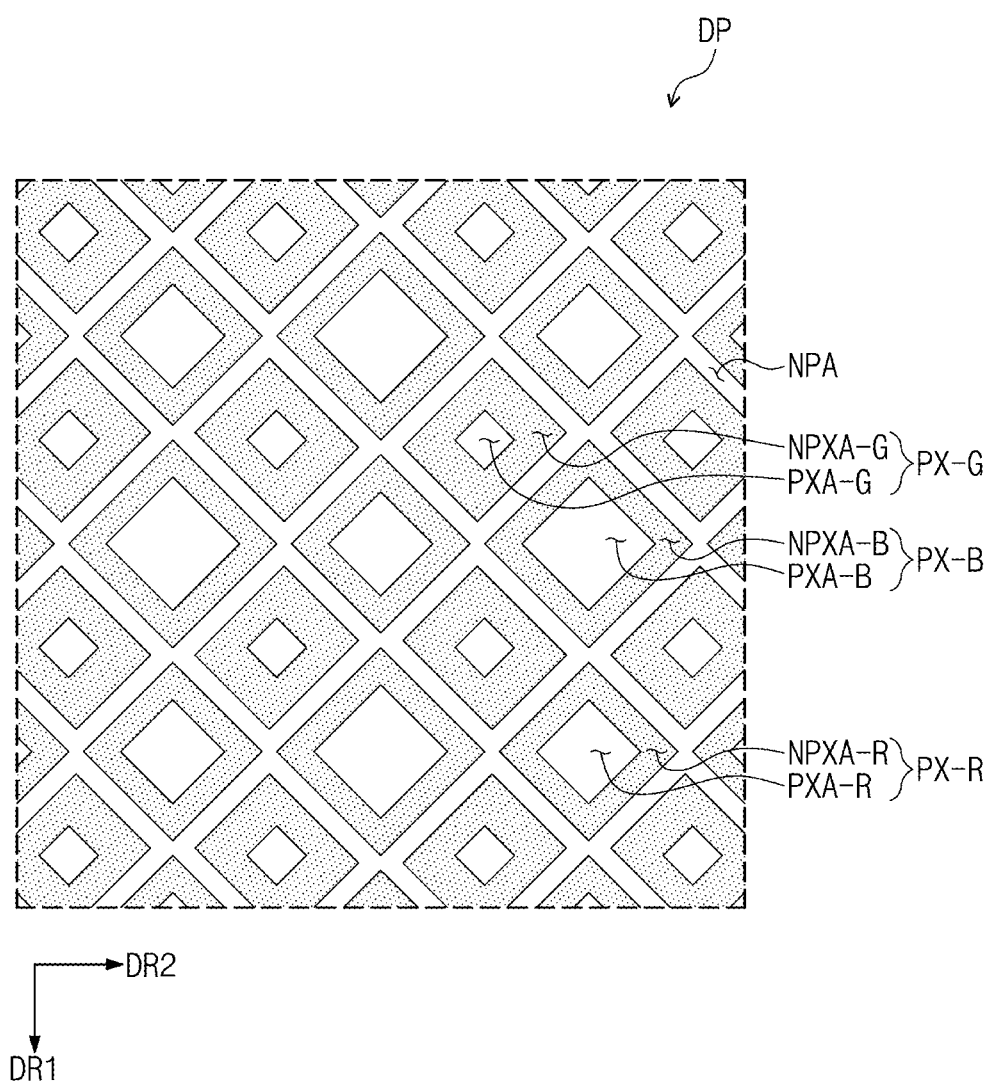
FIG. 4A is an enlarged plan view of region 'FF' of FIG. 3.
Figure 4B:
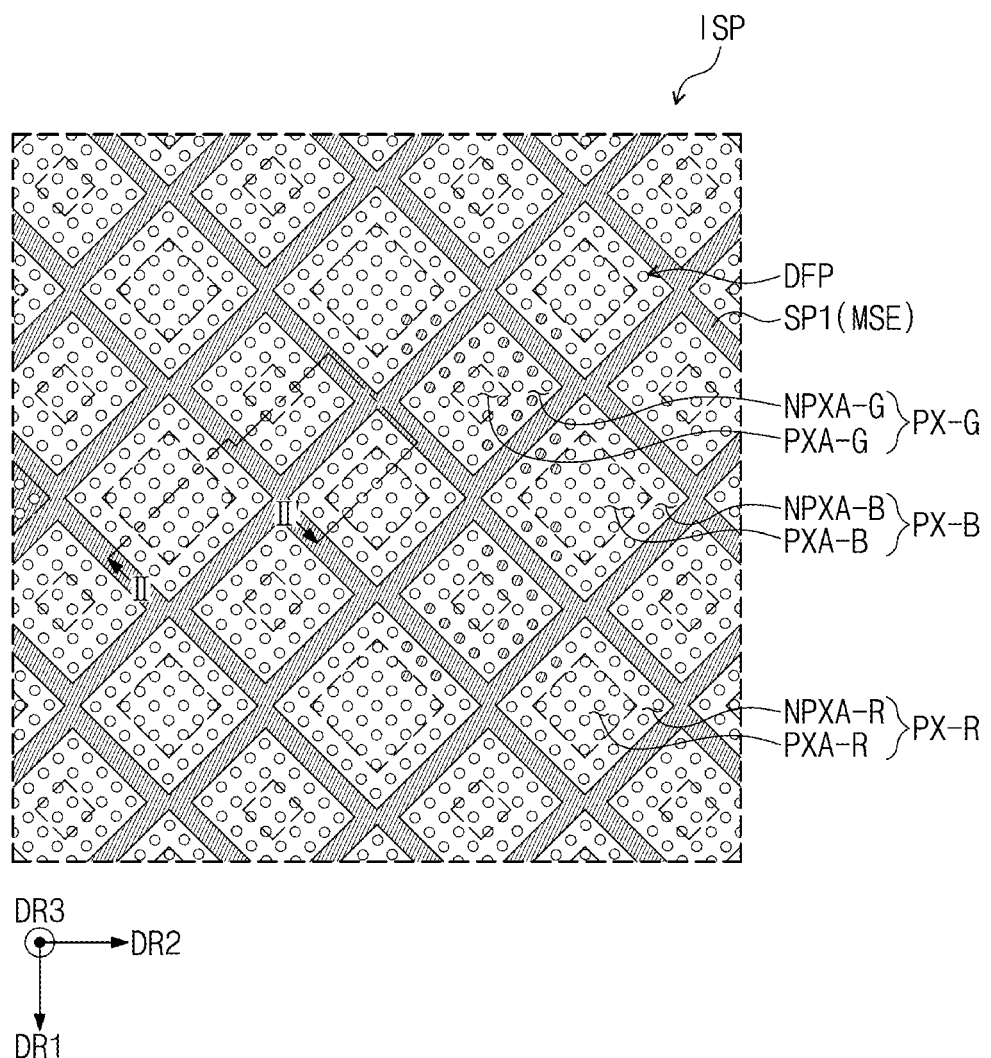
FIG. 4B is an enlarged plan view of the region 'FF' of FIG. 3.

FIG. 4A is an enlarged plan view of region 'FF' of FIG. 3, and FIG. 4B is an enlarged plan view of the region 'FF' of FIG. 3.

Referring to FIG. 4A, the display panel DP may include a plurality of pixels. In an exemplary embodiment, the plurality of pixels may include a plurality of first pixels PX-R, a plurality of second pixels PX-G, and a plurality of third pixels PX-B, which have different sizes. In other words, the second pixels PX-G may have a smaller size than the first and third pixels PX-R and PX-B, and the first pixels PX-R may have a smaller size than the third pixels PX-B. In an exemplary embodiment, the first pixels PX-R may be pixels emit red light, the second pixels PX-G may be pixels emit green light, and the third pixels PX-B may be pixels emit blue light.

The first pixels PX-R may be arranged in the first and second directions DR1 and DR2. The first and third pixels PX-R and PX-B may be alternately repeated and may be arranged in the first and second directions DR1 and DR2. A non-pixel region NPA may be provided between the first to third pixels PX-R, PX-G, and PX-B.

FIG. 4A illustrates an example of the arrangement of the first to third pixels PX-R, PX-G, and PX-B, but exemplary embodiments are not limited thereto. For example, in an exemplary embodiment, the first pixel PX-R, the second pixel PX-G, and the third pixel PX-B may be alternately arranged in the second direction DR2. In addition, each of the first to third pixels PX-R, PX-G, and PX-B is illustrated to have a generally rectangular shape, but exemplary embodiments are not limited thereto. For example, each of the first to third pixels PX-R, PX-G, and PX-B may be provided to have various shapes (e.g., polygonal, circular, and elliptical shapes). In an exemplary embodiment, the first to third pixels PX-R, PX-G, and PX-B may have different shapes. For example, the second pixel PX-G may have a generally hexagonal or octagonal shape, and the first and third pixels PX-R and PX-B may have a generally rectangular or square shape.

In FIG. 4A, the second pixels PX-G are illustrated to have a smaller size than the first pixels PX-R and the third pixels PX-B, but exemplary embodiments are not limited thereto. For example, in an exemplary embodiment, the first to third pixels PX-R, PX-G, and PX-B may have the same size.

Each of the first pixels PX-R may include a first emission region PXA-R, through which light is emitted, and a first non-emission region NPXA-R, which is formed around or near the first emission region PXA-R. Each of the second pixel PX-G may include a second emission region PXA-G, through which light is emitted, and a second non-emission region NPXA-G, which is formed around or near the second emission region PXA-G. Each of the third pixel PX-B may include a third emission region PXA-B, through which light is emitted, and a third non-emission region NPXA-B, which is formed around or near the third emission region PXA-B. The first to third non-emission regions NPXA-R, NPXA-G, and NPXA-B may be defined as regions through which light is not emitted.

Referring to FIGS. 4A and 4B, the first sensing portions SP1 of the input-sensing unit ISP may have a mesh shape. Each of the first sensing portions SP1 may include a mesh electrode MSE, which is patterned to have a mesh shape. The first sensing portions SP1 may be disposed to correspond to the non-pixel region NPA, and in this case, it may be possible to increase opening ratios of the first to third pixels PX-R, PX-G, and PX-B and to reduce parasitic capacitance. The mesh electrode MSE may be partially overlapped with the first to third non-emission regions NPXA-R, NPXA-G, and NPXA-B.

The input-sensing unit ISP may include one or more diffraction patterns. As used herein, "diffraction pattern" means a diffraction element, which may be any type of discontinuity, such as a hole, projection, reduced thickness portion, or other structure that is capable of diffracting light, and is arranged in a regular repeating sequence or an irregular random sequence in a layer or member. For example, the diffraction patterns DFP may be arranged to be regularly spaced apart from each other with a substantially constant pitch and are used to diffract at least a portion of the light passing through the input-sensing unit ISP. A plurality of the diffraction patterns DFP may be overlapped with each of the emission regions PXA-R, PXA-G, and PXA-B of the pixels PX-R, PX-G, and PX-B. In an exemplary embodiment, a plurality of the diffraction patterns DFP may be overlapped with each of the emission and non-emission regions PXA-R, PXA-G, PXA-B, NPXA-R, NPXA-G, and NPXA-B of the pixels PX-R, PX-G, and PX-B.

The diffraction patterns DFP may not be overlapped with the non-pixel region NPA. In other words, the diffraction patterns DFP may be provided in such a way that they are not overlapped with the mesh electrode MSE.

In an exemplary embodiment, each of the diffraction patterns DFP may have a generally circular shape, when viewed in plan. However, exemplary embodiments are not limited to the shape of the diffraction patterns DFP. For example, the diffraction patterns DFP may be provided to have various shapes (e.g., generally polygonal, elliptical, and elongated shapes).

Figure 5A:
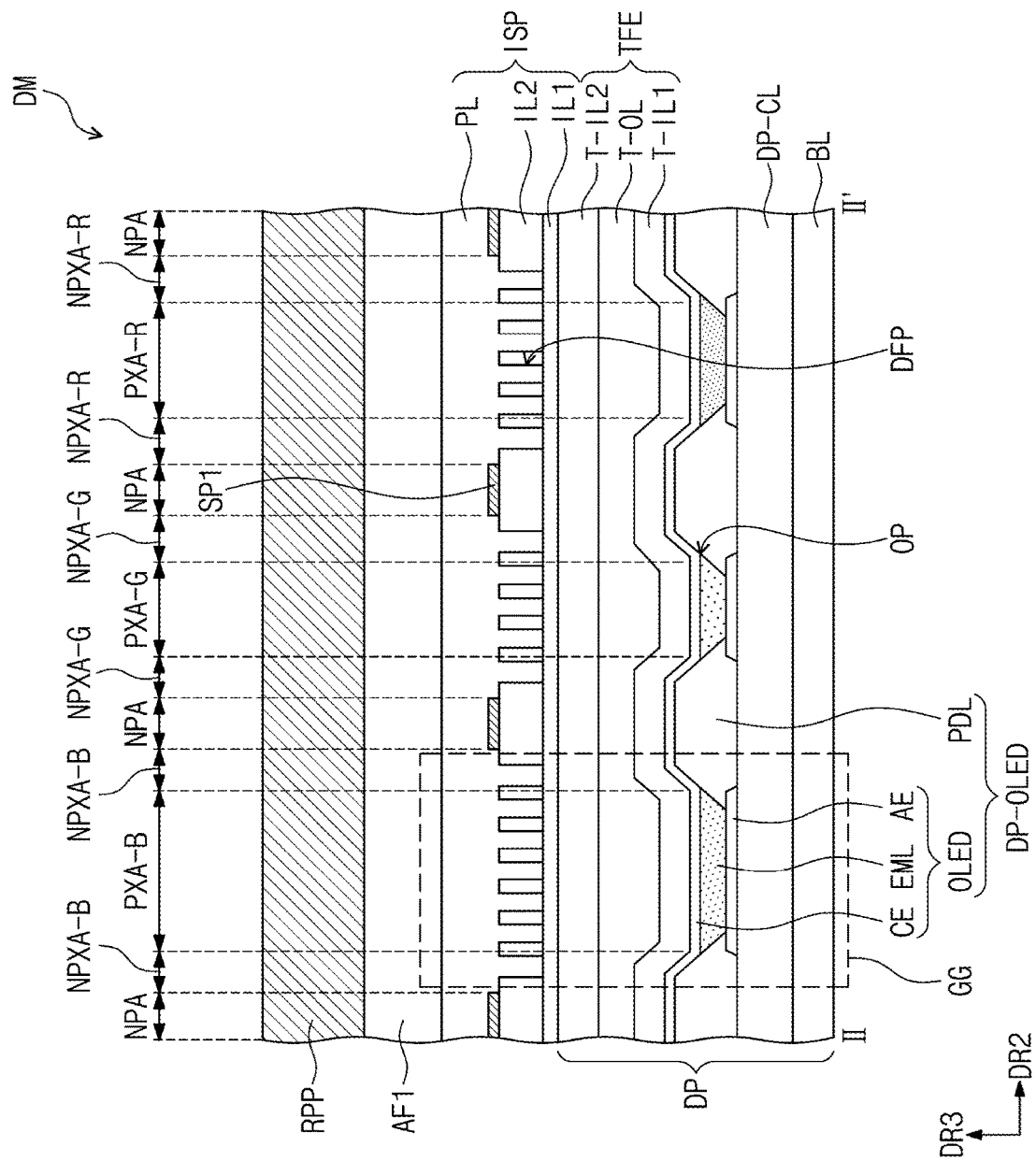
FIG. 5A is a sectional view taken along a line II-If of FIG. 4B illustrating an exemplary embodiment of the display module of FIG. 1B.
Figure 5B:
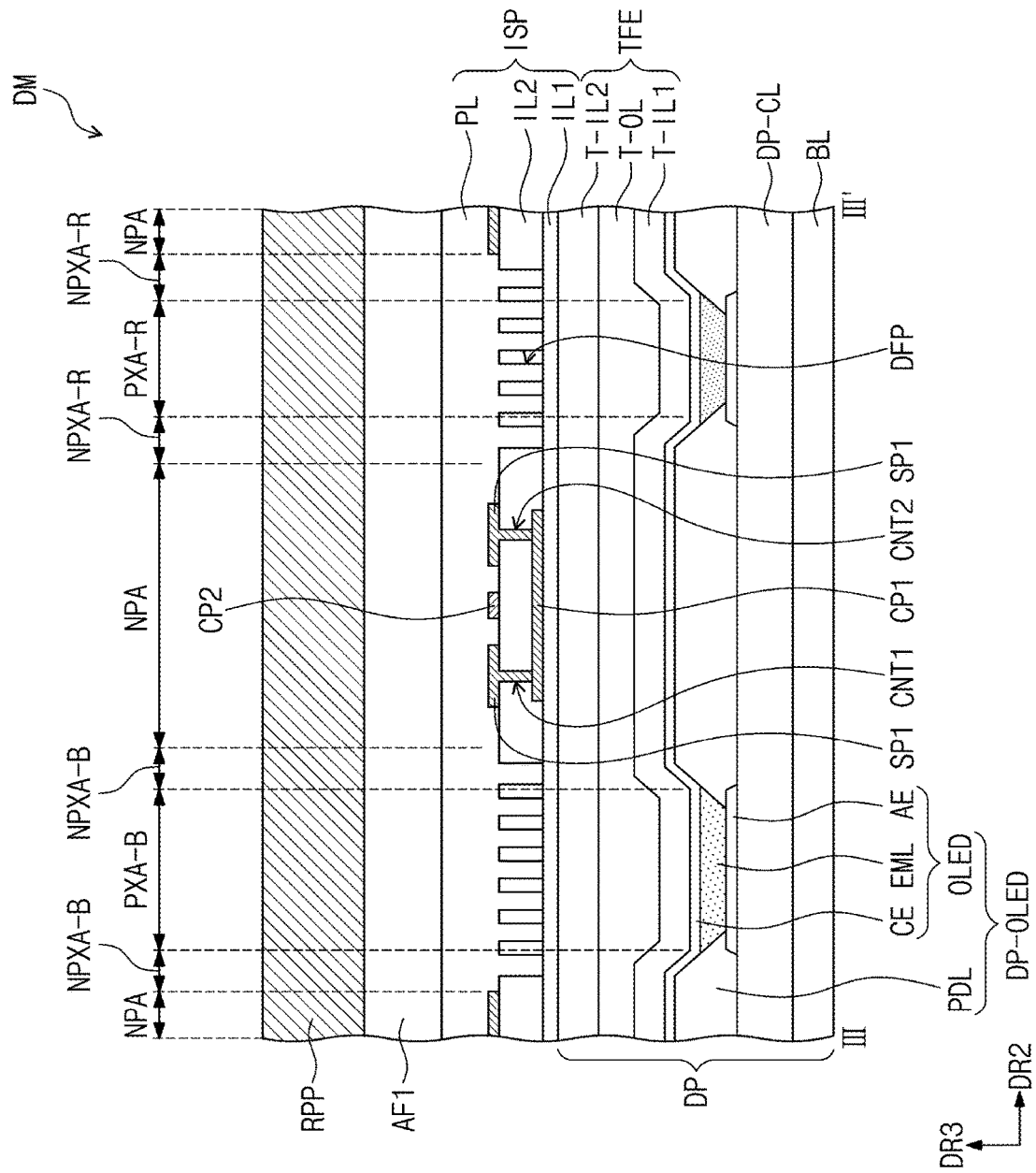
FIG. 5B is a sectional view taken along a line of FIG. 3 illustrating the input-sensing unit of FIG. 3.
Figure 6A:
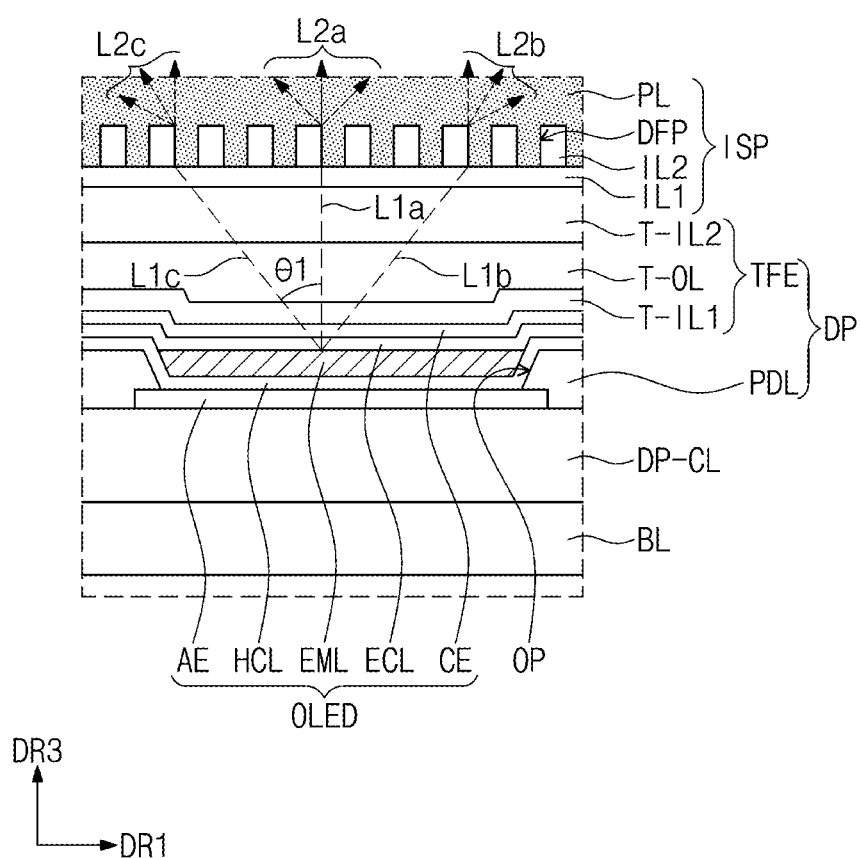
FIG. 6A is an enlarged sectional view illustrating a portion 'GG' of FIG. 5A.
Figure 6B:
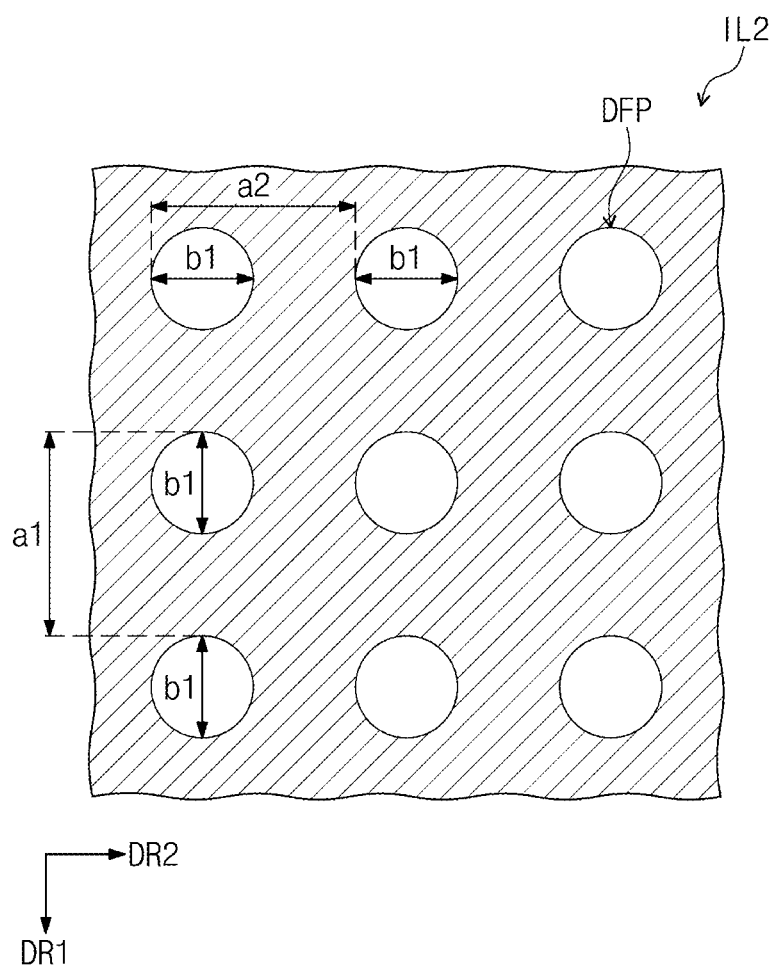
FIG. 6B is a plan view of an exemplary embodiment of a second insulating layer of FIG. 5A.

FIG. 5A is a sectional view taken along a line II-If of FIG. 4B illustrating an exemplary embodiment of the display module of FIG. 1B, and FIG. 5B is a sectional view taken along a line of FIG. 3 illustrating the input-sensing unit of FIG. 3. FIG. 6A is an enlarged sectional view illustrating a portion 'GG' of FIG. 5A, and FIG. 6B is a plan view of an exemplary embodiment of a second insulating layer of FIG. 5A.

Referring to FIG. 5A, the display panel DP of the display module DM may include a base layer BL and a display circuit layer DP-CL disposed on the base layer BL, a display element layer DP-OLED disposed on the display circuit layer DP-CL, and an encapsulation layer TFE disposed on the display element layer DP-OLED. For example, the display panel DP may further include functional layers, such as an anti-reflection layer and a refractive index control layer.

The base layer BL may include a synthetic resin film. The synthetic resin layer may be formed on a working substrate, which is used to fabricate the display panel DP. Thereafter, a conductive layer, an insulating layer, and the like may be formed on the synthetic resin layer. When the working substrate is removed, the synthetic resin layer may be used as the base layer BL. The synthetic resin layer may be a polyimide-based resin layer, but exemplary embodiments are not limited to a specific material. In addition, the base layer BL may include a glass substrate, a metal substrate, or an organic/inorganic composite substrate.

The display circuit layer DP-CL may include at least one insulating layer and a circuit element. Hereinafter, the insulating layer in the display circuit layer DP-CL will be referred to as an intermediate insulating layer. The intermediate insulating layer may include at least one inorganic intermediate layer and at least one organic intermediate layer. The circuit element may include signal lines, a pixel driving circuit, or the like. The formation of the display circuit layer DP-CL may include the step of forming an insulating layer, a semiconductor layer, and a conductive layer by a coating process or a deposition process and the step of patterning the insulating layer, the semiconductor layer, and the conductive layer by a photolithography and/or etching process.

The display element layer DP-OLED may include a pixel definition layer PDL and a plurality of organic light emitting diodes OLED. The pixel definition layer PDL may be formed of or include an organic material. Each of the plurality of organic light emitting diodes OLED includes a first electrode AE, an emission layer EML, and a second electrode CE. The first electrode AE may be disposed on the display circuit layer DP-CL. The pixel definition layer PDL may be formed on the first electrode AE. An opening OP may be defined in the pixel definition layer PDL. The opening OP of the pixel definition layer PDL may expose at least a portion of the first electrode AE. In an exemplary embodiment, the pixel definition layer PDL may be omitted.

As shown in FIGS. 4A and 5A, the display panel DP may include the emission regions PXA-R, PXA-G, and PXA-B and non-emission regions NPXA-R, NPXA-G, and NPXA-B, which are provided near the emission regions PXA-R, PXA-G, and PXA-B. Each of the non-emission regions NPXA-R, NPXA-G, and NPXA-B may enclose a corresponding one of the emission regions PXA-R, PXA-G, and PXA-B. In the illustrated exemplary embodiment, each of the emission regions PXA-R, PXA-G, and PXA-B may be defined to correspond to a portion of the first electrode AE exposed by the opening OP. The non-pixel region NPA may be defined between the non-emission regions NPXA-R, NPXA-G, and NPXA-B. The first electrode AE may be separately formed in each of the pixels PX-R, PX-G, and PX-B.

The emission layer EML emitting light may be disposed on the first electrode AE. The emission layer EML may be provided on a region corresponding to the opening OP. In other words, the emission layer EML may include a plurality of patterns that are separately and respectively formed in the pixels PX-R, PX-G, and PX-B. The emission layer EML may be formed of or include at least one of organic and/or inorganic materials. The emission layer EML may be configured to generate a specific color light. For example, the emission layer EML may generate light of red, green, or blue.

In the illustrated exemplary embodiment, the emission layer EML is illustrated to have a patterned structure, but exemplary embodiments are not limited thereto. For example, the emission layer EML may be provided to have a continuous structure spanning a plurality of the emission regions PXA-R, PXA-G, and PXA-B. Here, the emission layer EML may generate white-color light. Also, the emission layer EML may have a multi-layered structure called as 'tandem'.

As shown in FIG. 6A, a hole control layer HCL may be disposed between the emission layer EML and the first electrode AE. For example, the hole control layer HCL may be disposed in all of the emission regions PXA-R, PXA-G, and PXA-B, the non-emission regions NPXA-R, NPXA-G, and NPXA-B, and the non-pixel region NPA.

The second electrode CE may be disposed on the emission layer EML. The second electrode CE may be disposed in all of the emission regions PXA-R, PXA-G, and PXA-B, the non-emission regions NPXA-R, NPXA-G, and NPXA-B, and the non-pixel region NPA.

As shown in FIG. 6A, an electron control layer ECL may be further disposed between the emission layer EML and the second electrode CE. For example, the electron control layer ECL may be disposed in all of the emission regions PXA-R, PXA-G, and PXA-B, the non-emission regions NPXA-R, NPXA-G, and NPXA-B, and the non-pixel region NPA.

Referring to FIGS. 5A and 6A, the encapsulation layer TFE may be disposed on the second electrode CE. The encapsulation layer TFE may hermetically seal the display element layer DP-OLED. The encapsulation layer TFE may include at least one insulating layer. In an exemplary embodiment, the encapsulation layer TFE may include at least one inorganic layer (hereinafter, a first inorganic encapsulation layer T-IL1). In an exemplary embodiment, the encapsulation layer TFE may further include at least one organic layer (hereinafter, an organic encapsulation layer T-OL) and at least one inorganic layer (hereinafter, a second inorganic encapsulation layer T-IL2). The organic encapsulation layer T-OL may be disposed between the first and second inorganic encapsulation layers T-IL1 and T-IL2.

The first and second inorganic encapsulation layers T-IL1 and T-IL2 may protect the display element layer DP-OLED from moisture or oxygen, and the organic encapsulation layer T-OL may protect the display element layer DP-OLED from a contamination material such as dust particles. The first and second inorganic encapsulation layers T-IL1 and T-IL2 may include a silicon nitride layer, a silicon oxynitride layer, a silicon oxide layer, a titanium oxide layer, or an aluminum oxide layer, but exemplary embodiments are not limited thereto. The organic encapsulation layer T-OL may be formed of or include an acrylic organic layer, but exemplary embodiments are not limited thereto.

The input-sensing unit ISP may include a first insulating layer ILL a first conductive layer disposed thereon, a second insulating layer IL2 covering the first conductive layer, and a second conductive layer disposed on the second insulating layer IL2. The first insulating layer IL1 may be formed of or include an inorganic material and may include, for example, a silicon nitride layer. The second inorganic encapsulation layer T-IL2, which is the topmost layer of the encapsulation layer TFE, may also be formed of or include a silicon nitride layer, which is formed under a deposition condition different from that for the first insulating layer IL1.

Referring to FIGS. 3, 4B, 5A, and 5B, the first conductive layer may be disposed on the first insulating layer IL1. The first conductive layer may include the first connecting portion CP1. The second conductive layer may be disposed on the second insulating layer IL2. The second conductive layer may include the first sensing portion SP1, the second sensing portion SP2, and the second connecting portion CP2.

The second insulating layer IL2 may be disposed between the first conductive layer and the second conductive layer. The second insulating layer IL2 may separate the first conductive layer from the second conductive layer, when viewed in cross section. First and second contact holes CNT1 and CNT2 may be provided in the second insulating layer IL2 to partially expose the first connecting portion CP1. The first connecting portion CP1 may be coupled to a pair of the first sensing portions SP1, which are adjacent to each other, through the first and second contact holes CNT1 and CNT2. The second connecting portion CP2 may be formed to pass through a separation space between the adjacent pair of the first sensing portions SP1. The second connecting portion CP2 may be electrically disconnected from the adjacent pair of the second sensing portions SP2.

FIG. 5B illustrates a structure, in which the first conductive layer includes the first connecting portion CP1 and the second conductive layer includes the first sensing portion SP1, the second sensing portion SP2, and the second connecting portion CP2, but exemplary embodiments are not limited thereto. For example, the first conductive layer may include the second connecting portion CP2, and the second conductive layer may include the first sensing portion SP1, the second sensing portion SP2, and the first connecting portion CP1. In an exemplary embodiment, the first conductive layer may include the first sensing portion SP1, the second sensing portion SP2, and the first connecting portion CP1, and the second conductive layer may include the second connecting portion CP2.

The second insulating layer IL2 may be formed of or include an inorganic material. For example, the second insulating layer IL2 may include a silicon nitride layer. In an exemplary embodiment, the second insulating layer IL2 may be thicker than the first insulating layer IL1.

The diffraction patterns DFP may be formed in at least one of the first and second insulating layers IL1 and IL2. FIG. 5A illustrates the diffraction patterns DFP formed in the second insulating layer IL2, but exemplary embodiments are not limited thereto.

The diffraction patterns DFP may be arranged at a substantially constant pitch to diffract at least a portion of light emitted from the emission layer EML. For example, the diffraction patterns DFP may diffract at least a portion of light incident into the input-sensing unit ISP. Each of the diffraction patterns DFP may be a hole penetrating the second insulating layer IL2. For example, the second insulating layer IL2 may include a plurality of holes. The plurality of holes are formed to penetrate the second insulating layer IL2 in the third direction DR3 and are defined as the diffraction patterns DFP. The first insulating layer IL1 may be partially exposed by the diffraction patterns DFP.

The process of forming the holes DFP in the second insulating layer IL2 may be performed concurrently with the process of forming the first and second contact holes CNT1 and CNT2 in the second insulating layer IL2. In other words, the holes DFP and the first and second contact holes CNT1 and CNT2 may be simultaneously formed by the same process. Thus, an additional patterning process to form the diffraction patterns DFP may be omitted, and this may make it possible to reduce the number of masks required to fabricate a display device, and the overall process time.

The diffraction patterns DFP may be overlapped with the emission regions PXA-R, PXA-G, and PXA-B. The diffraction patterns DFP may be partially overlapped with the non-emission regions NPXA-R, NPXA-G, and NPXA-B.

The diffraction patterns DFP may not be overlapped with the non-pixel region NPA. The first and second conductive layers SP1, SP2, CP1, and CP2 may be disposed to correspond to the non-pixel region NPA. Thus, the diffraction patterns DFP may be provided in such a way that they are not overlapped with the first and second conductive layers SP1, SP2, CP1, and CP2.

The input-sensing unit ISP may further include a protection layer PL. The protection layer PL may cover the second insulating layer IL2 and the second conductive layers SP1, SP2, and CP2. In addition, the protection layer PL may cover the first insulating layer IL1 exposed by the diffraction patterns DFP. For example, the protection layer PL may be formed to fill the holes DFP.

The protection layer PL may be formed of or include an organic material. For example, the protection layer PL may be formed of or include an acrylic resin. The protection layer PL may be thicker than the first and second insulating layers IL1 and IL2. In addition, the protection layer PL may have a refractive index different from that of the first and second insulating layers IL1 and IL2. For example, the protection layer PL may have a refractive index of about 1.6, and the first and second insulating layers IL1 and IL2 may have a refractive index of about 1.9.

Referring to FIG. 6A, the organic light emitting diode OLED may generate first lights L1a, L1b, and L1c. The first lights L1a, L1b, and L1c emitted from the organic light emitting diode OLED may pass through the encapsulation layer TFE and may be incident into the input-sensing unit ISP. The first lights L1a, L1b, and L1c emitted from the organic light emitting diode OLED may include a front light L1a, which propagates in an upward direction (e.g., in the third direction DR3 substantially perpendicular to the display surface IS of FIG. 1A), and first and second lateral lights L1b and L1c, which propagate in directions different from the front light L1a. For illustrative convenience, FIG. 6A illustrates only some of the lateral lights L1b and L1c (e.g., the first and second lateral lights L1b and L1c propagating in directions inclined at a first angle θ1 to the front light L1a).

The first lights L1a, L1b, and L1c, which are emitted from the organic light emitting diode OLED, may be diffracted by the diffraction patterns DFP of the input-sensing unit ISP to form second lights L2a, L2b, and L2c. The diffraction of the first lights L1a, L1b, and L1c may be caused by not only the diffraction patterns DFP and but also by the difference in refractive index between the second insulating layer IL2 and the protection layer PL filling the diffraction patterns DFP. For example, the diffraction effect by the diffraction patterns DFP may occur more distinctly when there is a difference in refractive index between the protection layer PL and the second insulating layer IL2 than when there is no such difference.

The second lights L2a, L2b, and L2c may include a first diffraction light L2a, which is produced by the diffraction of the front light L1a, and second and third diffraction lights L2b and L2c, which are produced by the diffraction of the first and second lateral lights L1b and L1c. The first diffraction light L2a may include a plurality of lights, one of which propagates in the same direction as the front light L1a and others of which propagate in different directions from the front light L1a. In other words, the front light L1a may be emitted in lateral directions as well as a front direction. Furthermore, the second diffraction light L2b may include a plurality of lights, one of which propagates in the same direction as the first lateral light L1b and others of which propagate in different directions from the first lateral light L1b, and the third diffraction light L2c may include a plurality of lights, one of which propagates in the same direction as the second lateral light L1c and others of which propagate in different directions from the second lateral light L1c. Thus, the first and second lateral lights L1b and L1c may be emitted in the front direction as well as the lateral directions.

Since, as described above, the first lights L1a, L1b, and L1c emitted from the organic light emitting diode OLED are diffracted by the diffraction patterns DFP and propagate in various directions (e.g., the front and lateral directions), a difference between colors in front and lateral directions may be reduced, and this may make it possible to improve an overall viewing angle characteristic of the display device DD.

Referring to FIGS. 6A and 6B, the diffraction patterns DFP may be arranged at a specific or substantially constant pitch (hereinafter, an arrangement pitch). The diffraction patterns DFP may be arranged at a first arrangement pitch a1 in the first direction DR1 and may be arranged at a second arrangement pitch a2 in the second direction DR2. As shown in FIG. 6B, the first arrangement pitch a1 and the second arrangement pitch a2 may be equal to each other, but exemplary embodiments are not limited thereto. In other words, the first arrangement pitch a1 and the second arrangement pitch a2 may have values different from each other.

Each of the diffraction patterns DFP may have a substantially constant width (i.e., diameter) b1. In an exemplary embodiment, the width b1 of each of the diffraction patterns DFP may be about 1 μm. The arrangement pitches a1 and a2 of the diffraction patterns DFP may be smaller than the width of a corresponding one of the emission regions PXA-R, PXA-G, and PXA-B.

As shown in FIG. 6B, the diffraction patterns DFP may have a generally circular shape, when viewed in plan. In addition, the diffraction patterns DFP may be arranged in a matrix shape. However, exemplary embodiments are not limited to any specific shape or structure of the diffraction patterns DFP. For example, the diffraction patterns DFP may have one of generally elliptical, polygonal, and elongated shapes.

FIGS. 7A to 7F are plan views of other exemplary embodiments of the second insulating layer of FIG. 5A.

Figure 7A:
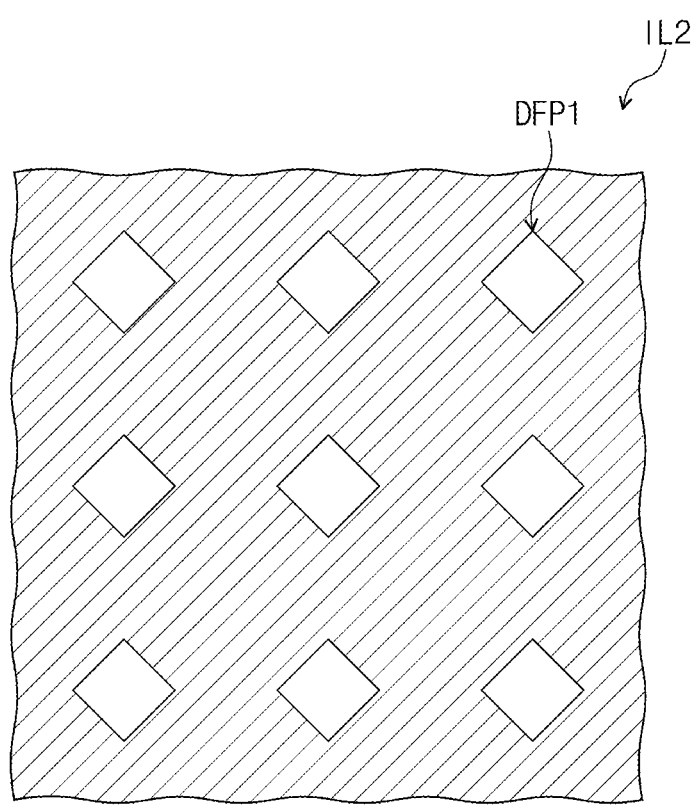
FIGS. 7A, 7B, 7C, 7D, 7E, and 7F are plan views of other exemplary embodiments of the second insulating layer of FIG. 5A.
Figure 7B:
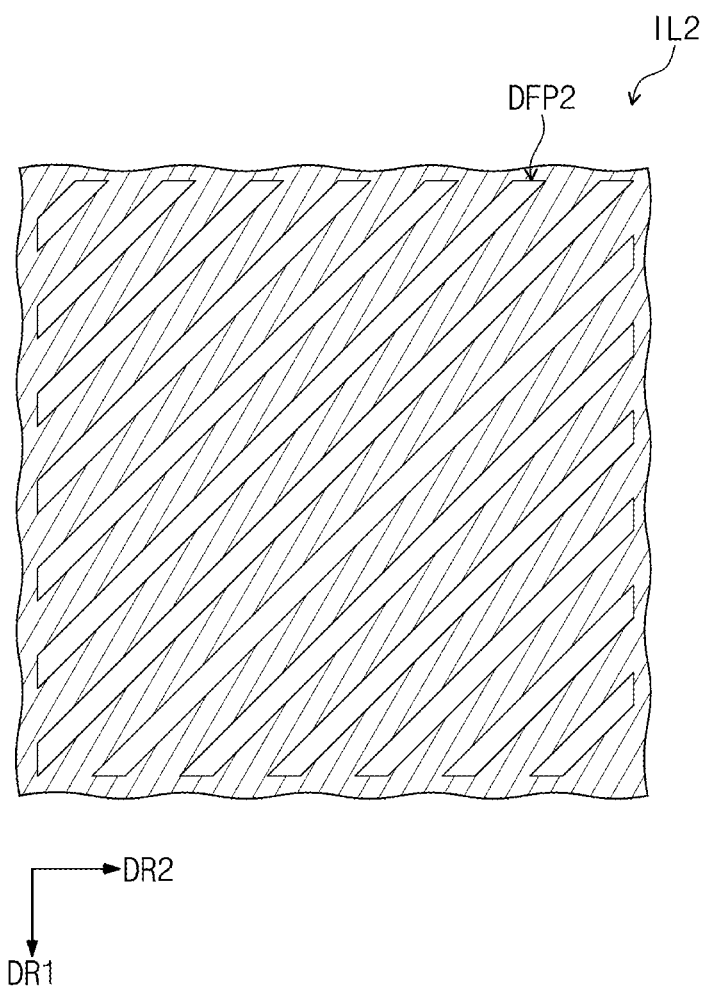

Referring to FIGS. 7A and 7B, each of diffraction patterns DFP1 and DFP2 may be provided to have a hole-shaped structure penetrating the second insulating layer IL2. As shown in FIG. 7A, the diffraction patterns DFP1 may have a generally tetragonal or rectangular hole shape. The diffraction patterns DFP1 may be arranged in a matrix shape.

Alternatively, as shown in FIG. 7B, the diffraction patterns DFP2 may have an elongated shape elongated in a specific direction. Exemplary embodiments are not limited to a specific elongation direction of the diffraction patterns DFP2. For example, the diffraction patterns DFP2 may extend in the first and second directions DR1 and DR2 or in a direction that is inclined at an angle to the first and second directions DR1 and DR2.

Figure 7C:
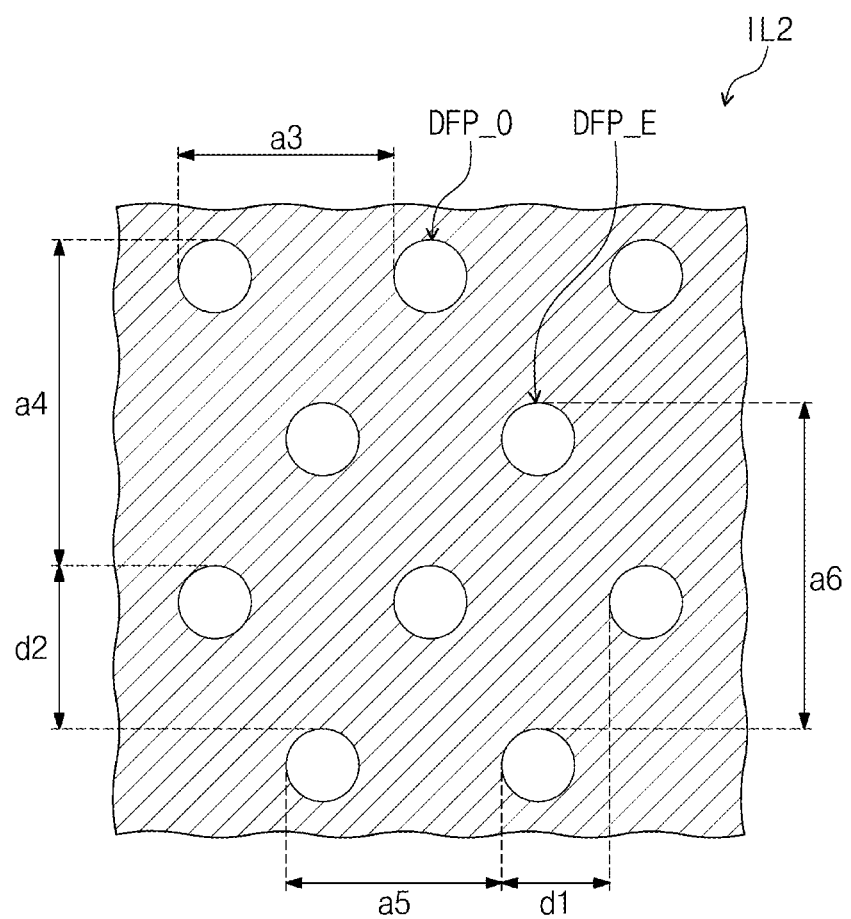

Referring to FIG. 7C, diffraction patterns DFP_O and DFP_E may include odd diffraction patterns DFP_O in odd-numbered rows and even diffraction patterns DFP_E in even-numbered rows. The odd diffraction patterns DFP_O may be arranged at a third arrangement pitch a3 in a row direction and may be arranged at a fourth arrangement pitch a4 in a column direction. The even diffraction patterns DFP_E may be arranged at a fifth arrangement pitch a5 in the row direction and may be arranged at a sixth arrangement pitch a6 in the column direction. The number of the odd diffraction patterns DFP_O may be different from the number of the even diffraction patterns DFP_E. In an exemplary embodiment, the third arrangement pitch a3 may have a value that is equal to or different from the fifth arrangement pitch a5, and the fourth arrangement pitch a4 may have a value that is equal to or different from the sixth arrangement pitch a6.

The odd diffraction patterns DFP_O and the even diffraction patterns DFP_E adjacent thereto may be spaced apart from each other by a first distance d1 in the row direction. Here, the third arrangement pitch a3 or the fifth arrangement pitch a5 may be two times of the first distance d1. The odd diffraction patterns DFP_O and the even diffraction patterns DFP_E adjacent thereto may be spaced apart from each other by a second distance d2 in the column direction. Here, the fourth arrangement pitch a4 or the sixth arrangement pitch a6 may be two times of the second distance d2.

Figure 7D:
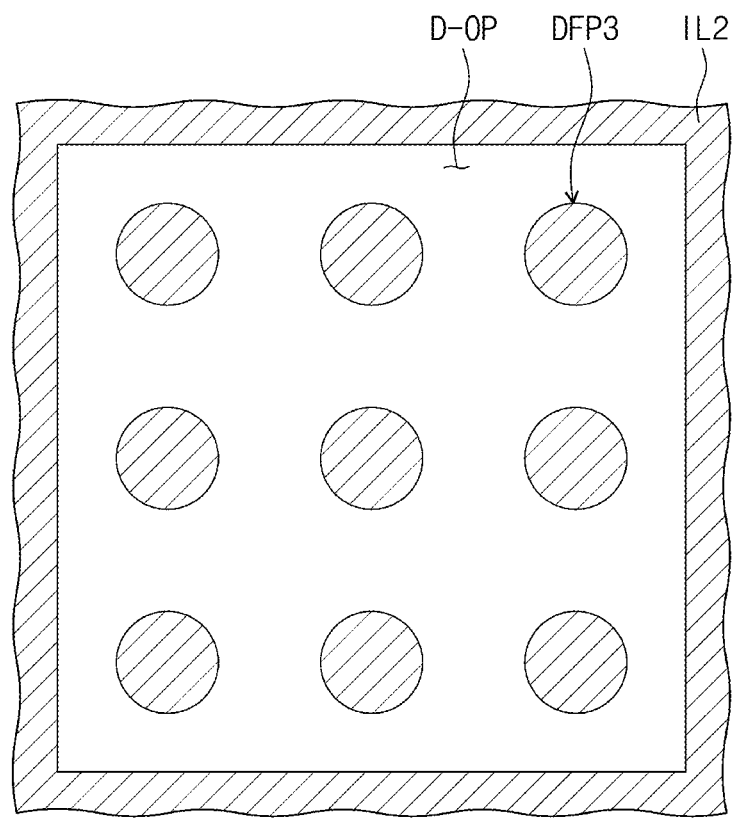
Figure 7E:
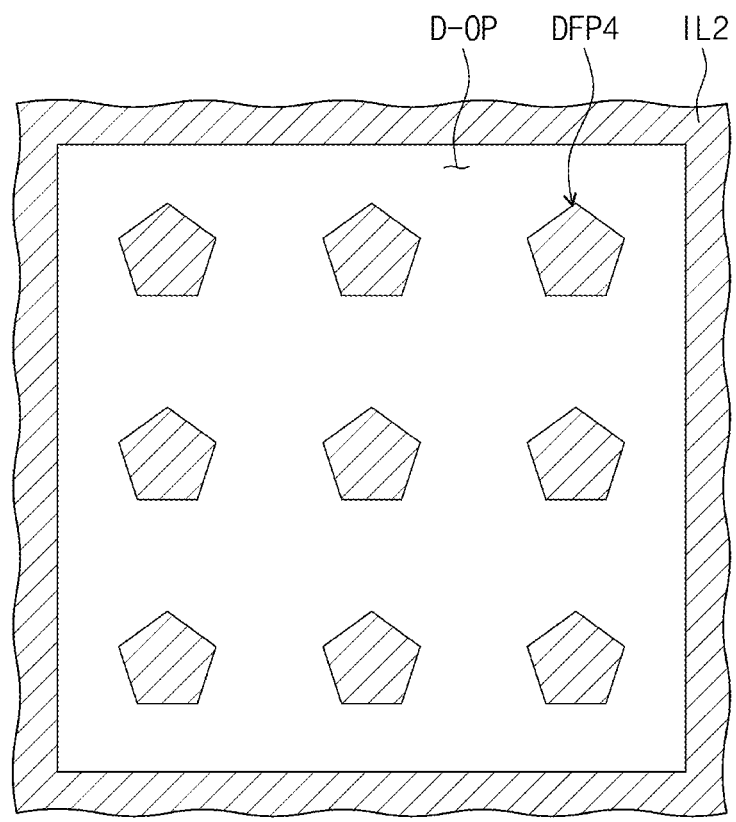

Referring to FIGS. 7D and 7E, diffraction patterns DFP3 and DFP4 may have a columnar shape. In an exemplary embodiment, the diffraction patterns DFP3 and DFP4 may be island-shaped patterns, which are spaced apart from each other. A diffraction open portion D-OP, which has a size corresponding to an emission region of each pixel, may be provided in the second insulating layer IL2, and the diffraction patterns DFP3 or DFP4 may be disposed in the diffraction open portion D-OP.

As shown in FIG. 7D, the diffraction patterns DFP3 may have a generally circular columnar shape. The diffraction patterns DFP3 may be arranged in a matrix shape.

As shown in FIG. 7E, the diffraction patterns DFP4 may have a polygonal columnar shape (e.g., a generally tetragonal, pentagonal, or hexagonal columnar shape). In addition, the diffraction patterns DFP4 may be elongated columnar patterns that are elongated in a specific direction.

Figure 7F:
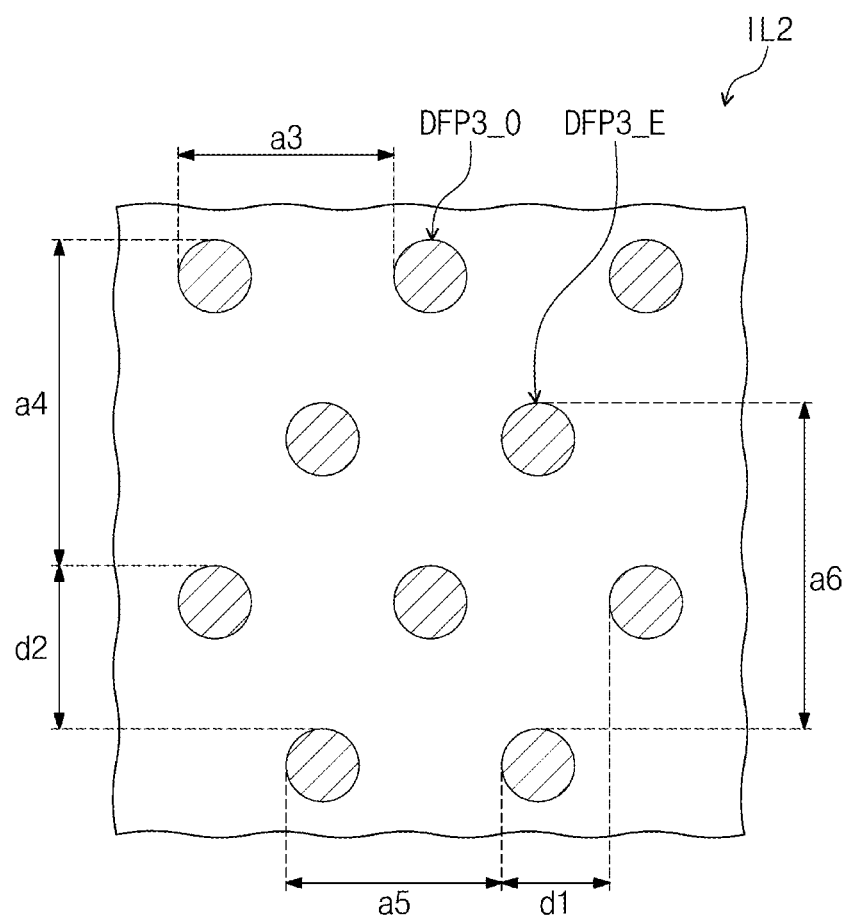

Referring to FIG. 7F, diffraction patterns DFP3_O and DFP3_E may include odd diffraction patterns DFP3_O in odd-numbered rows and even diffraction patterns DFP3_E in even-numbered rows. The odd diffraction patterns DFP3_O may have the same shape as the even diffraction patterns DFP3_E. For example, the odd diffraction patterns DFP3_O and the even diffraction patterns DFP3_E may have a circular columnar shape.

The odd diffraction patterns DFP3_O may be arranged at the third arrangement pitch a3 in a row direction and may be arranged at the fourth arrangement pitch a4 in a column direction. The even diffraction patterns DFP3_E may be arranged at the fifth arrangement pitch a5 in the row direction and may be arranged at the sixth arrangement pitch a6 in the column direction. The number of the odd diffraction patterns DFP3_O in the odd-numbered row may be different from the number of the even diffraction patterns DFP3_E in the even-numbered row. In an exemplary embodiment, the third arrangement pitch a3 may have a value that is equal to or different from the fifth arrangement pitch a5, and the fourth arrangement pitch a4 may have a value that is equal to or different from the sixth arrangement pitch a6.

The odd diffraction patterns DFP3_O and the even diffraction patterns DFP3_E adjacent thereto may be spaced apart from each other by a first distance d1 in the row direction. Here, the third arrangement pitch a3 and the fifth arrangement pitch a5 may be two times the first distance d1.

The odd diffraction patterns DFP3_O and the even diffraction patterns DFP3_E adjacent thereto may be spaced apart from each other by a second distance d2 in the column direction. Here, the fourth arrangement pitch a4 and the sixth arrangement pitch a6 may be two times of the second distance d2.

Figure 8A:
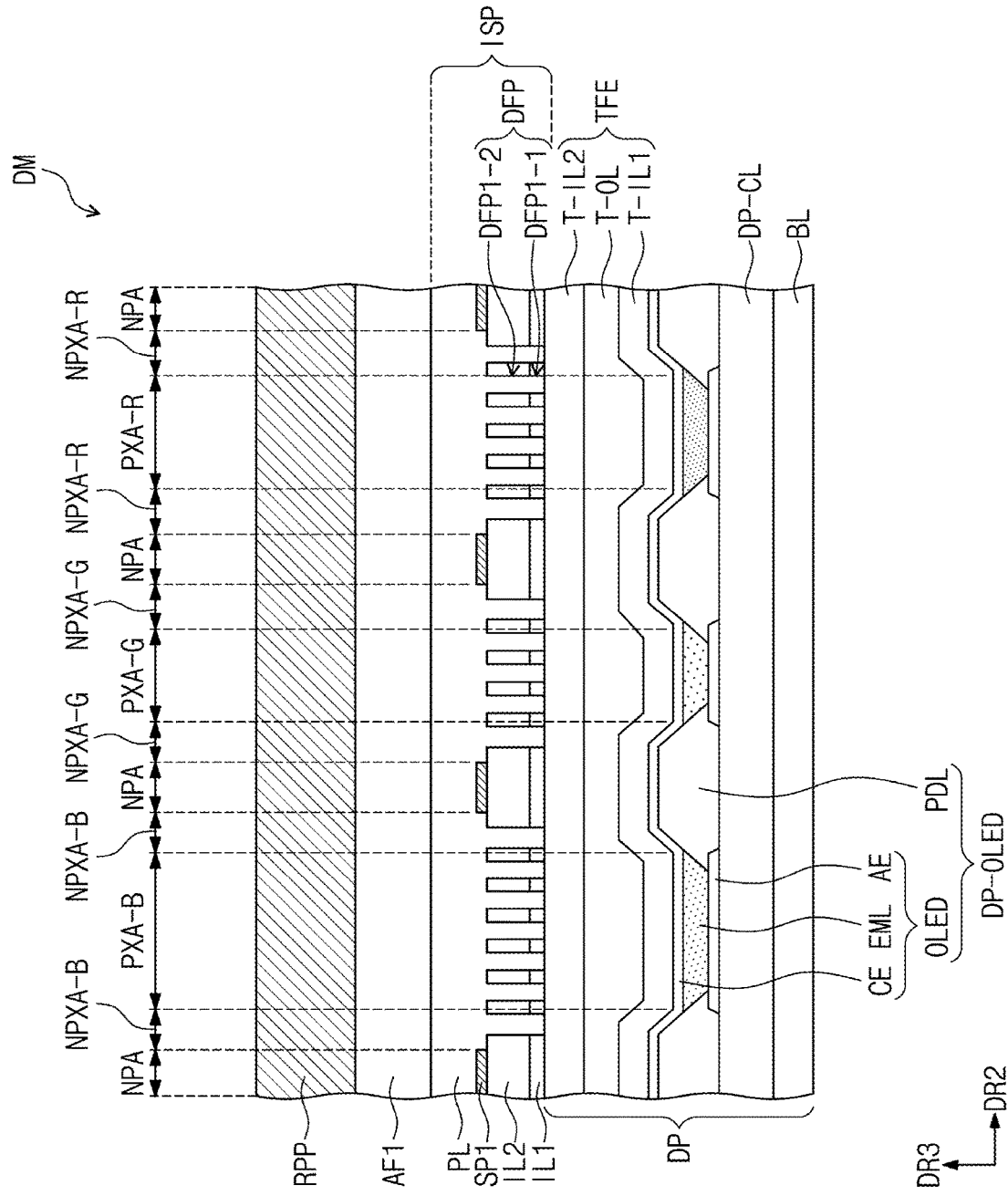
FIGS. 8A and 8B are sectional views of other exemplary embodiments of the display module of FIG. 1B.
Figure 8B:
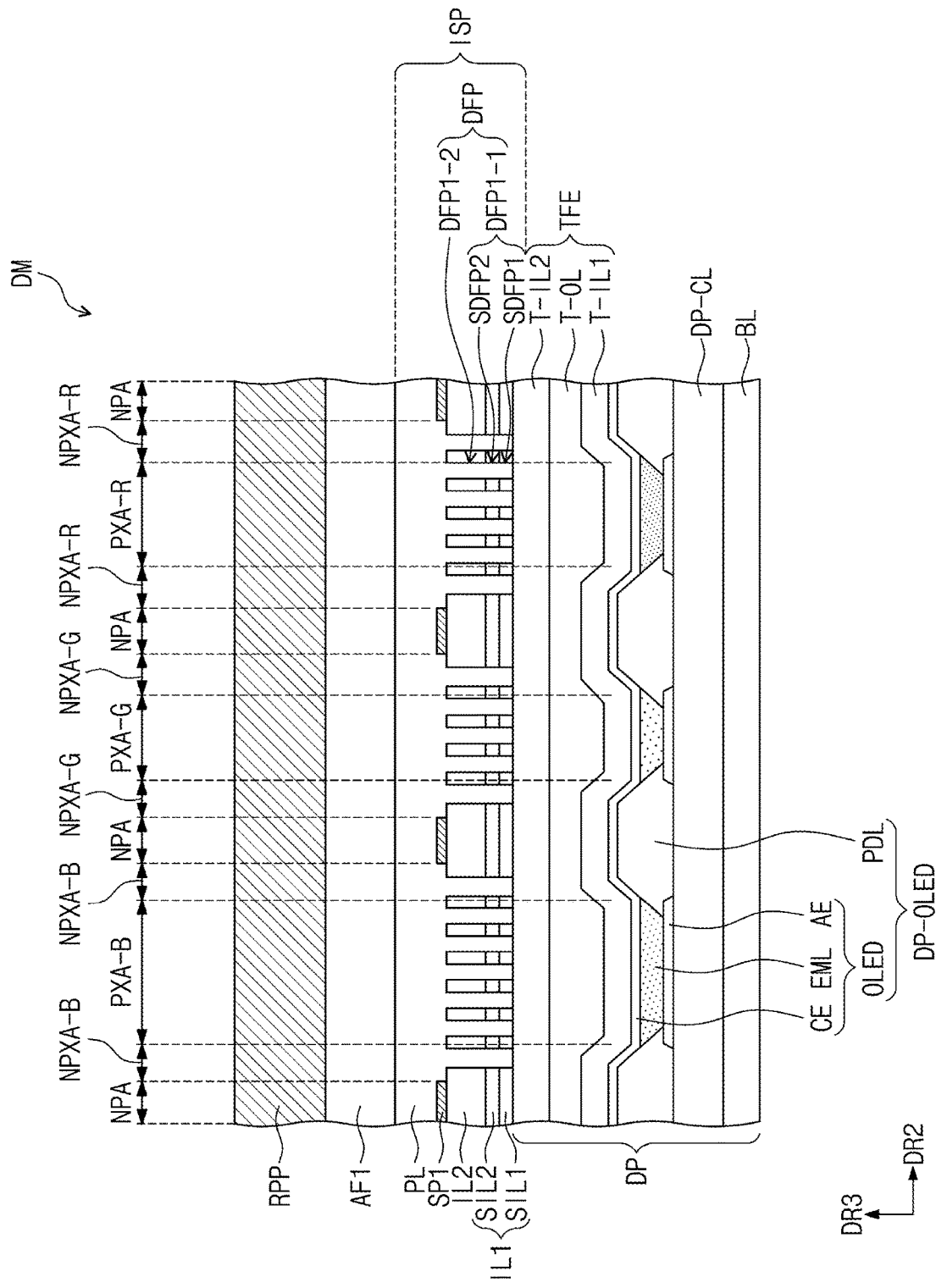

FIGS. 8A and 8B are sectional views of other exemplary embodiments of the display module of FIG. 1B.

Referring to FIGS. 3, 4B, and 8A, the input-sensing unit ISP of the display module DM may include the first insulating layer ILL the first and second conductive layers SP1, SP2, CP1, and CP2, the second insulating layer IL2, and the protection layer PL.

The diffraction patterns DFP may be provided in the first and second insulating layers IL1 and IL2. The diffraction patterns DFP in the display module DM of FIG. 8A may include a plurality of first diffraction patterns DFP1-1, which are formed in the first insulating layer ILL and a plurality of second diffraction patterns DFP1-2, which are formed in the second insulating layer IL2, compared with the display module DM shown in FIG. 5A. The second diffraction patterns DFP1-2 may be disposed to correspond to the first diffraction patterns DFP1-1. For example, the second diffraction patterns DFP1-2 may be disposed on the first diffraction patterns DFP1-1.

Each of the first diffraction patterns DFP1-1 may be a first hole penetrating the first insulating layer ILL and each of the second diffraction patterns DFP1-2 may be a second hole penetrating the second insulating layer IL2. For example, the first insulating layers IL1 includes a plurality of first holes penetrating the first insulating layers IL1 in the third direction DR3 and defining the first diffraction patterns DFP1-1. The second insulating layer IL2 includes a plurality of second holes penetrating the second insulating layer IL2 in the third direction DR3 and defining the first diffraction patterns DFP1-1. The diffraction patterns DFP may include the holes defined by the first and second holes DFP1-1 and DFP1-2. The second inorganic encapsulation layer T-IL2, which is the topmost layer of the encapsulation layer TFE, may be partially exposed by the holes DFP.

The first and second diffraction patterns DFP1-1 and DFP1-2 may have a substantially similar structure to one of the diffraction patterns DFP and DFP1-DFP4 shown in FIGS. 6B to 7F. Thus, a detailed description of the structure of each of the first and second diffraction patterns DFP1-1 and DFP1-2 will be omitted to avoid redundancy.

The first and second diffraction patterns DFP1-1 and DFP1-2 may be overlapped with the emission regions PXA-R, PXA-G, and PXA-B. The first and second diffraction patterns DFP1-1 and DFP1-2 may be partially overlapped with the non-emission regions NPXA-G, NPXA-R, and NPXA-B.

The input-sensing unit ISP may further include the protection layer PL. The protection layer PL may cover the second insulating layer IL2 and the second conductive layers SP1, SP2, and CP2. In addition, the protection layer PL may cover the second inorganic encapsulation layer T-IL2 exposed by the holes DFP. In other words, the protection layer PL may be formed to fill the holes DFP.

The protection layer PL may be formed of or include an organic material. For example, the protection layer PL may be formed of or include an acrylic resin. The protection layer PL may be thicker than the first and second insulating layers IL1 and IL2. In addition, the protection layer PL may have a refractive index different from that of the first and second insulating layers IL1 and IL2. For example, the protection layer PL may have a refractive index of about 1.6, and the first and second insulating layers IL1 and IL2 may have a refractive index of about 1.9. Thus, light incident into the diffraction patterns DFP1-1 and DFP1-2 may be diffracted by the diffraction patterns DFP1-1 and DFP1-2 and by the difference in refractive index between the first and second insulating layers IL1 and IL2 and the protection layer PL filling the diffraction patterns DFP1-1 and DFP1-2.

Referring to FIG. 8B, the first insulating layer IL1 may include a first sub-insulating layer SIL1 and a second sub-insulating layer SIL2. The first sub-insulating layer SIL1 may be directly disposed on the encapsulation layer TFE, and the second sub-insulating layer SIL2 may be disposed on the first sub-insulating layer SIL1. The first and second sub-insulating layers SIL1 and SIL2 may be formed of or include an inorganic material. In an exemplary embodiment, the first and second sub-insulating layers SIL1 and SIL2 may be formed of or include the same material. For example, each of the first and second sub-insulating layers SIL1 and SIL2 may include a silicon nitride layer, and the first sub-insulating layer SIL1 and the second sub-insulating layer SIL2 may be formed under different deposition conditions.

The first diffraction patterns DFP1-1 provided in the first insulating layer IL1 may include a plurality of first sub-diffraction patterns SDFP1, which are provided in the first sub-insulating layer SIL1 and a plurality of second sub-diffraction patterns SDFP2, which are provided in the second sub-insulating layer SIL2. The second sub-diffraction patterns SDFP2 may be disposed to correspond to the first sub-diffraction patterns SDFP1. In addition, the second diffraction patterns DFP1-2 may be disposed to correspond to the first diffraction patterns DFP1-1 including the first and second sub-circuit patterns SDFP1 and SDFP2.

Each of the first sub-diffraction patterns SDFP1 may be a first sub-hole penetrating the first sub-insulating layer SIL1 and each of the second sub-diffraction patterns SDFP2 may be a second sub-hole penetrating the second sub-insulating layer SIL2. For example, the first sub-insulating layers SIL1 includes a plurality of first sub-holes penetrating the first sub-insulating layers SIL1 in the third direction DR3 and defining the first sub-diffraction patterns SDFP1. The second sub-insulating layers SIL2 includes a plurality of second sub-holes penetrating the second sub-insulating layers SIL2 in the third direction DR3 and defining the second sub-diffraction patterns SDFP2. The diffraction patterns DFP may include the holes defined by the first sub-holes SDFP1, the second sub-holes SDFP2 and the second holes DFP1-2. The second inorganic encapsulation layer T-IL2, which is the topmost layer of the encapsulation layer TFE, may be partially exposed by the holes DFP.

The input-sensing unit ISP may further include the protection layer PL. The protection layer PL may cover the second insulating layer IL2 and the second conductive layers SP1, SP2, and CP2. In addition, the protection layer PL may cover the second inorganic encapsulation layer T-IL2 exposed by the holes DFP. In other words, the protection layer PL may be formed to fill the holes DFP.

Light incident into the diffraction patterns SDFP1, SDFP2, and DFP1-2 may be diffracted by the diffraction patterns SDFP1, SDFP2, and DFP1-2 and the difference in refractive index between the first and second insulating layers IL1 and IL2 and the protection layer PL filling the diffraction patterns SDFP1, SDFP2, and DFP1-2.

Figure 9A:
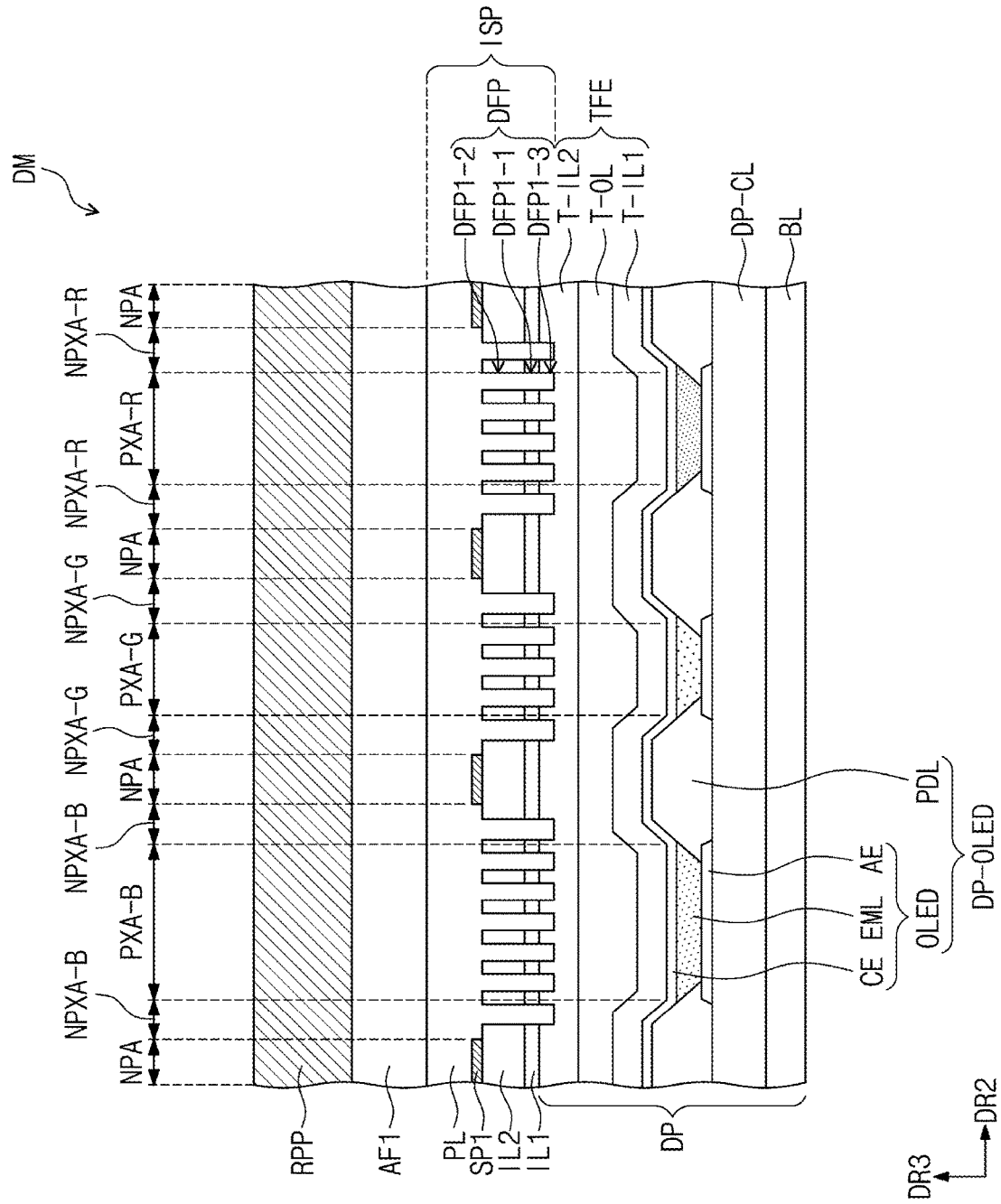
FIGS. 9A and 9B are sectional views of other exemplary embodiments of the display module of FIG. 1B.
Figure 9B:
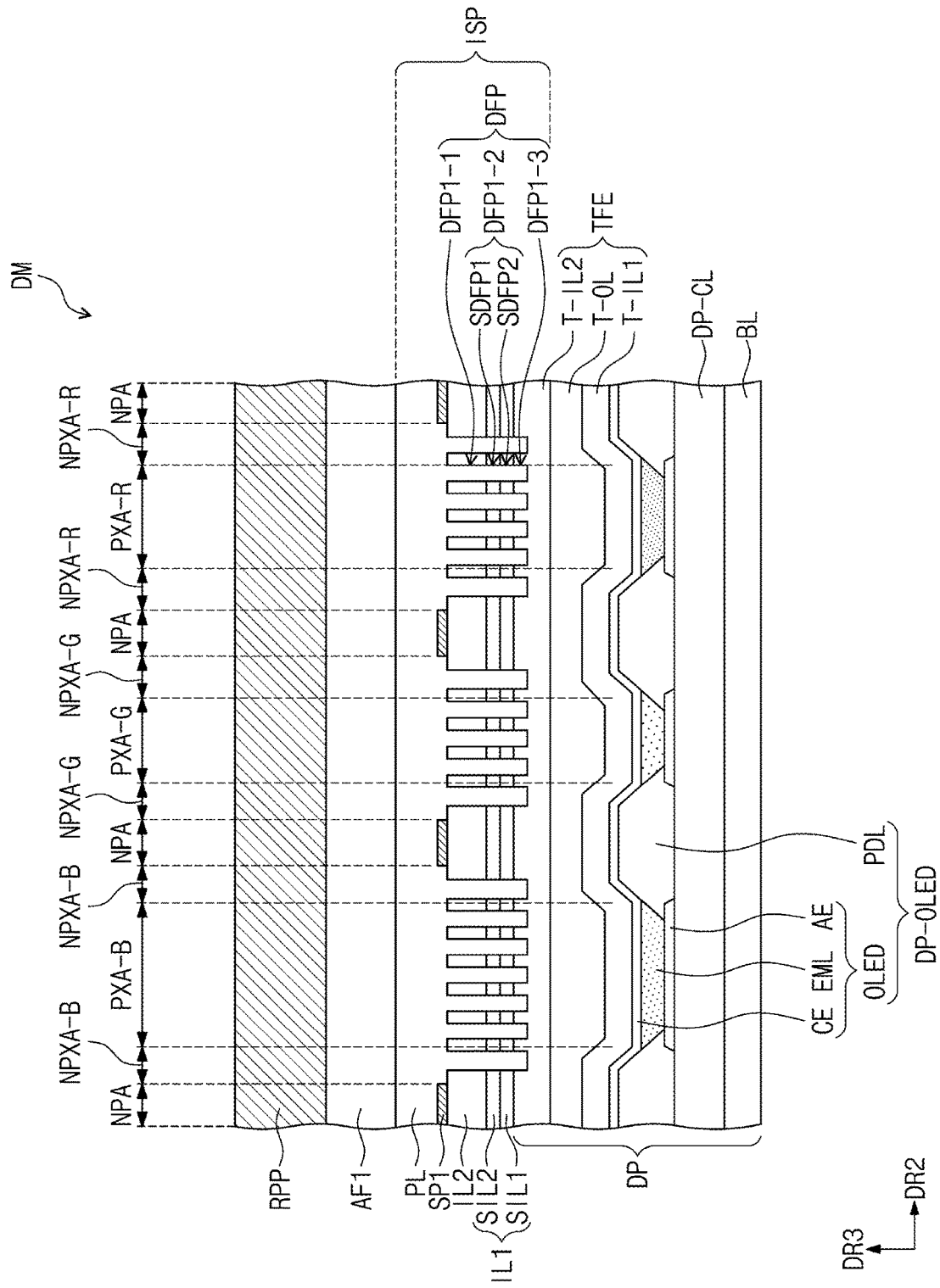

FIGS. 9A and 9B are sectional views of other exemplary embodiments of the display module of FIG. 1B.

Referring to FIG. 9A, the diffraction patterns DFP may be provided in the first and second insulating layers IL1 and IL2. The diffraction patterns DFP may include the first diffraction patterns DFP1-1, which are formed in the first insulating layer ILL and the second diffraction patterns DFP1-2, which are formed in the second insulating layer IL2. Each of the first diffraction patterns DFP1-1 may be a hole-shaped structure penetrating the first insulating layer ILL and each of the second diffraction patterns DFP1-2 may be a hole-shaped structure penetrating the second insulating layer IL2.

In an exemplary embodiment, the encapsulation layer TFE may include third diffraction patterns DFP1-3, which are disposed to correspond to the first and second diffraction patterns DFP1-1 and DFP1-2. For example, the third diffraction patterns DFP1-3 may be provided in the second inorganic encapsulation layer T-IL2, which is the topmost layer of the encapsulation layer TFE. Each of the third diffraction patterns DFP1-3 may be a recessed-shaped structure (such as a groove), which is concavely recessed relative to the top surface of the second inorganic encapsulation layer T-IL2. However, exemplary embodiments are not limited thereto. For example, the third diffraction pattern DFP1-3 may be a hole-shaped structure penetrating the second inorganic encapsulation layer T-IL2.

The first to third diffraction patterns DFP1-1 to DFP1-3 may be formed in the first insulating layer ILL the second insulating layer IL2, and the second inorganic encapsulation layer T-IL2, respectively, and the protection layer PL may be provided to fill regions, in which the first to third diffraction patterns DFP1-1 to DFP1-3 are formed. Thus, light emitted from the emission layer EML may be diffracted by a difference in refractive index between the second inorganic encapsulation layer T-IL2 and the protection layer PL and between the first and second insulating layers IL1 and IL2 and the protection layer PL.

Referring to FIG. 9B, the encapsulation layer TFE may include third diffraction patterns DFP1-3, which are disposed to correspond to the first and second sub-diffraction patterns SDFP1 and SDFP2. For example, the third diffraction patterns DFP1-3 may be provided in the second inorganic encapsulation layer T-IL2, which is the topmost layer of the encapsulation layer TFE. Each of the third diffraction patterns DFP1-3 may be a recessed-shaped structure (such as a groove), which is concavely recessed relative to the top surface of the second inorganic encapsulation layer T-IL2. However, exemplary embodiments are not limited thereto. For example, the third diffraction pattern DFP1-3 may be a hole-shaped structure penetrating the second inorganic encapsulation layer T-IL2.

Figure 10:
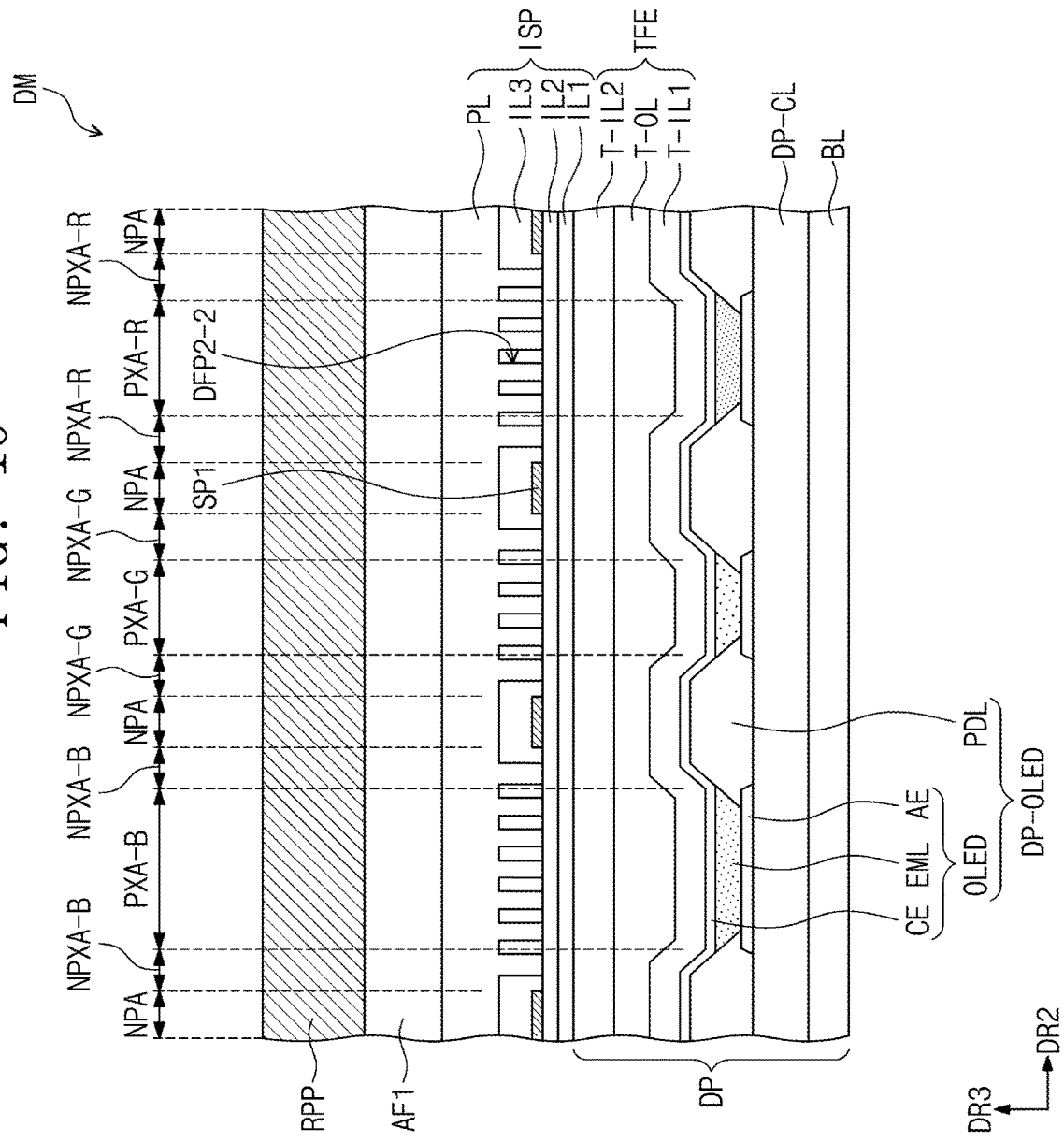
FIG. 10 is a sectional view of another exemplary embodiment of the display module of FIG. 1B.

FIG. 10 is a sectional view of another exemplary embodiment of the display module of FIG. 1B.

Referring to FIG. 10, the input-sensing unit ISP may further include a third insulating layer IL3 disposed between the protection layer PL and the second insulating layer IL2. The third insulating layer IL3 may be formed of or include an inorganic material. For example, the third insulating layer IL3 may include a silicon nitride layer. In an exemplary embodiment, the third insulating layer IL3 may be thicker than the first and second insulating layers IL1 and IL2.

In an exemplary embodiment, a plurality of diffraction patterns DFP2-2 may be provided in the third insulating layer IL3. The diffraction patterns may have a substantially similar structure to one of the diffraction patterns shown in FIGS. 6B to 7F. The diffraction patterns DFP2-2 may diffract at least a portion of light emitted from the emission layer EML. For example, the diffraction patterns DFP2-2 may diffract at least a portion of light incident into the input-sensing unit ISP.

In an exemplary embodiment, each of the diffraction patterns DFP2-2 may be a hole penetrating the third insulating layer IL3. For example, the third insulating layer IL3 may include a plurality of holes penetrating the third insulating layer IL3 in the third direction DR3 and defining the diffraction patterns DFP2-2. The second insulating layer IL2 may be partially exposed by the diffraction patterns DFP2-2.

The protection layer PL may be disposed on the third insulating layer IL3. The holes DFP2-2 may be filled with the protection layer PL. Thus, light emitted from each emission layer EML may be diffracted due to the difference in refractive index between the third insulating layer IL3 and the protection layer PL.

Figure 11A:
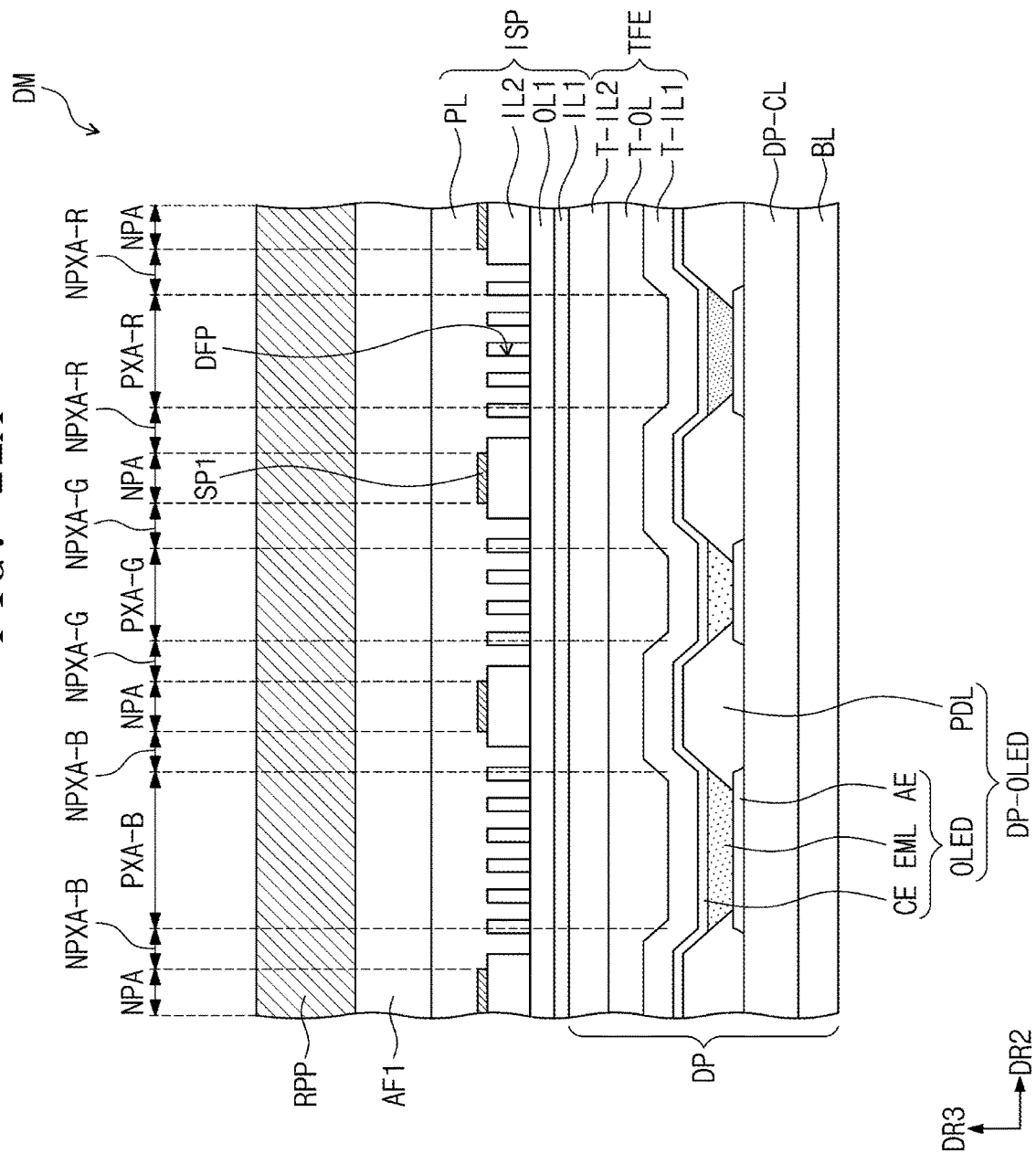
FIGS. 11A and 11B are sectional views of other exemplary embodiments of the display module of FIG. 1B.
Figure 11B:
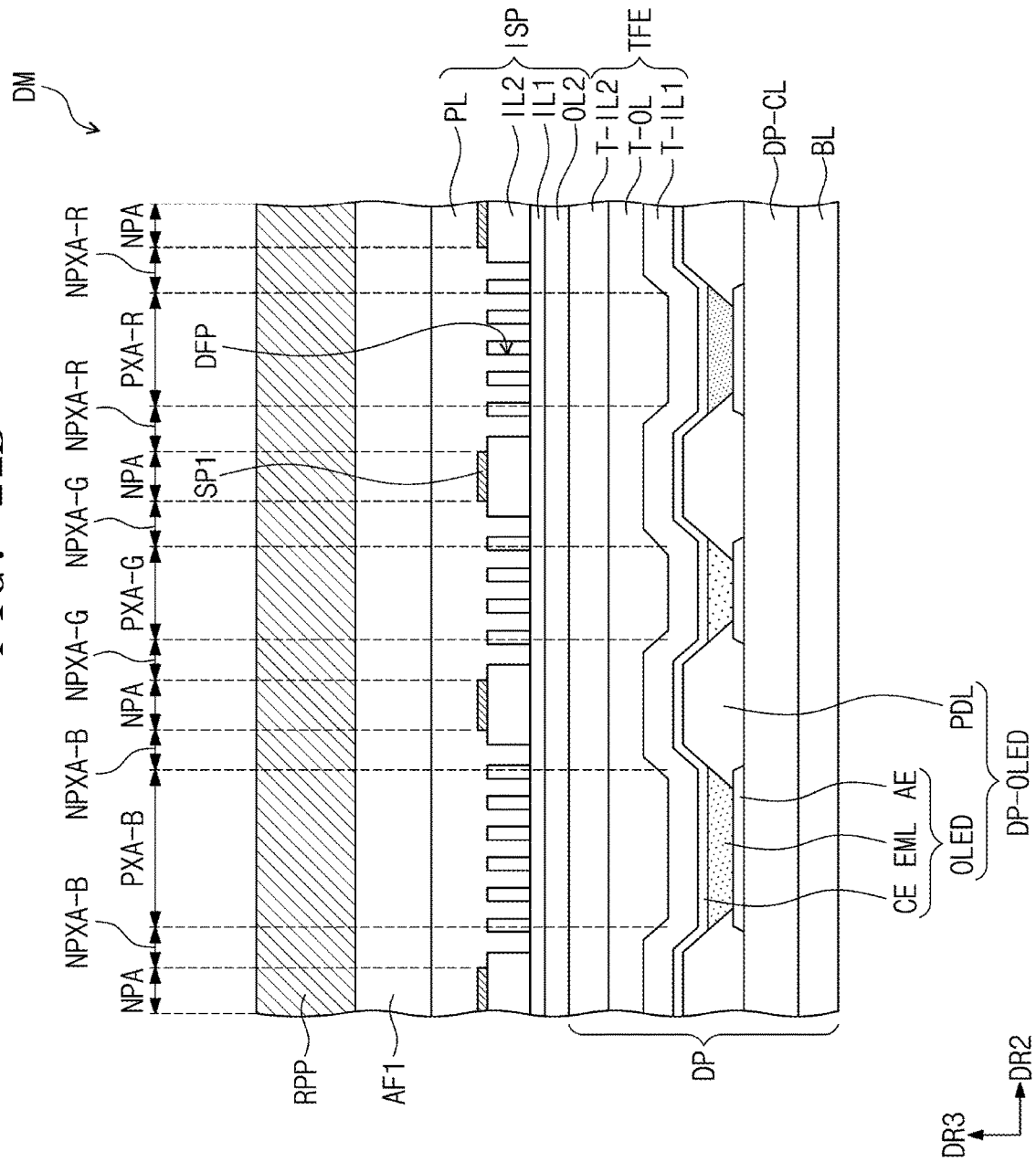

FIGS. 11A and 11B are sectional views of other exemplary embodiments of the display module of FIG. 1B.

Referring to FIG. 11A, the input-sensing unit ISP may include the diffraction patterns DFP, which are formed in the second insulating layer IL2. The input-sensing unit ISP may further include a fourth insulating layer OL1 disposed below the second insulating layer IL2. The fourth insulating layer OL1 may be disposed between the first and second insulating layers IL1 and IL2. The fourth insulating layer OL1 may be formed of or include an organic material. In an exemplary embodiment, the fourth insulating layer OL1 may be formed of or include an acrylic resin. The fourth insulating layer OL1 may be formed of the same organic material as the protection layer PL, but the fourth insulating layer OL1 may be formed under a process condition different from that for the protection layer PL. For example, each of the fourth insulating layer OL1 and the protection layer PL may be formed of or include a negative photoresist material, and a photo-curing temperature of the fourth insulating layer OL1 may be higher than that of the protection layer PL.

The fourth insulating layer OL1 may be thicker than the first and second insulating layers IL1 and IL2. In an exemplary embodiment, the fourth insulating layer OL1 may have a thickness range from about 1.0 µm to about 10 Due to the fourth insulating layer OL1 interposed between the first insulating layer IL1 and the second insulating layer IL2, the distance between the diffraction patterns DFP of the second insulating layer IL2 and the organic light emitting diode OLED may be increased.

Referring to FIG. 11B, the input-sensing unit ISP may further include a fifth insulating layer OL2, which is disposed below the second insulating layer IL2 provided with the diffraction patterns DFP. The fifth insulating layer OL2 may be disposed between the first insulating layer IL1 and the encapsulation layer TFE. For example, the fifth insulating layer OL2 may be disposed between the first insulating layer IL1 and the second inorganic encapsulation layer T-IL2. The fifth insulating layer OL2 may be formed of or include an organic material. In an exemplary embodiment, the fifth insulating layer OL2 may be formed of or include an acrylic resin. The fifth insulating layer OL2 may be formed of the same organic material as the protection layer PL, but in an exemplary embodiment, the fifth insulating layer OL2 may be formed under a process condition different from that for the protection layer PL. For example, each of the fifth insulating layer OL2 and the protection layer PL may be formed of or include a negative photoresist material, and a photo-curing temperature of the fifth insulating layer OL2 may be higher than that of the protection layer PL.

To form a desired distance between the diffraction patterns DFP and the organic light emitting diode OLED, the thickness of each of the fourth and fifth insulating layers OL1 and OL2 may be adjusted or at least one of the fourth and fifth insulating layers OL1 and OL2 may be omitted.

Figure 12:
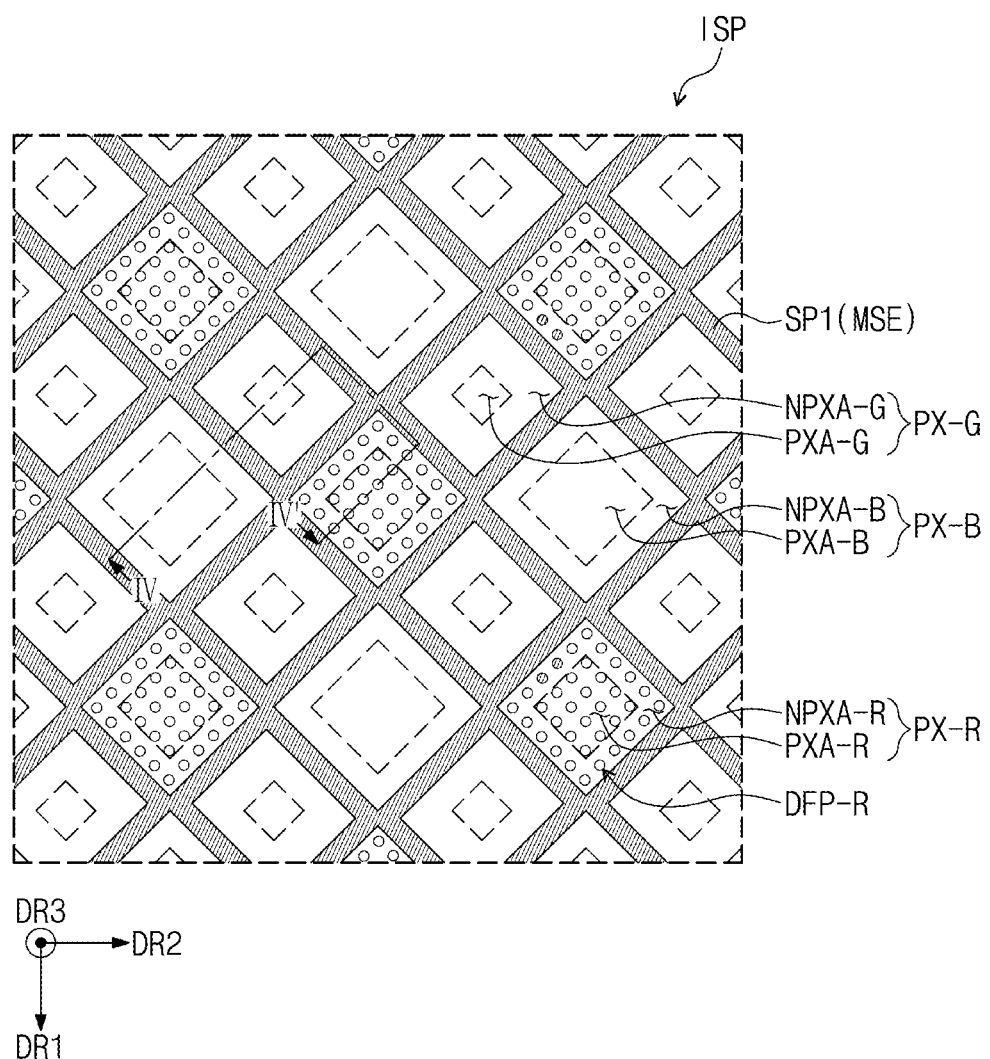
FIG. 12 is an enlarged plan view of the region 'FF' of FIG. 3 illustrating another exemplary embodiment of the input-sensing unit of FIG. 3.

FIG. 12 is an enlarged plan view of the region 'FF' of FIG. 3 illustrating another exemplary embodiment of the input-sensing unit of FIG. 3, and FIGS. 13A to 13E are sectional views taken along a line IV-IV' of FIG. 12 illustrating exemplary embodiments of the display module of FIG. 1B.

Referring to FIG. 12, the input-sensing unit ISP may include red diffraction patterns DFP-R, which are arranged at a substantially constant pitch and diffract at least a portion of light incident into the input-sensing unit ISP. The red diffraction patterns DFP-R may be disposed to correspond to at least one of the pixels PX-R, PX-G, and PX-B. In an exemplary embodiment, the red diffraction patterns DFP-R may be disposed to correspond to the first pixel PX-R of the first to third pixels PX-R, PX-G, and PX-B. Thus, the red diffraction patterns DFP-R may diffract a portion (i.e., a lateral red light) of red light that is incident into the input-sensing unit ISP. The red diffraction patterns DFP-R may be overlapped with the first emission region PXA-R of the first to third emission regions PXA-R, PXA-G, and PXA-B. The red diffraction patterns DFP-R may be overlapped with the first non-emission region NPXA-R adjacent to the first emission region PXA-R.

The red diffraction patterns DFP-R may not be overlapped with the non-pixel region NPA. In other words, the red diffraction patterns DFP-R may be provided in such a way that they are not overlapped with the mesh electrode MSE.

In an exemplary embodiment, the red diffraction patterns DFP-R may have a generally circular shape, when viewed in plan. However, exemplary embodiments are not limited to a specific shape of the diffraction patterns DFP-R. For example, the red diffraction patterns DFP-R may be provided to have various shapes (e.g., generally polygonal, elliptical, and elongated shapes).

Figure 13A:
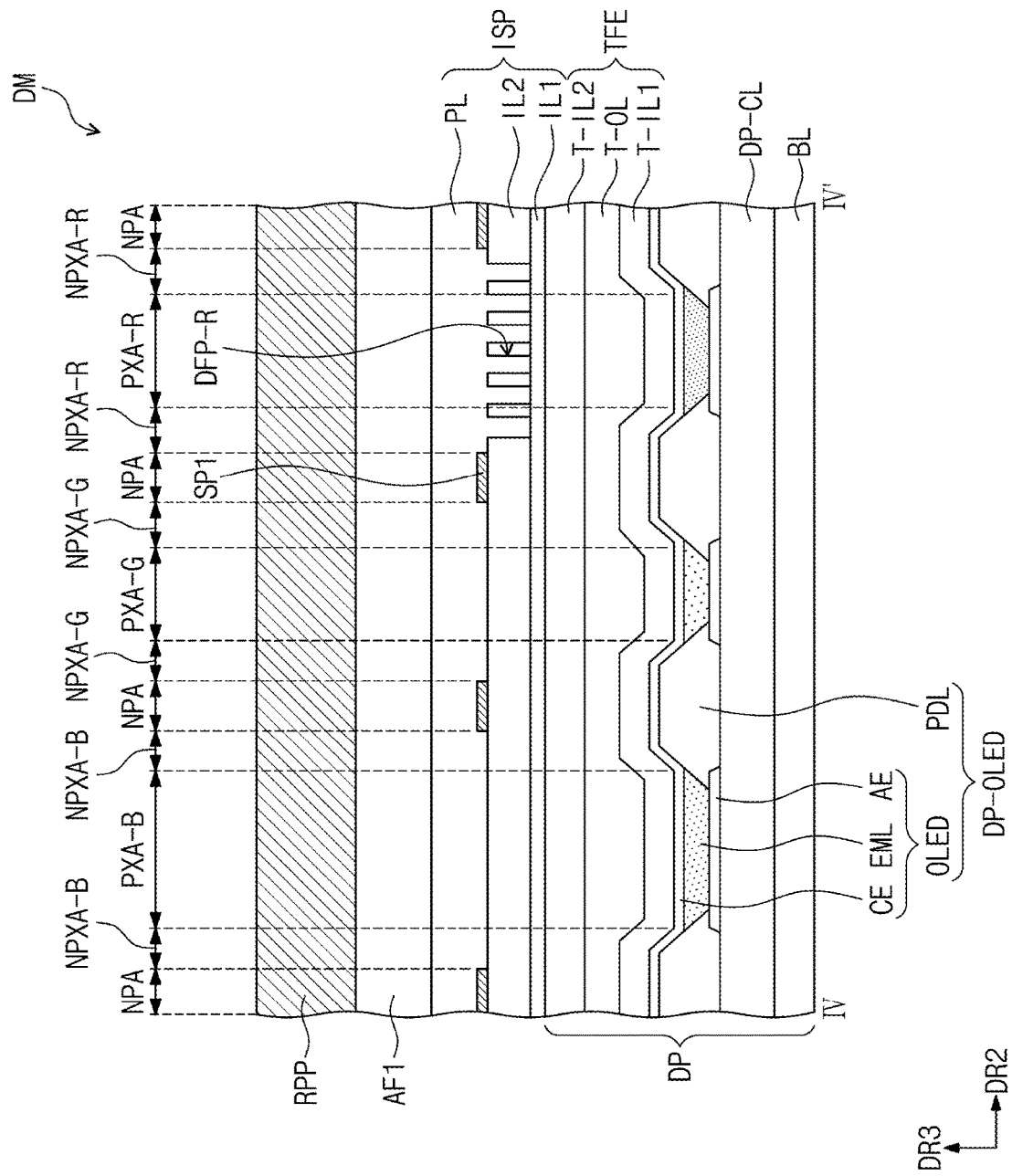
FIGS. 13A, 13B, 13C, 13D, and 13E are sectional views taken along a line IV-IV' of FIG. 12 illustrating exemplary embodiments of the display module of FIG. 1B.

Referring to FIGS. 3, 12, and 13A, the input-sensing unit ISP may include the first insulating layer ILL a first conductive layer thereon, the second insulating layer IL2 covering the first conductive layer, and a second conductive layer disposed on the second insulating layer IL2.

The first conductive layer may be disposed on the first insulating layer IL1. The first conductive layer may include the first connecting portion CP1. The second conductive layer may include the first sensing portion SP1, the second sensing portion SP2, and the second connecting portion CP2.

The second insulating layer IL2 may be disposed between the first conductive layer and the second conductive layer. The second insulating layer IL2 may separate the first conductive layer from the second conductive layer, when viewed in cross section.

The first and second insulating layers IL1 and IL2 may be formed of or include an inorganic material. For example, at least one or both of the first and second insulating layers IL1 and IL2 may include a silicon nitride layer. In an exemplary embodiment, the second insulating layer IL2 may be thicker than the first insulating layer IL1.

The red diffraction patterns DFP-R may be formed in at least one of the first and second insulating layers IL1 and IL2. In an exemplary embodiment, the red diffraction patterns DFP-R may be formed in the second insulating layer IL2, as shown in FIG. 13A, but exemplary embodiments are not limited thereto.

The red diffraction patterns DFP-R may be disposed in the first emission region PXA-R of the first to third emission regions PXA-R, PXA-G, and PXA-B. The red diffraction patterns DFP-R may be arranged at a substantially constant pitch. The red diffraction patterns DFP-R may diffract a portion of light (hereinafter, red light) emitted from the emission layer EML in the first emission region PXA-R. For example, the red diffraction patterns DFP-R may diffract a portion (i.e., a lateral red light) of the red light propagating in a lateral direction.

FIG. 13A illustrates a structure in which the red diffraction patterns DFP-R are provided to correspond to the first pixel PX-R, but exemplary embodiments are not limited thereto. In an exemplary embodiment, the red diffraction patterns DFP-R may be provided to correspond to at least one of the first to third pixels PX-R, PX-G, and PX-B. For example, the red diffraction patterns DFP-R may be provided to correspond to the second or third pixel PX-G or PX-B of the first to third pixels PX-R, PX-G, and PX-B or may be provided to correspond to some (e.g., the first and second pixels PX-R and PX-G, the first and third pixels PX-R and PX-B, or the second and third pixels PX-G and PX-B) of the first to third pixels PX-R, PX-G, and PX-B.

Figure 13B:
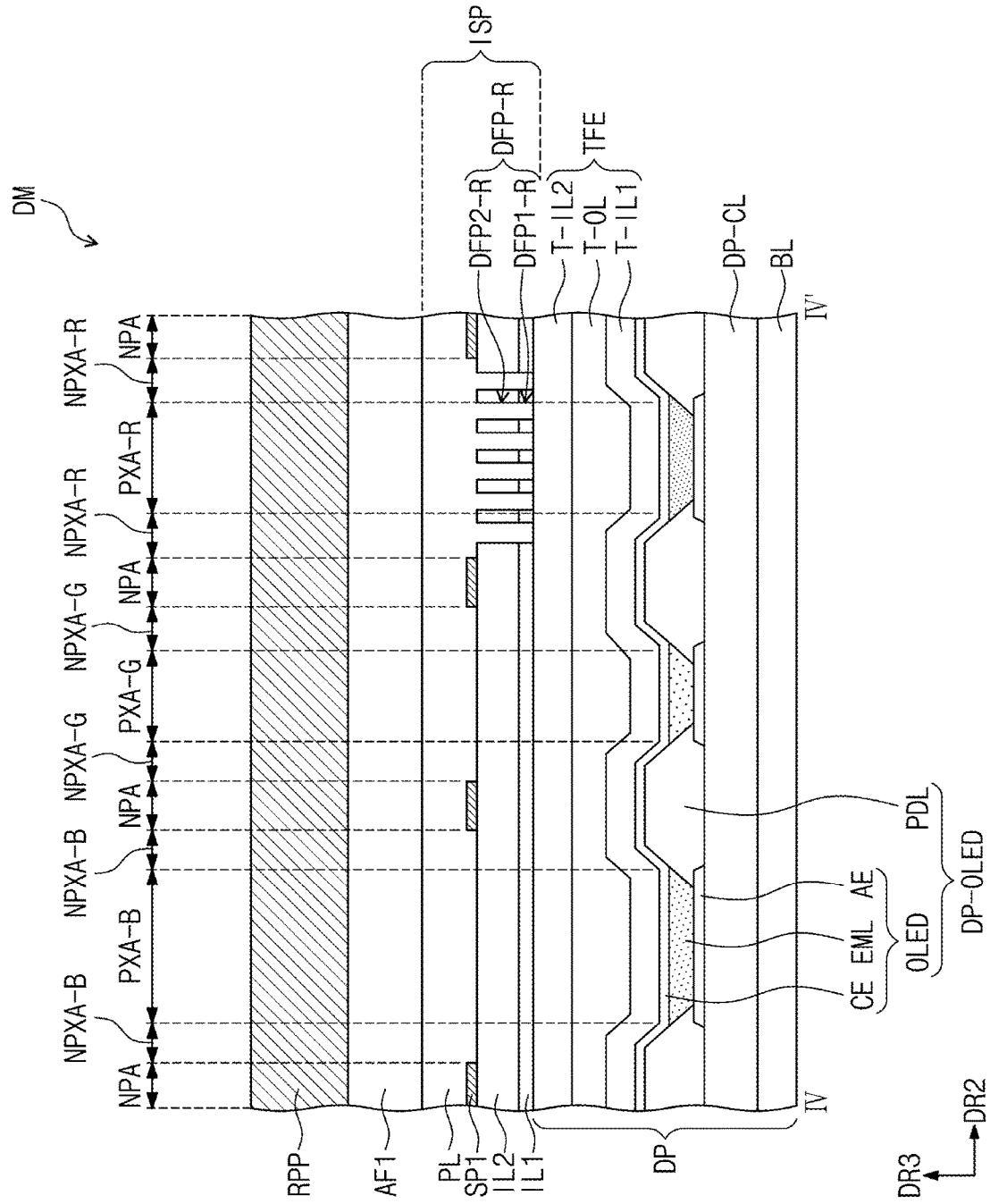

Referring to FIG. 13B, the red diffraction patterns DFP-R may include in the first and second insulating layers IL1 and IL2 to correspond to the first emission region PXA-R. The red diffraction patterns DFP-R may include a plurality of first diffraction patterns DFP1-R, which are formed in the first insulating layer IL1, and a plurality of second diffraction patterns DFP2-R, which are formed in the second insulating layer IL2.

Each of the first diffraction patterns DFP1-R may be a first hole penetrating the first insulating layer ILL and each of the second diffraction patterns DFP2-R may be a second hole penetrating the second insulating layer IL2. For example, the first insulating layer IL1 may include a plurality of first holes penetrating the first insulating layer IL1 in the third direction DR3 to define the first diffraction patterns DFP1-R. The second insulating layer IL2 may include a plurality of second holes penetrating the second insulating layers IL2 in the third direction DR3 to define the second diffraction patterns DFP2-R. The red diffraction patterns DFP-R may include the holes defined by the first and second holes DFP1-R and DFP2-R. The second inorganic encapsulation layer T-IL2, which is the topmost layer of the encapsulation layer TFE, may be partially exposed by the holes DFP-R.

The first and second diffraction patterns DFP1-R and DFP2-R may have a structure substantially similar to one of the diffraction patterns DFP and DFP1-DFP4 shown in FIGS. 6B to 7F. Thus, a detailed description of the structure of each of the first and second diffraction patterns DFP1-R and DFP2-R will be omitted to avoid redundancy.

Figure 13C:
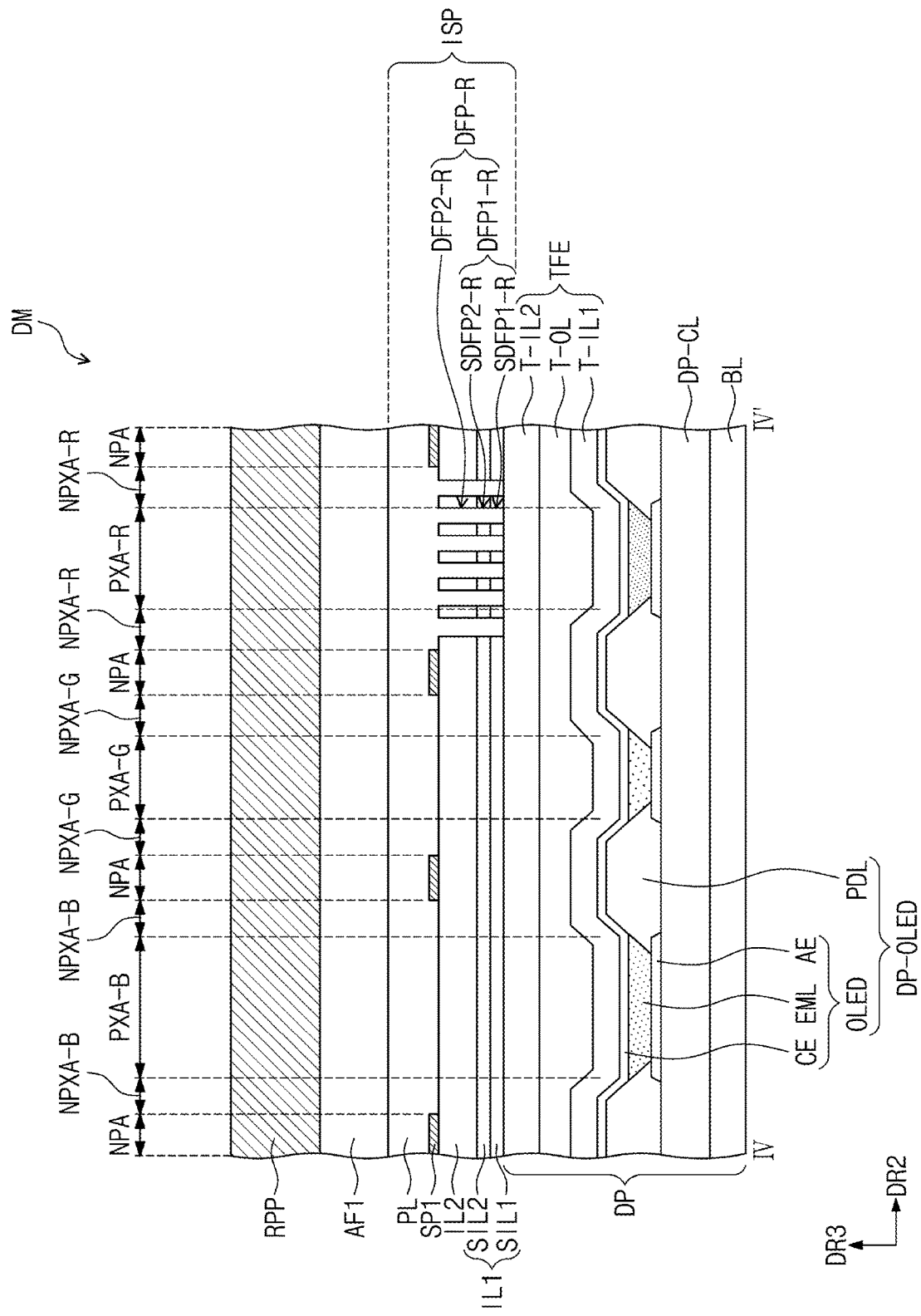

Referring to FIG. 13C, the first insulating layer IL1 may include the first sub-insulating layer SIL1 and the second sub-insulating layer SIL2. The first sub-insulating layer SIL1 may be directly disposed on the encapsulation layer TFE, and the second sub-insulating layer SIL2 may be disposed on the first sub-insulating layer SIL1. The first and second sub-insulating layers SIL1 and SIL2 may be formed of or include an inorganic material. In an exemplary embodiment, the first and second sub-insulating layers SIL1 and SIL2 may be formed of or include the same material. For example, each of the first and second sub-insulating layers SIL1 and SIL2 may include a silicon nitride layer, and the first sub-insulating layer SIL1 and the second sub-insulating layer SIL2 may be formed under different deposition conditions.

The first diffraction patterns DFP1-R, which are provided in the first insulating layer IL1 to correspond to the first emission region PXA-R, may include a plurality of first sub-diffraction patterns SDFP1-R, which are provided in the first sub-insulating layer SIL1, and a plurality of second sub-diffraction patterns SDFP2-R, which are provided in the second sub-insulating layer SIL2. The second sub-diffraction patterns SDFP2-R may be disposed to correspond to the first sub-diffraction patterns SDFP1-R. In addition, the second diffraction patterns DFP2-R may be disposed to correspond to the first and second sub-circuit patterns SDFP1-R and SDFP2-R.

Each of the first sub-diffraction patterns SDFP1-R may be a first sub-hole penetrating the first sub-insulating layer SIL1 and each of the second sub-diffraction patterns SDFP2-R may be a second sub-hole penetrating the second sub-insulating layer SIL2. For example, the first sub-insulating layer SIL1 may include a plurality of first sub-holes penetrating the first sub-insulating layers SIL1 in the third direction DR3 to define the first sub-diffraction pattern SDFP1-R. The second sub-insulating layer SIL2 may include a plurality of second sub-holes penetrating the second sub-insulating layers SIL2 in the third direction DR3 to define the second sub-diffraction pattern SDFP2-R. The red diffraction patterns DFP-R may include the holes defined by the first sub-holes SDFP1-R, the second sub-holes SDFP2-R and the second holes DFP2-R. The second inorganic encapsulation layer T-IL2, which is the topmost layer of the encapsulation layer TFE, may be partially exposed by the holes of the red diffraction patterns DFP-R.

Figure 13D:
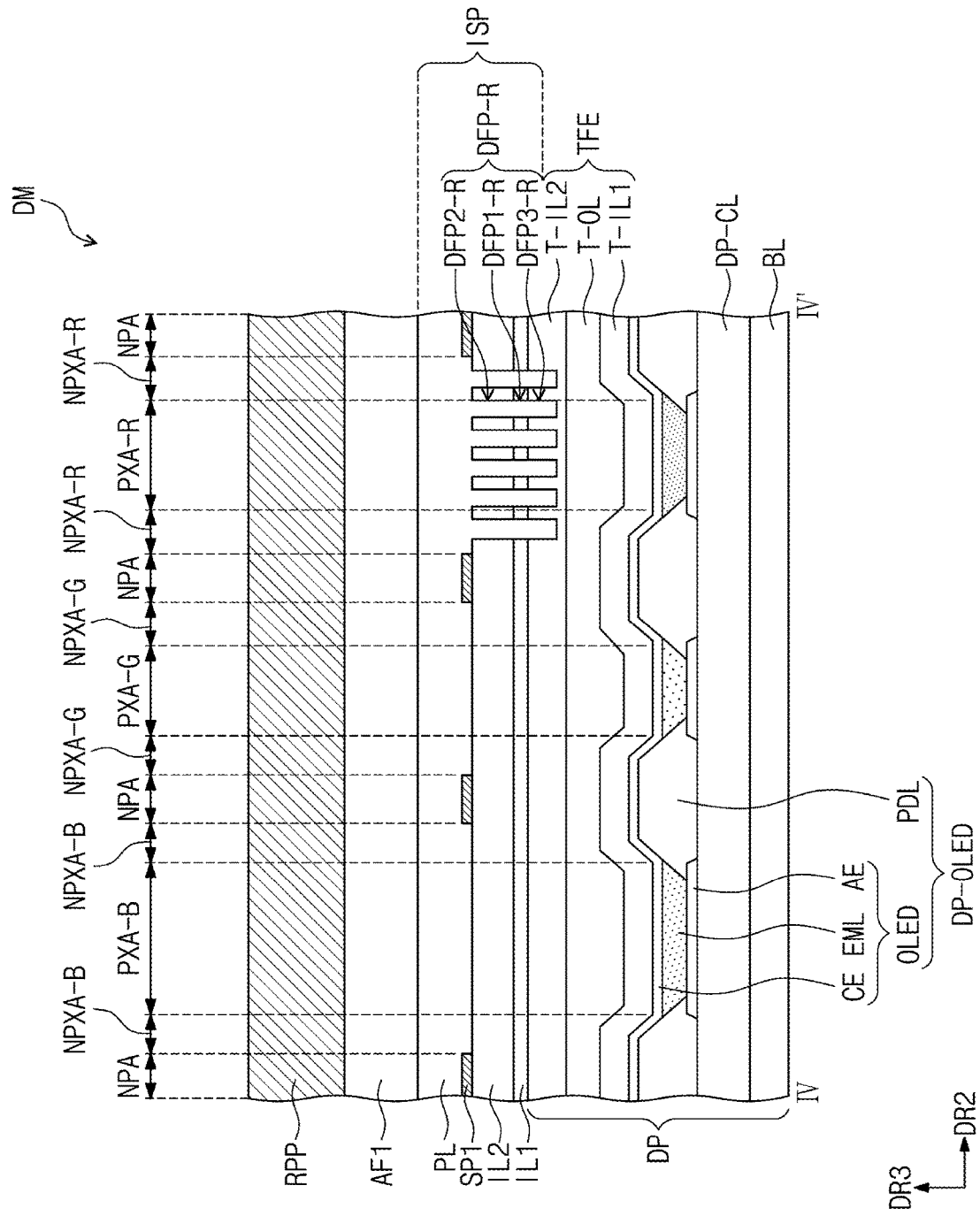

Referring to FIG. 13D, the red diffraction patterns DFP-R may be formed in the first and second insulating layers IL1 and IL2 to correspond to the first emission region PXA-R. For example, the first diffraction patterns DFP1-R may be formed in the first insulating layer ILL and the second diffraction patterns DFP2-R may be formed in the second insulating layer IL2.

In an exemplary embodiment, the encapsulation layer TFE may include third diffraction patterns DFP3-R, which are disposed to correspond to the first and second diffraction patterns DFP1-R and DFP2-R. For example, the third diffraction patterns DFP3-R may be provided in the second inorganic encapsulation layer T-IL2, which is the topmost layer of the encapsulation layer TFE. The third diffraction patterns DFP3-R may be a recessed-shaped structure, which is concavely recessed relative to the top surface of the second inorganic encapsulation layer T-IL2. However, exemplary embodiments are not limited thereto. For example, in an exemplary embodiment, the third diffraction pattern DFP3-R may be a hole-shaped structure penetrating the second inorganic encapsulation layer T-IL2.

As an example, in the case where the first insulating layer IL1 includes the first and second sub-insulating layers SIL1 and SIL2 of FIG. 13C, the first diffraction patterns DFP1-R provided in the first insulating layer IL1 may include the first sub-diffraction patterns SDFP1-R (e.g., see FIG. 13C) provided in the first sub-insulating layer SIL1 and the of second sub-diffraction patterns SDFP2-R (e.g., see FIG. 13C) provided in the second sub-insulating layer SIL2. In this case, the third diffraction patterns DFP3-R of the encapsulation layer TFE may be disposed to correspond to the first and second sub-diffraction patterns SDFP1-R and SDFP2-R.

Figure 13E:
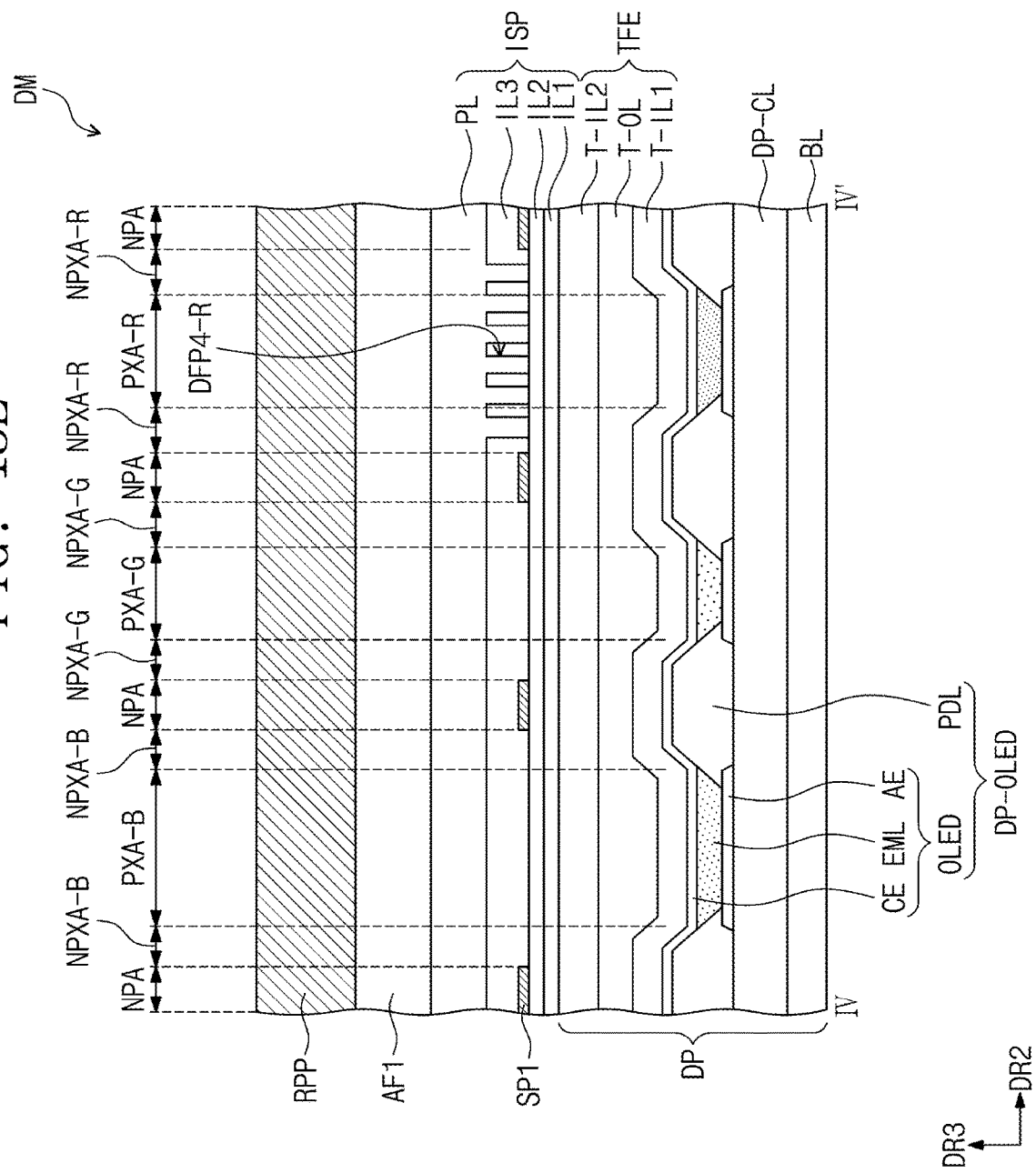

Referring to FIG. 13E, the input-sensing unit ISP may further include the third insulating layer IL3 disposed between the protection layer PL and the second insulating layer IL2. The third insulating layer IL3 may be formed of or include an inorganic material. For example, the third insulating layer IL3 may include a silicon nitride layer. In an exemplary embodiment, the third insulating layer IL3 may be thicker than the first and second insulating layers IL1 and IL2.

In an exemplary embodiment, a plurality of red diffraction patterns DFP4-R may be provided in the third insulating layer IL3 to correspond to the first emission region PXA-R. The red diffraction patterns DFP4-R may have a substantially similar structure as one of the diffraction patterns shown in FIGS. 6B to 7F. The red diffraction patterns DFP4-R may diffract at least a portion of the red light emitted from the emission layer EML of the first pixel PX-R. For example, the red diffraction patterns DFP4-R may diffract at least a portion of the red light propagating toward the input-sensing unit ISP.

In an exemplary embodiment, each of the red diffraction patterns DFP4-R may be a hole penetrating the third insulating layer IL3. For example, the third insulating layer IL3 may include a plurality of third holes penetrating the third insulating layer IL3 in the third direction DR3 and being defined as the red diffraction patterns DFP4-R. The second insulating layer IL2 may be partially exposed by the red diffraction patterns DFP4-R.

The protection layer PL may be disposed on the third insulating layer IL3. A plurality of holes DFP4-R may be filled with the protection layer PL. Thus, the red light emitted from each emission layer EML may be diffracted by a difference in refractive index between the third insulating layer IL3 and the protection layer PL and by the red diffraction patterns DFP4-R.

Figure 14A:
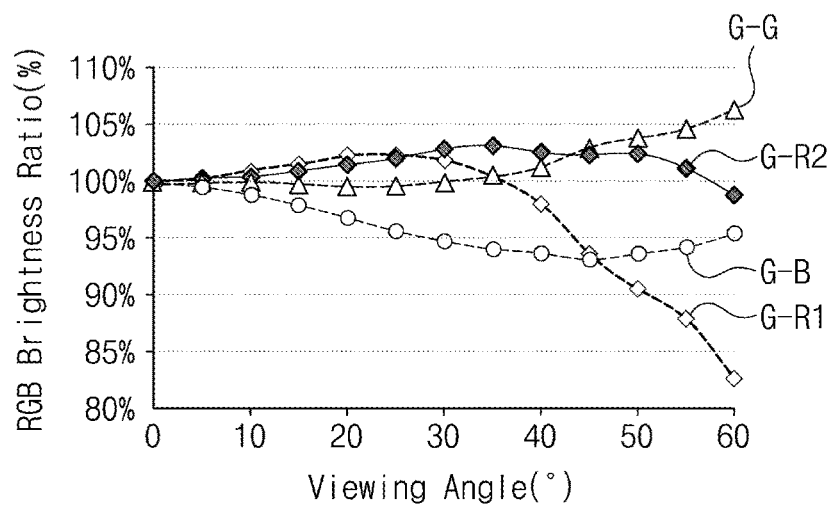
FIG. 14A is a graph showing brightness ratios of red, green, and blue lights versus viewing angle.
Figure 14B:
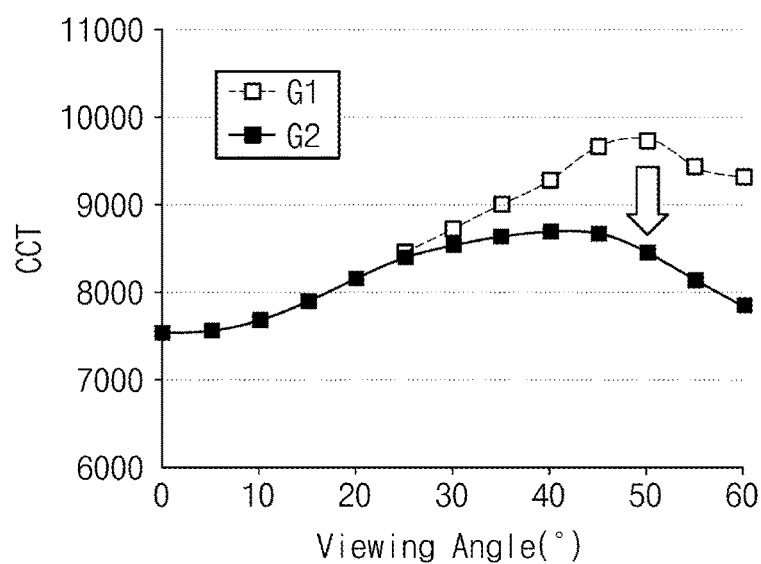
FIG. 14B is a graph showing correlated color temperature (CCT) characteristics versus viewing angle.
Figure 14C:
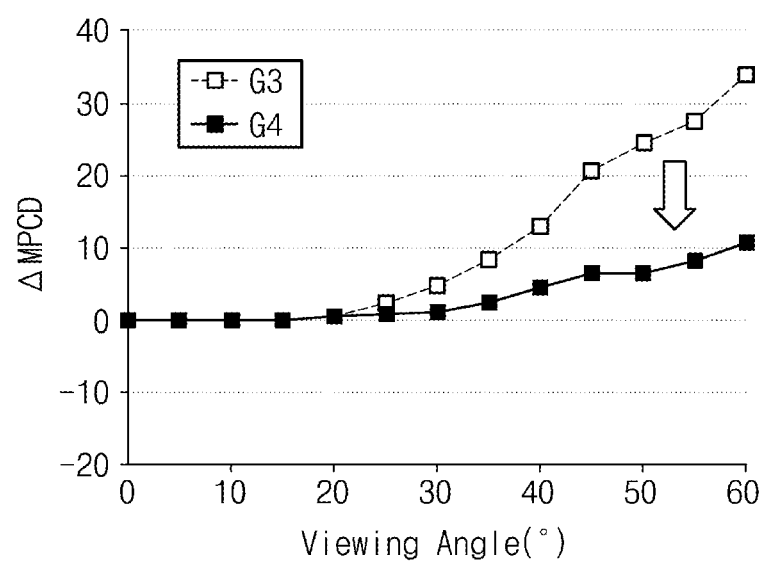
FIG. 14C is a graph showing minimum perceptible color difference (MPCD) characteristics versus viewing angle.

FIG. 14A is a graph showing brightness ratios of red, green, and blue lights versus viewing angle, FIG. 14B is a graph showing correlated color temperature (CCT) characteristics versus viewing angle, and FIG. 14C is a graph showing minimum perceptible color difference (MPCD) characteristics versus viewing angle.

In FIG. 14A, a first R graph G-R1 shows a variation in brightness ratio of red light versus viewing angle in a comparative example, in which the diffraction patterns were not formed in the first to third pixels PX-R, PX-G, and PX-B, and a G graph G-G shows a variation in brightness ratio of green light versus viewing angle in the comparative example, in which the diffraction patterns were not formed in the first to third pixels PX-R, PX-G, and PX-B. A B graph G-B shows a variation in brightness ratio of blue light versus viewing angle in the comparative example, in which the diffraction patterns were not formed in the first to third pixels PX-R, PX-G, and PX-B, and a second R graph G-R2 shows a variation in brightness ratio of red light versus viewing angle in an exemplary embodiment, in which the red diffraction patterns DFP-R were formed to correspond to the first pixel PX-R.

In FIG. 14B, a first graph G1 shows correlated color temperature (CCT) characteristics versus viewing angle in the comparative example, in which the diffraction patterns were not formed in the first to third pixels PX-R, PX-G, and PX-B, and a second graph G2 shows CCT characteristics versus viewing angle in the exemplary embodiment, in which the red diffraction patterns DFP-R were formed to correspond to the first pixel PX-R.

In FIG. 14C, a third graph G3 shows minimum perceptible color difference (MPCD) characteristics versus viewing angle in the comparative example, in which the diffraction patterns were not formed in the first to third pixels PX-R, PX-G, and PX-B, and a fourth graph G4 shows MPCD characteristics versus viewing angle in the exemplary embodiment, in which the red diffraction patterns DFP-R were formed to correspond to the first pixel PX-R.

FIG. 14A shows that, in the comparative example, in which the diffraction patterns were not formed in the first to third pixels PX-R, PX-G, and PX-B, the brightness ratio of the green light was increased but the brightness ratios of the red and blue lights were decreased, when the viewing angle was increased. However, in the case where the red diffraction patterns DFP-R were formed to correspond to the first pixel PX-R, the brightness ratio of the red light was maintained to a substantially constant level, even when the viewing angle was increased. This shows that, in the case where the red light emitted from the first pixel PX-R is diffracted by the red diffraction patterns DFP-R, it is possible to reduce a brightness ratio of the red light in a lateral direction. Furthermore, this result shows that it is possible to increase the viewing angle and to improve a greenish phenomenon, in which green light is more distinctly recognized.

By contrast, in the case where the red diffraction patterns DFP-R were formed to correspond to the first pixel PX-R, a variation of the CCT characteristics caused by a variation of the viewing angle was reduced, compared with the comparative example, as shown in FIGS. 14B and 14C. Furthermore, in the case where the red diffraction patterns DFP-R were formed to correspond to the first pixel PX-R, even when the viewing angle was increased, a rate of the increase of the MPCD characteristics was reduced, compared with the comparative example.

In the case where, as described above, the diffraction patterns DFP-R are provided in a specific pixel PX-R, it may be possible to improve a phenomenon, in which light of a specific color is more distinctly recognized, and consequently to improve the overall viewing angle characteristic.

Figure 15:
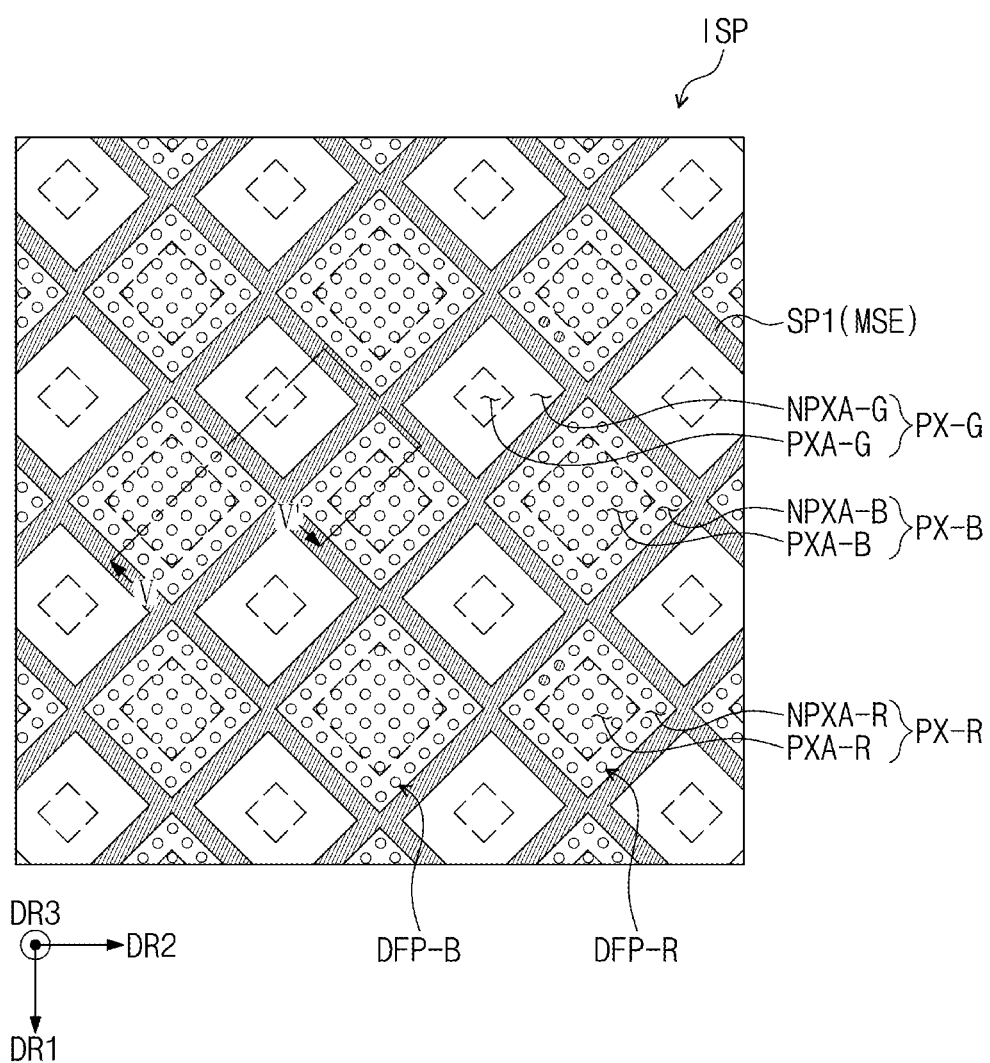
FIG. 15 is an enlarged plan view illustrating the region 'FF' of FIG. 3 illustrating another exemplary embodiment of the input-sensing unit of FIG. 3.

FIG. 15 is an enlarged plan view illustrating the region 'FF' of FIG. 3 illustrating another exemplary embodiment of the input-sensing unit of FIG. 3, and FIGS. 16A to 16C are sectional views taken along a line V-V of FIG. 15 illustrating the display module of FIG. 1B.

Referring to FIG. 15, the input-sensing unit ISP may include a plurality of diffraction patterns DFP-R and DFP-B, which are arranged at a substantially constant pitch and diffract at least a portion of light incident into the input-sensing unit ISP. The diffraction patterns DFP-R and DFP-B may be disposed to correspond to at least one (e.g., two pixels) of the pixels PX-R, PX-G, and PX-B. In an exemplary embodiment, the diffraction patterns DFP-R and DFP-B may include a plurality of red diffraction patterns DFP-R and a plurality of blue diffraction patterns DFP-B. The red diffraction patterns DFP-R may be disposed to correspond to the first pixel PX-R of the first to third pixels PX-R, PX-G, and PX-B, and the blue diffraction patterns DFP-B may be disposed to correspond to the third pixel PX-B of the first to third pixels PX-R, PX-G, and PX-B. In an exemplary embodiment, the diffraction patterns may include green diffraction patterns, which are disposed to correspond to the second pixel PX-G, and the blue diffraction patterns DFP-B, which are disposed to correspond to the third pixel PX-B.

The red diffraction patterns DFP-R may diffract a portion of the red light incident into the input-sensing unit ISP, and the blue diffraction patterns DFP-B may diffract a portion of the blue light incident into the input-sensing unit ISP.

The red and blue diffraction patterns DFP-R and DFP-B may be respectively overlapped with the first and third emission regions PXA-R and PXA-B of the first to third emission regions PXA-R, PXA-G, and PXA-B. The red diffraction patterns DFP-R may also be overlapped with the first non-emission region NPXA-R adjacent to the first emission region PXA-R, and the blue diffraction patterns DFP-B may also be overlapped with the third non-emission region NPXA-B adjacent to the third emission region PXA-B.

The red and blue diffraction patterns DFP-R and DFP-B may not be overlapped with the non-pixel region NPA. In other words, the diffraction patterns DFP-R and DFP-B may be provided in such a way that they are not overlapped with the mesh electrode MSE.

In an exemplary embodiment, the red and blue diffraction patterns DFP-R and DFP-B may have a generally circular shape, when viewed in plan. However, exemplary embodiments are not limited to a specific shape of the red and blue diffraction patterns DFP-R and DFP-B. In an exemplary embodiment, the red and blue diffraction patterns DFP-R and DFP-B may have the same shape, when viewed in plan. However, exemplary embodiments are not limited thereto. For example, the red and blue diffraction patterns DFP-R and DFP-B may have different shapes from each other, when viewed in plan.

Figure 16A:
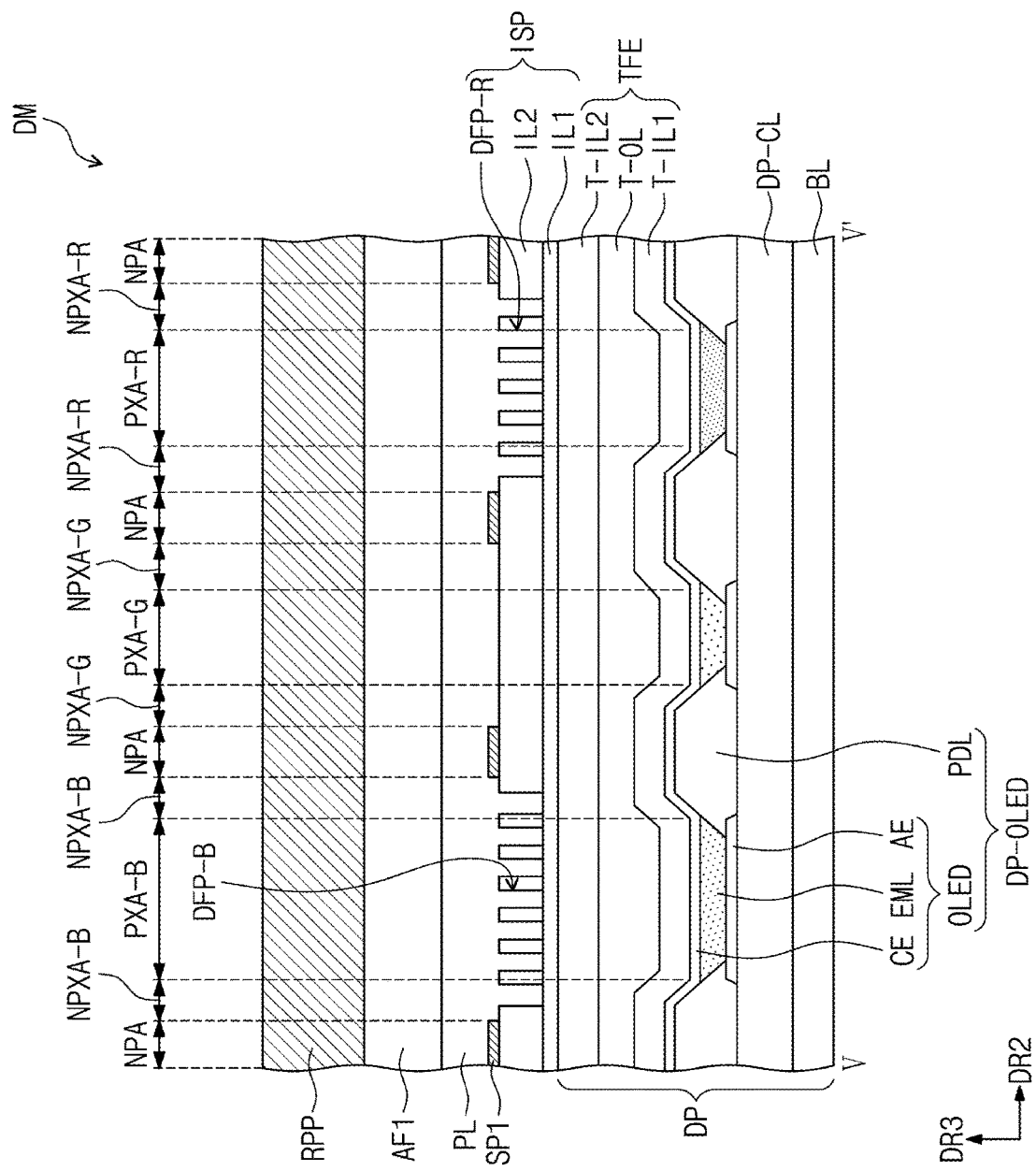
FIGS. 16A, 16B, and 16C are sectional views taken along a line V-V of FIG. 15 illustrating exemplary embodiments of the display module of FIG. 1B.

Referring to FIGS. 3, 15, and 16A, the input-sensing unit ISP may include the first insulating layer ILL a first conductive layer thereon, the second insulating layer IL2 covering the first conductive layer, and a second conductive layer disposed on the second insulating layer IL2.

The red diffraction patterns DFP-R and the blue diffraction patterns DFP-B may be formed in at least one of the first and second insulating layers IL1 and IL2. FIG. 16A illustrates the red and blue diffraction patterns DFP-R and DFP-B formed in the second insulating layer IL2, but exemplary embodiments are not limited thereto.

The red diffraction patterns DFP-R may be disposed in the first emission region PXA-R of the first to third emission regions PXA-R, PXA-G, and PXA-B, and the blue diffraction patterns DFP-B may be disposed in the third emission region PXA-B. The red diffraction patterns DFP-R and the blue diffraction patterns DFP-B may be arranged at substantially constant pitches. The red diffraction patterns DFP-R may diffract at least a portion of light (hereinafter, red light) emitted from the emission layer EML in the first emission region PXA-R. For example, the red diffraction patterns DFP-R may diffract at least a portion of the red light propagating toward the input-sensing unit ISP. The blue diffraction patterns DFP-B may diffract at least a portion of light (hereinafter, blue light) emitted from the emission layer EML in the third emission region PXA-B. For example, the blue diffraction patterns DFP-B may diffract at least a portion of the blue light propagating toward the input-sensing unit ISP.

Figure 16B:
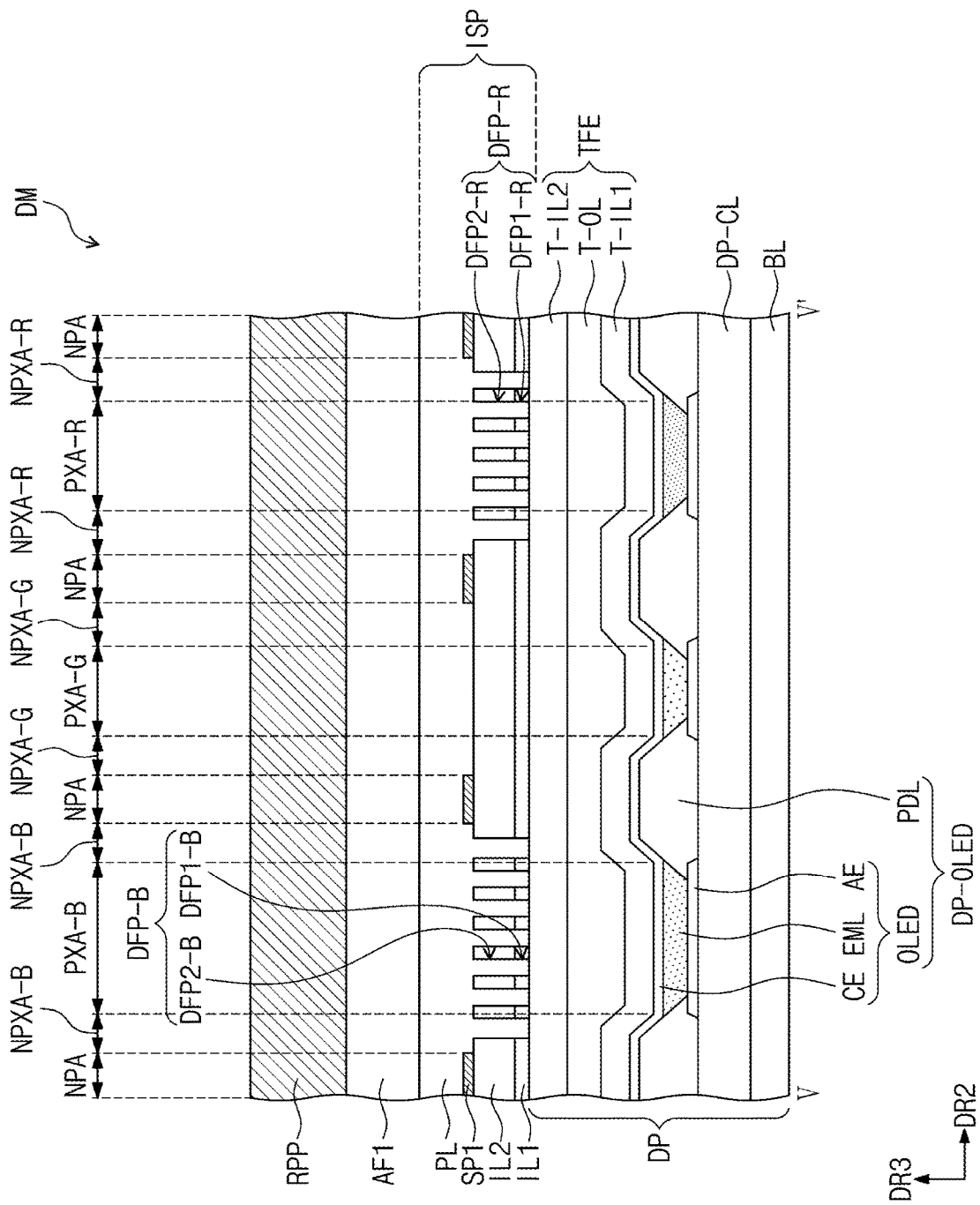

Referring to FIG. 16B, the red diffraction patterns DFP-R may be formed in the first and second insulating layers IL1 and IL2 to correspond to the first emission region PXA-R, and the blue diffraction patterns DFP-B may be formed in the first and second insulating layers IL1 and IL2 to correspond to the third emission region PXA-B. The red diffraction patterns DFP-R may include a plurality of first red diffraction patterns DFP1-R, which are formed in the first insulating layer ILL and a plurality of second red diffraction patterns DFP2-R, which are formed in the second insulating layer IL2. In particular, the second red diffraction patterns DFP2-R may be disposed to correspond to the first red diffraction patterns DFP1-R. For example, the second red diffraction patterns DFP2-R may be disposed on the first red diffraction patterns DFP1-R. The blue diffraction patterns DFP-B may include a plurality of first blue diffraction patterns DFP1-B, which are formed in the first insulating layer ILL and a plurality of second blue diffraction patterns DFP2-B, which are formed in the second insulating layer IL2. In particular, the second blue diffraction patterns DFP2-B may be disposed to correspond to the first blue diffraction patterns DFP1-B. In other words, the second blue diffraction patterns DFP2-B may be disposed on the first blue diffraction patterns DFP1-B.

Each of the first red diffraction patterns DFP1-R and the first blue diffraction patterns DFP1-B may be a hole-shaped structure penetrating the first insulating layer IL1, and each of the second red diffraction patterns DFP2-R and the second blue diffraction patterns DFP2-B may be a hole-shaped structure penetrating the second insulating layer IL2. For example, the first insulating layer IL1 may include a plurality of first red holes and a plurality of first blue holes, which are formed to penetrate the first insulating layer IL1 in the third direction DR3. The plurality of first red holes may be defined as the first red diffraction patterns DFP1-R and the plurality of first blue holes may be defined as the first blue diffraction patterns DFP1-B. The second insulating layer IL2 may include a plurality of second red holes and a plurality of second blue holes, which are formed to penetrate the second insulating layer IL2 in the third direction DR3. The plurality of second red holes may be defined as the second red diffraction patterns DFP2-R and the plurality of second blue holes may be defined as the second blue diffraction patterns DFP2-B. The red diffraction patterns DFP-R may include the first holes defined by the first red-holes DFP1-R and the second red-holes DFP2-R and the blue diffraction patterns DFP-B may include the second holes defined by the first blue-holes DFP1-B and the second blue-holes DFP2-B. The second inorganic encapsulation layer T-IL2, which is the topmost layer of the encapsulation layer TFE, may be partially exposed by the first and second holes DFP-R and DFP-B.

The red and blue diffraction patterns DFP-R and DFP-B may have a substantially similar structure as one of the diffraction patterns DFP and DFP1-DFP4 shown in FIGS. 6B to 7F. Thus, a detailed description of the structure of each of the red and blue diffraction patterns DFP-R and DFP-B will be omitted to avoid redundancy.

In an exemplary embodiment, the first insulating layer IL1 may include the first sub-insulating layer SIL1 and the second sub-insulating layer SIL2, shown in FIG. 13C. In this case, the first red diffraction patterns DFP1-R may include first sub-red diffraction patterns provided in the first sub-insulating layer SIL1 and second sub-red diffraction patterns provided in the second sub-insulating layer SIL2. In addition, the first blue diffraction patterns DFP1-B may include first sub-blue diffraction patterns, which are provided in the first sub-insulating layer SIL1 and second sub-blue diffraction patterns, which are provided in the second sub-insulating layer SIL2.

In addition, third red diffraction patterns corresponding to the first red diffraction patterns DFP1-R and third blue diffraction patterns corresponding to the first blue diffraction patterns DFP1-B may be provided in the encapsulation layer TFE. In the case where the first insulating layer IL1 includes the first sub-insulating layer SIL1 and the second sub-insulating layer SIL2, the first sub-red diffraction patterns and the second sub-red diffraction patterns may be disposed to correspond to the third red diffraction patterns provided in the encapsulation layer TFE. Also, in the case where the first insulating layer IL1 includes the first sub-insulating layer SIL1 and the second sub-insulating layer SIL2, the first sub-blue diffraction patterns and the second sub-blue diffraction patterns may be disposed to correspond to the third blue diffraction patterns provided in the encapsulation layer TFE.

Figure 16C:
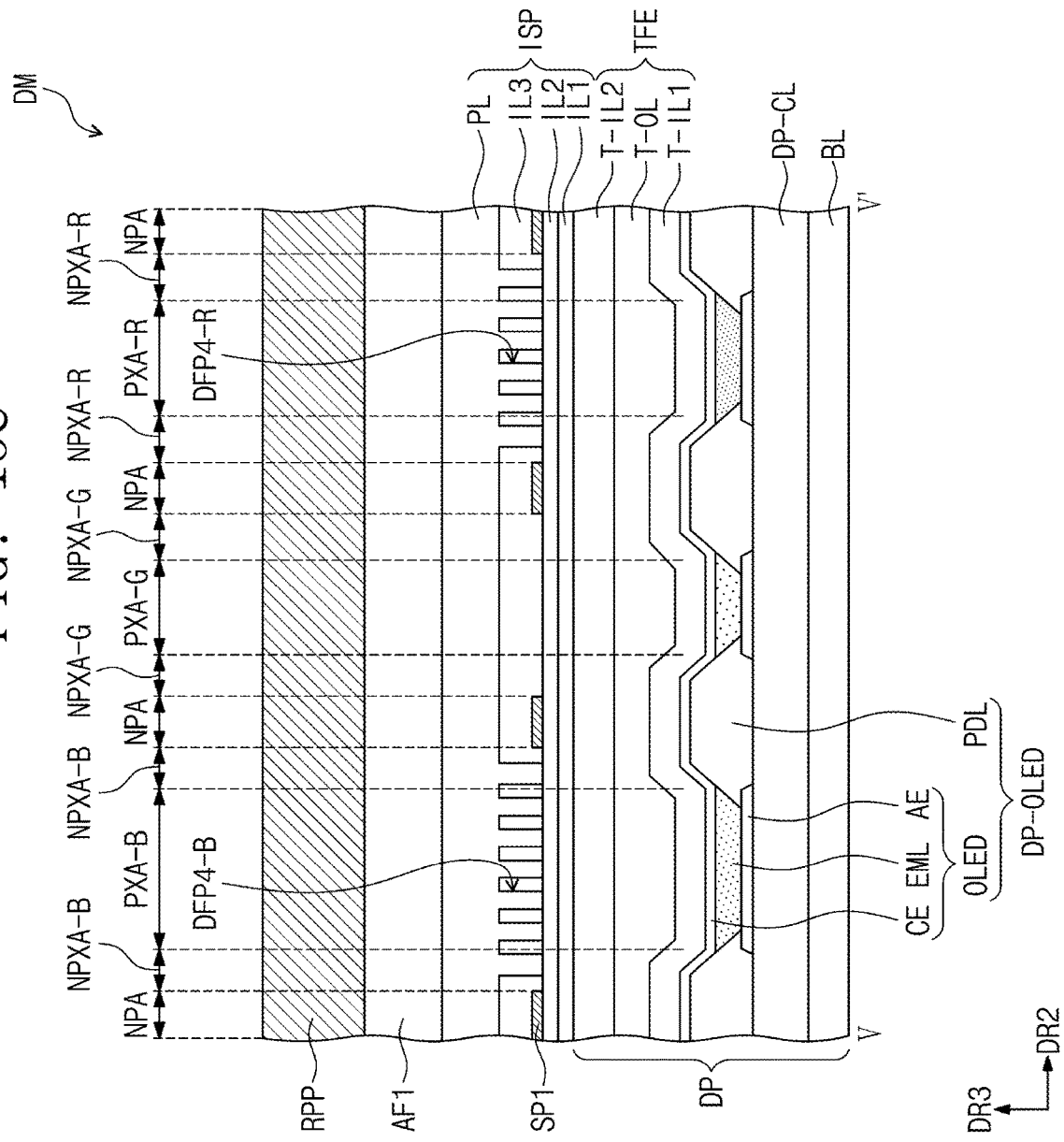

Referring to FIG. 16C, the input-sensing unit ISP may further include the third insulating layer IL3 disposed between the protection layer PL and the second insulating layer IL2.

In an exemplary embodiment, a plurality of red diffraction patterns DFP4-R may be provided in the third insulating layer IL3 to correspond to the first emission region PXA-R, and a plurality of blue diffraction patterns DFP4-B may be provided in the third insulating layer IL3 to correspond to the third emission region PXA-B. Each of the red and blue diffraction patterns DFP-R and DFP-B may have a substantially similar structure as one of the diffraction patterns shown in FIGS. 6B to 7F. The red diffraction patterns DFP4-R may diffract at least a portion of red light emitted from the emission layer EML of the first pixel PX-R, and the blue diffraction patterns DFP4-B may diffract at least a portion of blue light emitted from the emission layer EML of the third pixel PX-B.

In an exemplary embodiment, each of the red and blue diffraction patterns DFP4-R and DFP4-B may be a hole-shaped structure penetrating the third insulating layer IL3. Thus, the second insulating layer IL2 may be partially exposed by the red and blue diffraction patterns DFP4-R and DFP4-B.

The protection layer PL may be disposed on the third insulating layer IL3. The red and blue diffraction patterns DFP4-R and DFP4-B may be filled with the protection layer PL. Thus, red and blue lights emitted from each emission layer EML may be diffracted due to the difference in refractive index between the third insulating layer IL3 and the protection layer PL.

Figure 17A:
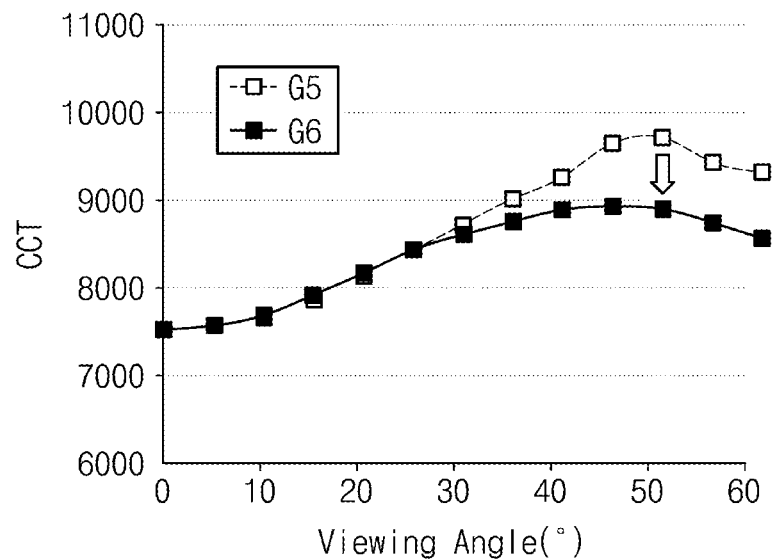
FIG. 17A is a graph showing correlated color temperature (CCT) characteristics versus viewing angle.
Figure 17B:
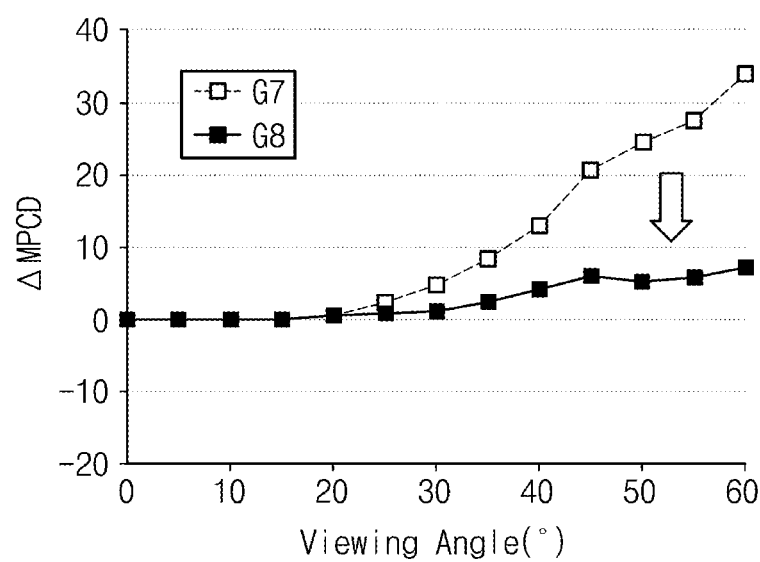
FIG. 17B is a graph showing minimum perceptible color difference (MPCD) characteristics versus viewing angle.

FIG. 17A is a graph showing correlated color temperature (CCT) characteristics versus viewing angle, and FIG. 17B is a graph showing minimum perceptible color difference (MPCD) characteristics versus viewing angle.

In FIG. 17A, a fifth graph G5 shows CCT characteristics versus viewing angle in the comparative example, in which the diffraction patterns were not formed in the first to third pixels PX-R, PX-G, and PX-B, and a sixth graph G6 shows CCT characteristics versus viewing angle in the exemplary embodiment, in which the red and blue diffraction patterns DFP-R and DFP-B were formed to correspond to each of the first and third pixels PX-R and PX-B.

In FIG. 17B, a seventh graph G7 shows MPCD characteristics versus viewing angle in the comparative example, in which the diffraction patterns were not formed in the first to third pixels PX-R, PX-G, and PX-B, and an eighth graph G8 shows MPCD characteristics versus viewing angle in the exemplary embodiment, in which the red and blue diffraction patterns DFP-R and DFP-B were formed to correspond to the first and third pixels PX-R and PX-B.

In the case where the red and blue diffraction patterns DFP-R and DFP-B were respectively formed to correspond to the first and third pixels PX-R and PX-B, the variation of the CCT characteristics caused by the variation of the viewing angle was reduced, compared with the comparative example, as shown in FIGS. 17A and 17B. Furthermore, in the case where the red and blue diffraction patterns DFP-R and DFP-B were formed to correspond to the first and third pixels PX-R and PX-B, even when the viewing angle was increased, the rate of the increase of the MPCD characteristics was reduced, compared with the comparative example.

In the case where, as described above, the diffraction patterns DFP-R and DFP-B are provided in specific pixels PX-R and PX-B, it may be possible to improve the phenomenon, in which light of a specific color is more distinctly recognized, and consequently to improve the overall viewing angle characteristic.

Figure 18:
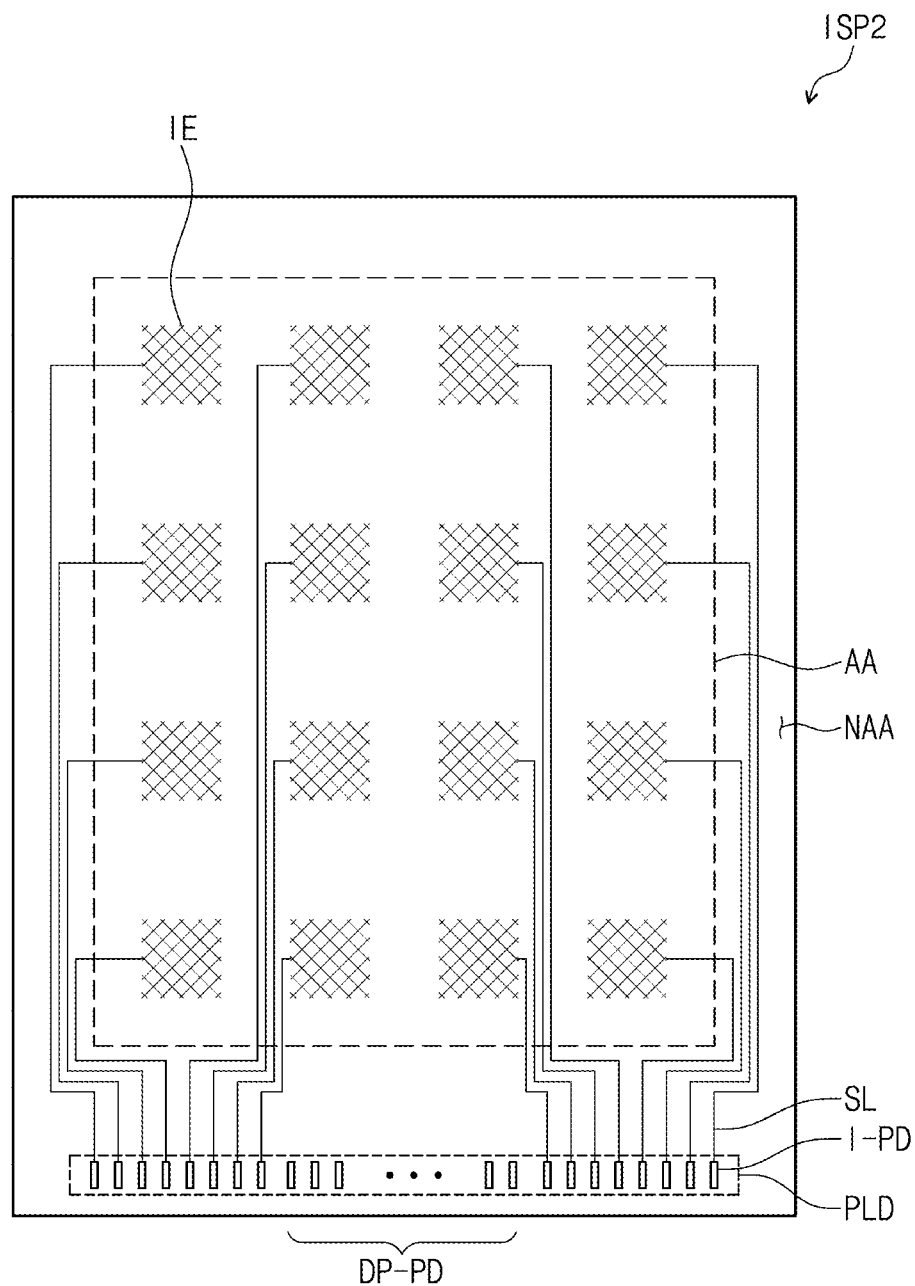
FIG. 18 is a plan view of another exemplary embodiment of the input-sensing unit of the display device FIG. 1B.
Figure 19:
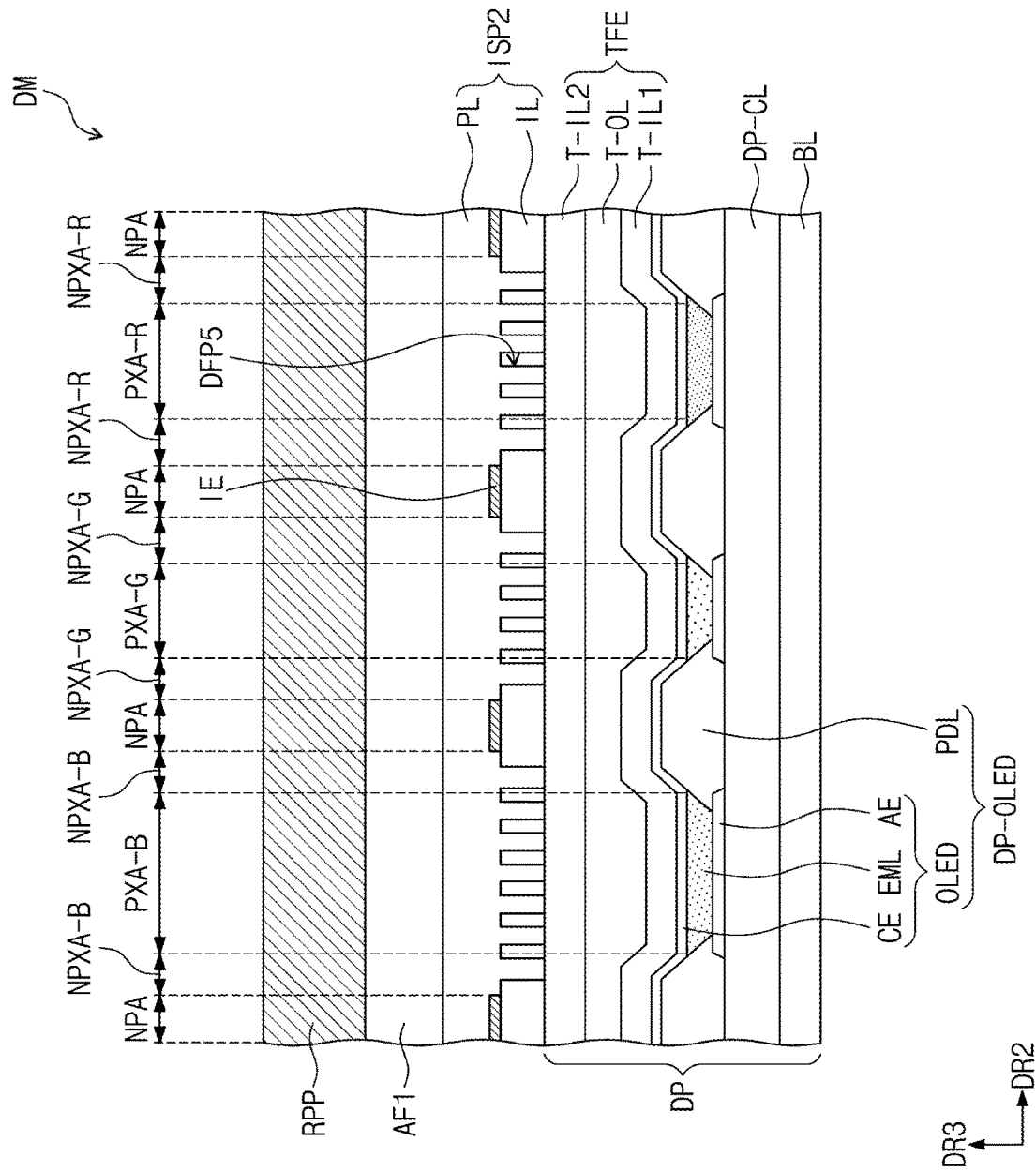
FIG. 19 is a sectional view of another exemplary embodiment of the display module of FIG. 1B.

FIG. 18 is a plan view of another exemplary embodiment of the input-sensing unit of the display device FIG. 1B, and FIG. 19 is a sectional view of another exemplary embodiment of the display module of FIG. 1B.

Referring to FIG. 18, an input-sensing unit ISP2 may include a plurality of sensing electrodes IE and a plurality of signal lines SL. The sensing electrodes IE may have specific coordinate information. For example, the sensing electrodes IE may be arranged in a matrix shape and may be connected to the signal lines SL, respectively. The sensing electrodes IE and the signal lines SL may be disposed in the active region AA. Each of the signal lines SL may include a portion, which is disposed in the active region, and another portion, which is disposed in the peripheral region NAA. In the illustrated exemplary embodiment, an input-sensing unit ISU may be configured to obtain information of coordinates of an external input in a self-capacitance manner.

The input-sensing unit ISP2 may extend from ends of the signal lines SL and may include the input pads I-PD, which are disposed in the peripheral region NAA. The pad portion PLD of the input-sensing unit ISP according to the illustrated embodiment may have a structure substantially similar to the pad portion PLD of the input-sensing unit ISP shown in FIG. 3.

In the illustrated exemplary embodiment, each of the sensing electrodes IE may have a mesh shape.

As shown in FIG. 19, the input-sensing unit ISP2 may include an insulating layer IL, a conductive layer disposed on the insulating layer IL, and the protection layer PL covering the conductive layer. The insulating layer IL may be formed of or include an inorganic material. For example, the insulating layer IL may include a silicon nitride layer. The conductive layer may be disposed on the insulating layer IL. The conductive layer may include the sensing electrodes IE.

A plurality of diffraction patterns DFP5 may be formed in the insulating layer IL. The diffraction patterns DFP5 may be arranged at a substantially constant pitch and may diffract at least a portion of light emitted from the emission layer EML. For example, the diffraction patterns DFP5 may diffract at least a portion of light propagating toward the input-sensing unit ISP2. Each of the diffraction patterns DFP5 may be a hole-shaped structure penetrating the insulating layer IL. Thus, the top surface of the encapsulation layer TFE may be partially exposed by the diffraction patterns DFP5.

The diffraction patterns DFP5 may be overlapped with the emission regions PXA-G, PXA-R, and PXA-B. The diffraction patterns DFP5 may be partially overlapped with the non-emission regions NPXA-G, NPXA-R, and NPXA-B.

The diffraction patterns DFP5 may not be overlapped with the non-pixel region NPA. The sensing electrodes IE may be disposed to correspond to the non-pixel region NPA. Thus, the diffraction patterns DFP5 may be provided in such a way that they are not overlapped with the sensing electrodes IE.

The protection layer PL may cover the top surface of the encapsulation layer TFE exposed by the diffraction patterns DFP5. For example, the protection layer PL may be formed to fill a plurality of holes of the diffraction patterns DFP5.

The protection layer PL may be formed of or include an organic material. The protection layer PL may be formed of or include an acrylic resin. The protection layer PL may be thicker than the insulating layer IL. In addition, the protection layer PL may have a refractive index different from the insulating layer IL. For example, the protection layer PL may have a refractive index of about 1.6, and the insulating layer IL may have a refractive index of about 1.9.

FIG. 19 illustrates a structure, in the diffraction patterns DFP5 are disposed to correspond to each of the first to third emission regions PXA-R, PXA-G, and PXA-B. However, exemplary embodiments are not limited thereto. For example, the diffraction patterns DFP5 may be disposed to correspond to some emission regions (e.g., the first emission region PXA-R or the first and third emission regions PXA-R and PXA-B) of the first to third emission regions PXA-R, PXA-G, and PXA-B.

Figure 20:
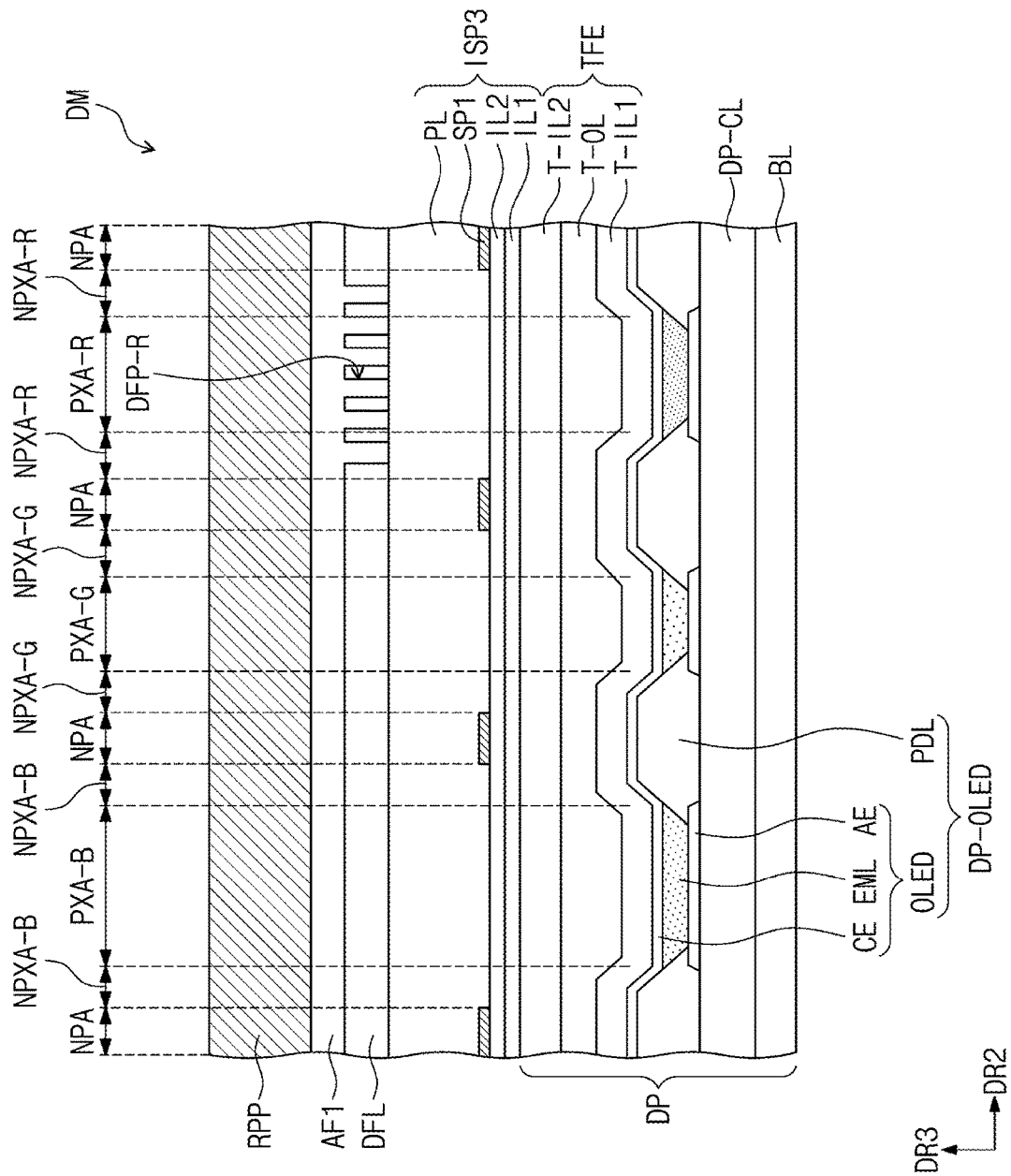
FIG. 20 is a sectional view of another exemplary embodiment of the display module of FIG. 1B.
Figure 21:
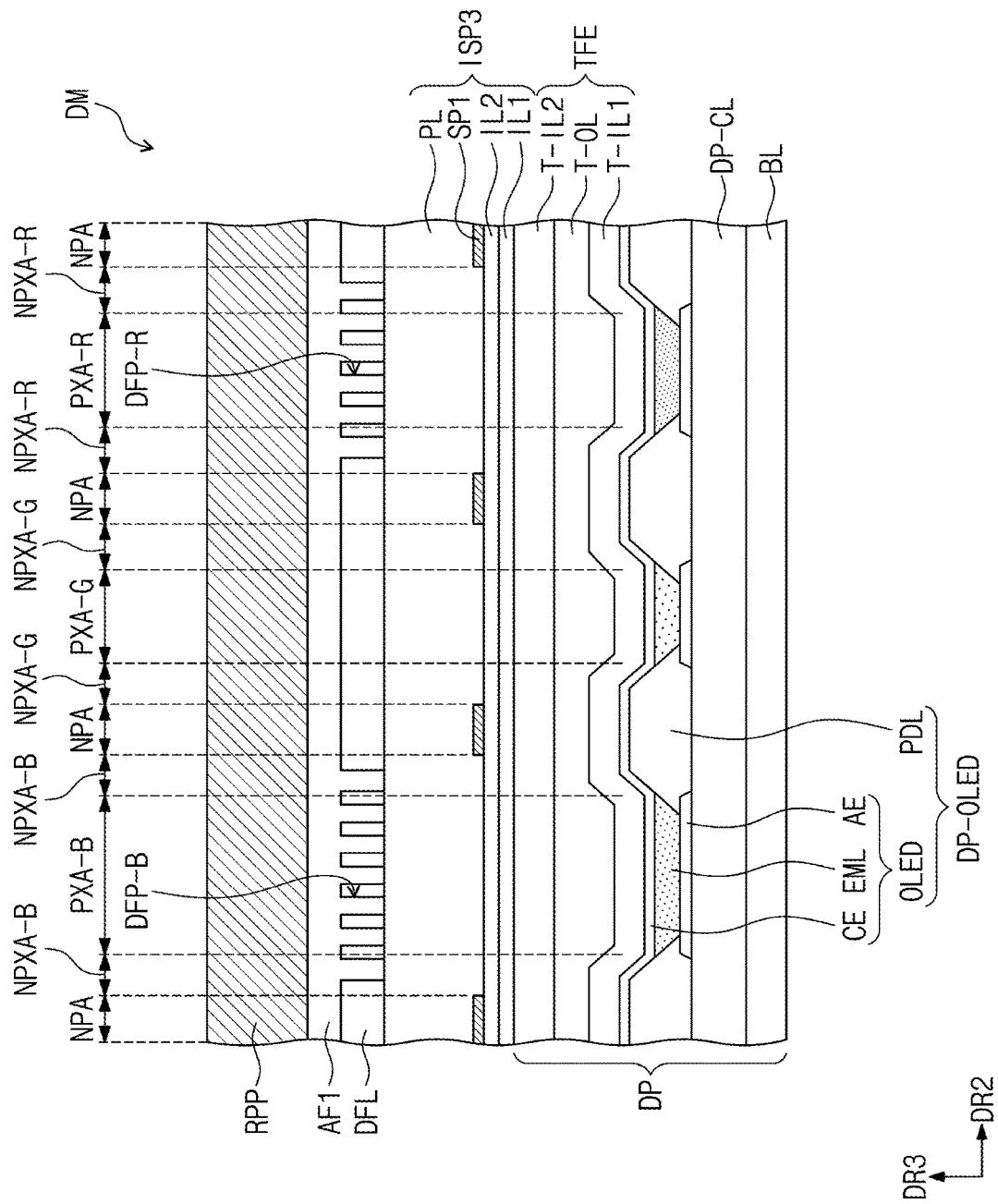
FIG. 21 is a sectional view of another exemplary embodiment of the display module of FIG. 1B.
Figure 22:
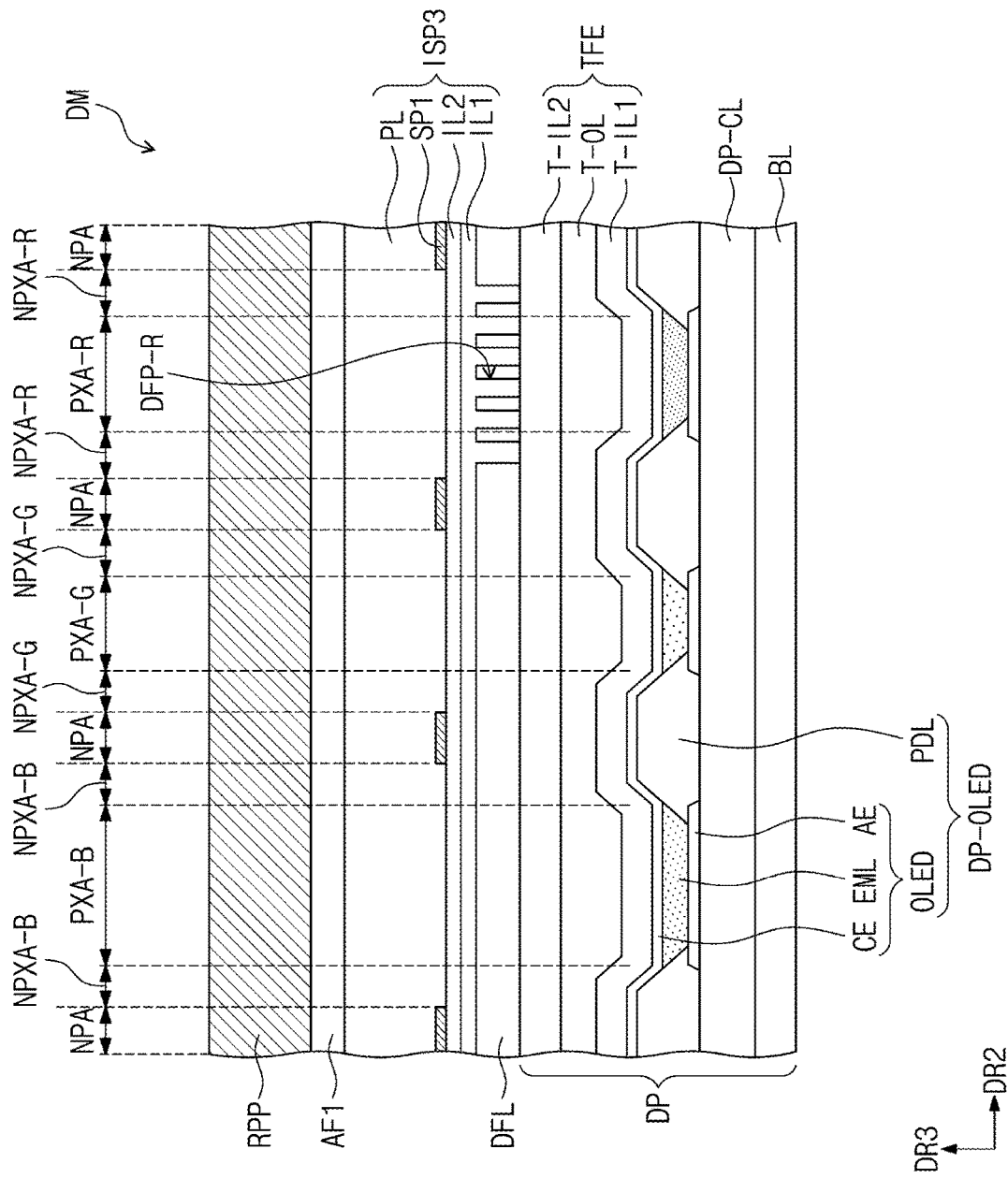
FIG. 22 is a sectional view of another exemplary embodiment of the display module of FIG. 1B.
Figure 23:
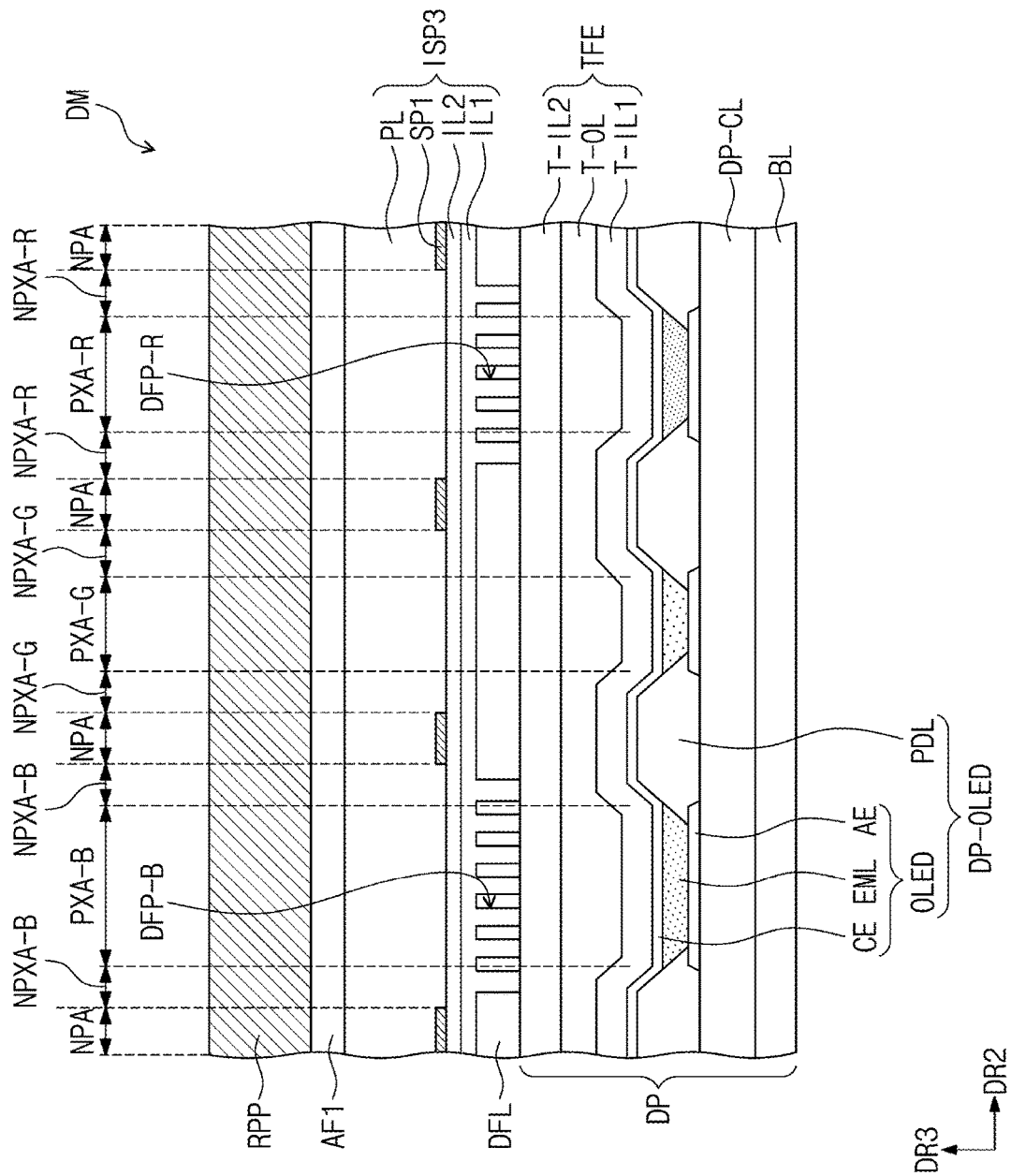
FIG. 23 is a sectional view of another exemplary embodiment of the display module of FIG. 1B.

FIG. 20 is a sectional view of another exemplary embodiment of the display module of FIG. 1B, and FIG. 21 is a sectional view of another exemplary embodiment of the display module of FIG. 1B. FIG. 22 is a sectional view of another exemplary embodiment of the display module of FIG. 1B, and FIG. 23 is a sectional view of another exemplary embodiment of the display module of FIG. 1B.

Referring to FIG. 20, the display module DM may include a diffraction pattern layer DFL, which is configured to diffract at least a portion of light emitted from the display panel DP. The diffraction pattern layer DFL may be formed of or include one of inorganic and organic materials.

The diffraction pattern layer DFL may include the diffraction patterns DFP-R that are arranged at a substantially constant pitch. In an exemplary embodiment, the diffraction pattern layer DFL may be directly disposed on the input-sensing unit ISP. For example, the diffraction pattern layer DFL may be disposed on the protection layer PL of the input-sensing unit ISP.

The diffraction patterns DFP-R may include the red diffraction patterns DFP-R, which are disposed to correspond to at least one (e.g., the first pixel PX-R) of the first to third pixels PX-R, PX-G, and PX-B.

Each of the red diffraction patterns DFP-R may be a hole penetrating the diffraction pattern layer DFL. For example, the diffraction pattern layer DFL may include the holes, which penetrate the diffraction pattern layer DFL and serve as the red diffraction patterns DFP-R. The protection layer PL, which is the topmost layer of the input-sensing unit ISP, may be partially exposed by the holes DFP-R.

The red diffraction patterns DFP-R may be overlapped with the first emission region PXA-R of the emission regions PXA-R, PXA-G, and PXA-B. In addition, the red diffraction patterns DFP-R may be partially overlapped with the first non-emission region NPXA-R enclosing the first emission region PXA-R.

The first adhesive film AF1 and the anti-reflection unit RPP may be disposed on the diffraction pattern layer DFL. The anti-reflection unit RPP may be coupled to the diffraction pattern layer DFL by the first adhesive film AF1. The first adhesive film AF1 may be formed to fill the holes DFP-R. However, exemplary embodiments are not limited thereto. In an exemplary embodiment, the air layer may be formed in the holes DFP-R.

In an exemplary embodiment, a cover layer may be further disposed between the diffraction pattern layer DFL and the first adhesive film AF1. The cover layer may be formed of or include an organic material or an inorganic material. Here, the organic material may include at least one of acrylic resins, methacryl resins, polyisoprene resins, vinyl resins, epoxy resins, urethane resins, cellulose resins, siloxane resins, polyimide resins, polyamide resins, or perylene resins. Also, the inorganic material may include at least one of aluminum oxide, titanium oxide, silicon oxide, silicon oxynitride, zirconium oxide, or hafnium oxide.

Referring to FIG. 22, the diffraction pattern layer DFL may be disposed between the display panel DP and the input-sensing unit ISP. In an exemplary embodiment, the diffraction pattern layer DFL may be directly disposed on the display panel DP. For example, the diffraction pattern layer DFL may be directly disposed on the encapsulation layer TFE of the display panel DP. In this case, the second inorganic encapsulation layer T-IL2, which is the topmost layer of the encapsulation layer TFE, may be partially exposed by the holes DFP-R. In this case, the first insulating layer IL1 of the input-sensing unit ISP may be formed to fill the holes DFP-R.

Referring to FIGS. 21 and 23, the diffraction pattern layer DFL may include the red diffraction patterns DFP-R, which are disposed to correspond to the first pixel PX-R of the first to third pixels PX-R, PX-G, and PX-B, and the blue diffraction patterns DFP-B, which are disposed to correspond to the third pixel PX-B.

In the display module DM of FIG. 21, the diffraction pattern layer DFL may have the substantially same structure as the display module DM of FIG. 20, except for the blue diffraction patterns DFP-B that are additionally provided.

In the display module DM of FIG. 23, the diffraction pattern layer DFL may have the substantially same structure as the display module DM of FIG. 22, except for the blue diffraction patterns DFP-B that are additionally provided.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a light-emitting device to emit light; and
an input sensor disposed over the display panel,
wherein the input sensor comprises:
a first insulating layer disposed over the display panel;
a first conductive layer disposed over the first insulating layer;
a second insulating layer covering the first conductive layer; and
a second conductive layer disposed over the second insulating layer,
wherein at least one of the first and second insulating layers comprises a plurality of diffraction patterns arranged to diffract at least a portion of the light provided from the display panel, wherein:
the display panel further comprises an encapsulation layer covering the light-emitting device, and
the first insulating layer is directly disposed on the encapsulation layer.

2. The display device of claim 1, wherein the plurality of diffraction patterns are disposed in the second insulating layer.

3. The display device of claim 1, wherein the plurality of diffraction patterns are disposed in the first insulating layer.

4. The display device of claim 1, wherein the plurality of diffraction patterns comprise:
a plurality of first diffraction patterns disposed in the first insulating layer; and
a plurality of second diffraction patterns disposed in the second insulating layer.

5. The display device of claim 4, wherein the first insulating layer has a multi-layered structure including at least two stacked sub-insulating layers.

6. The display device of claim 5, wherein the plurality of first diffraction patterns comprise:
a plurality of first sub-diffraction patterns disposed in a first sub-insulating layer of the first insulating layer; and
a plurality of second sub-diffraction patterns disposed in a second sub-insulating layer of the first insulating layer and overlapping the plurality of first sub-diffraction patterns,
wherein the plurality of second diffraction patterns are disposed in the second insulating layer overlapping the plurality of second sub-diffraction patterns.

7. The display device of claim 1, wherein the encapsulation layer comprises:
a first encapsulation layer covering a plurality of pixels;
a second encapsulation layer disposed on the first encapsulation layer; and
a third encapsulation layer disposed on the second encapsulation layer,
wherein the first insulating layer is disposed on the third encapsulation layer.

8. The display device of claim 7, wherein:
the first insulating layer has a multi-layered structure including at least two stacked sub-insulating layers, and
the plurality of diffraction patterns comprise:
a plurality of first diffraction patterns disposed in the at least two sub-insulating layers; and
a plurality of second diffraction patterns disposed in the second insulating layer.

9. The display device of claim 8, wherein the plurality of diffraction patterns further comprise a plurality of third diffraction patterns disposed in the third encapsulation layer overlapping the plurality of first diffraction patterns.

10. The display device of claim 1, wherein the plurality of diffraction patterns comprise a plurality of holes penetrating the at least one of the first and second insulating layers.

11. The display device of claim 10, wherein the plurality of holes have one of generally circular, polygonal, elliptical, and elongated shapes.

12. The display device of claim 1, wherein the plurality of diffraction patterns comprise columnar-shaped structures disposed in the at least one of the first and second insulating layers.

13. The display device of claim 12, wherein the columnar-shaped structures have one of generally circular, polygonal, elliptical, and elongated shapes.

14. The display device of claim 1, wherein:
the input sensor further comprises a protection layer disposed on the second insulating layer, and
each of the first and second insulating layers has a refractive index different from a refractive index of the protection layer.

15. The display device of claim 1, wherein:
the display panel comprises a plurality of pixels, and
each of the plurality of pixels comprises:
an emission region to emit light, the light-emitting device being disposed in the emission region; and
a non-emission region adjacent to the emission region.

16. The display device of claim 15, wherein the plurality of diffraction patterns overlap at least the emission region.

17. The display device of claim 15, wherein the plurality of diffraction patterns overlap the non-emission region.

18. The display device of claim 1, wherein:
the display panel comprises a plurality of pixels including a first pixel to emit a first light, a second pixel to emit a second light having a wavelength different from a wavelength of the first light, and a third pixel to emit a third light having a wavelength different from the wavelength of the first light and the wavelength of the second light, and
the plurality of diffraction patterns overlap at least one of the first to third pixels.

19. The display device of claim 18, wherein the plurality of diffraction patterns overlap the first pixel.

20. The display device of claim 18, wherein the plurality of diffraction patterns overlap the first and third pixels.

21. A display device comprising:
a display panel comprising a plurality of pixels to display an image, each of the plurality of pixels including a light-emitting device to emit light; and
an input sensor disposed over the display panel,
wherein the input sensor comprises:
a sensing electrode; and
an insulating layer disposed over or below the sensing electrode, the insulating layer comprising a plurality of diffraction patterns arranged to diffract at least a portion of the light provided from the display panel, the plurality of diffraction patterns overlapping at least one of the plurality of pixels, wherein:
the display panel further comprises an encapsulation layer covering the plurality of pixels, and
the input sensor comprises an input-sensing unit directly disposed on the encapsulation layer.

22. The display device of claim 21, wherein:
the sensing electrode comprises a first sensing electrode and a second sensing electrode intersecting each other, and
each of the first and second sensing electrodes comprises sensing portions and a connecting portion connecting adjacent ones of the sensing portions.

23. The display device of claim 22, wherein the insulating layer comprises:
a first insulating layer on which the connecting portion of the first sensing electrode is disposed; and
a second insulating layer on which the sensing portions of the first sensing electrode, the sensing portions of the second sensing electrode, and the connecting portion of the second sensing electrode are disposed,
wherein the second insulating layer covers the connecting portion of the first sensing electrode, and
the connecting portion of the first sensing electrode is electrically connected to the sensing portions of the first sensing electrode through a contact hole formed in the second insulating layer.

24. The display device of claim 23, wherein the plurality of diffraction patterns are disposed in at least one of the first and second insulating layers.

25. The display device of claim 24, wherein the plurality of diffraction patterns comprise a plurality of holes penetrating at least one of the first and second insulating layers.

26. The display device of claim 23, further comprising a protection layer disposed on the second insulating layer to cover the sensing portions of the first sensing electrode, the sensing portions of the second sensing electrode, and the connecting portion of the second sensing electrode.

27. The display device of claim 26, wherein:
the insulating layer further comprises a third insulating layer disposed between the protection layer and the second insulating layer, and
the plurality of diffraction patterns are disposed in the third insulating layer.

28. The display device of claim 23, wherein:
the plurality of diffraction patterns are disposed in the second insulating layer, and
the insulating layer further comprises a fourth insulating layer disposed below the first insulating layer.

29. The display device of claim 23, wherein:
the plurality of diffraction patterns are disposed in the second insulating layer, and
the insulating layer further comprises a fifth insulating layer disposed between the first and second insulating layers.

30. The display device of claim 23, wherein:
the plurality of diffraction patterns are disposed on the first insulating layer, and
the second insulating layer comprises a diffraction open portion overlapping the plurality of diffraction patterns formed on the first insulating layer.

31. The display device of claim 21, wherein each of the sensing portions of the first and second sensing electrodes comprises a mesh electrode having a mesh shape.

32. The display device of claim 31, wherein the plurality of diffraction patterns are not overlapped with the mesh electrode, when viewed in plan.

33. The display device of claim 21, wherein:
the plurality of pixels comprise a first pixel to emit a first light, a second pixel to emit a second light having a wavelength different from a wavelength of the first light, and a third pixel to emit a third light having a wavelength different from the wavelength of the first light and the wavelength of the second light, and
the plurality of diffraction patterns overlap at least one of the first to third pixels.

34. The display device of claim 33, wherein the plurality of diffraction patterns overlap the first pixel.

35. The display device of claim 33, wherein the plurality of diffraction patterns overlap the first and third pixels.

36. A display device comprising:
a display panel comprising a plurality of pixels to display an image and an encapsulation layer covering the plurality of pixels, each of the plurality of pixels including a light-emitting device to emit light;
a diffraction pattern layer including a plurality of diffraction patterns arranged on the display panel to diffract at least a portion of the light provided from the display panel; and
an input sensor disposed on the display panel,
wherein the plurality of diffraction patterns overlap at least one of the plurality of pixels, and wherein:
the diffraction pattern layer is disposed between the display panel and the input sensor or is disposed on the input sensor, and
the input sensor is directly disposed on the encapsulation layer.

37. The display device of claim 36, wherein:
the plurality of pixels comprise a first pixel to emit a first light, a second pixel to emit a second light, and a third pixel to emit a third light, and
the plurality of diffraction patterns overlap at least one of the first to third pixels.

38. The display device of claim 37, wherein the plurality of diffraction patterns overlap the first pixel.

39. The display device of claim 37, wherein the plurality of diffraction patterns overlap the first and third pixels.

40. The display device of claim 36, wherein the input sensor comprises an input-sensing unit including:
- a first insulating layer directly disposed on the encapsulation layer;
- a first conductive layer disposed on the first insulating layer;
- a second insulating layer covering the first conductive layer;
- a second conductive layer disposed on the second insulating layer; and
- a protection layer covering the second conductive layer and the second insulating layer.

41. The display device of claim 40, wherein the diffraction pattern layer is disposed on the protection layer.

42. The display device of claim 40, wherein the diffraction pattern layer is disposed between the encapsulation layer and the first insulating layer.

* * * * *